United States Patent [19]

Saitoh et al.

[11] Patent Number: 4,585,719

[45] Date of Patent: Apr. 29, 1986

[54] PHOTOCONDUCTIVE MEMBER COMPRISING (SI-GE)-SI AND N

[75] Inventors: Keishi Saitoh, Ibaraki; Yukihiko Ohnuki, Kawasaki; Shigeru Ohno, Yohohama, all of Japan

[73] Assignee: Canon Kabushiki Kaisha, Tokyo, Japan

[21] Appl. No.: 646,511

[22] Filed: Aug. 31, 1984

[30] Foreign Application Priority Data

| Sep. 5, 1983 | [JP] | Japan | 58-162726 |
| Sep. 6, 1983 | [JP] | Japan | 58-163434 |
| Sep. 12, 1983 | [JP] | Japan | 58-167747 |
| Sep. 14, 1983 | [JP] | Japan | 58-169925 |
| Oct. 14, 1983 | [JP] | Japan | 58-191986 |
| Oct. 21, 1983 | [JP] | Japan | 58-197332 |

[51] Int. Cl.$^4$ ............................................. G03G 5/14
[52] U.S. Cl. ........................................ 430/59; 430/84; 430/95
[58] Field of Search ................... 430/57, 84, 85, 86, 430/95

[56] References Cited

U.S. PATENT DOCUMENTS

| 4,423,133 | 12/1983 | Kanbe et al. | 430/95 |
| 4,460,670 | 7/1984 | Ogawa et al. | 430/57 |
| 4,490,450 | 12/1984 | Shimizu et al. | 430/95 |

*Primary Examiner*—John L. Goodrow
*Attorney, Agent, or Firm*—Fitzpatrick, Cella, Harper & Scinto

[57] ABSTRACT

A photoconductive member comprises a support for a photoconductive member and a light receiving layer overlaying the support comprising a first layer region (G) comprising an amorphous material containing silicon atoms and germanium atoms and a second layer (S) exhibiting photoconductivity comprising an amorphous material containing silicon atoms, the first layer region (G) and the second layer region (S) being provided in this order from the support side, and the distribution of germanium atoms in the said first layer (G) being not uniform in the layer thickness direction and nitrogen atoms being contained in the light receiving layer. There may be provided on the light receiving layer a layer comprising an amorphous material containing silicon atoms and at least one of carbon atoms and oxygen atoms.

84 Claims, 21 Drawing Figures

PHOTOCONDUCTIVE MEMBER COMPRISING (SI-GE)-SI AND N

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays, gamma-rays, and the like).

2. Description of the Prior Art

Photoconductive materials, which constitute photoconductive layers in solid state image pickup devices, image forming members for electrophotography in the field of image formation, or manuscript reading devices and the like, are required to have a high sensitivity, a high SN ratio [photocurrent $(I_p)$/dark current $(I_d)$], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid safety characteristic is very important.

From the standpoint as mentioned above, amorphous silicon (hereinafter referred to as a-Si) has recently attracted attention as a photoconductive material. For example, German OLS Nos. 2746967 and 2855718 disclose applications of a-Si for use in image forming members for electrophotography, and German OLS No. 2933411 discloses an application of a-Si for use in a photoelectric transducing reading device.

However, under the present situation, the photoconductive members of the prior art having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with the lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigue by repeated uses or so called ghost phenomenon wherein residual images are formed.

Further, a-Si has a relatively smaller coefficient of absorption of the light on the longer wavelength side in the visible light region as compared with that on the shorter wavelength side. Accordingly, in matching to the semiconductor laser practically applied at the present time, the light on the longer wavelength side cannot effectively be utilized, when employing a halogen lamp or a fluorescent lamp as the light source. Thus, various points remain to be improved.

On the other hand, when the light irradiated is not sufficiently absorbed in the photoconductive layer, but the amount of the light reaching the substrate is increased, interference due to multiple reflection may occur in the photoconductive layer to become a cause for "unfocused" image, in the case when the substrate itself has a high reflectance against the light transmitted through the photoconductive layer.

This effect will be increased, if the irradiated spot is made smaller for the purpose of enhancing resolution, thus posing a great problem in the case of using a semiconductor laser as the light source.

Further, a-Si materials to be used for constituting the photoconductive layer may contain as constituent atoms hydrogen atoms or halogen atoms such as fluorine atoms, chlorine atoms, etc. for improving their electrical, photoconductive characteristics, boron atoms, phosphorus atoms, etc. for controlling the electroconduction type as well as other atoms for improving other characteristics. Depending on the manner in which these constituent atoms are contained, there may sometimes be caused problems with respect to electrical or photoconductive characteristics of the layer formed.

That is, for example, in many cases, the life of the photocarriers generated by light irradiation in the photoconductive layer formed is insufficient, or at the dark portion, the charges injected from the substrate side cannot sufficiently be impeded.

In addition, when the layer thickness becomes about ten $\mu$ or more, float and peeling of the layer from the support surface or cracking of the layer are liable to be caused after the material is taken out of a vacuum deposition chamber for layer formation and while stood in air. These phenomena often occur particularly when the support is in a form of drum which is usually used in the field of electrophotography and the problem of the phenomena should be solved so as to improve the stability as to the lapse of time.

Therefore, it is necessary to improve the characteristics of the a-Si material itself while it is necessary to solve all the problems as mentioned above upon designing the photoconductive members.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc.

It has now been found that a photoconductive member having a light receiving layer exhibiting photoconductivity which comprises an amorphous material containing at least one of hydrogen atom (H) and halogen atom (X) in a matrix of silicon atom, so-called hydrogenated amorphous silicon, halogenated amorphous silicon, or halogen-containing hydrogenated amorphous silicon [hereinafter comprehensively referred to as "a-Si(H,X)"], said photoconductive member being prepared by designing so as to have a specific structure as hereinafter described, not only exhibits practical, very good characteristics, but also surpasses photoconductive members of the prior art in substantially all respects, especially having markedly good characteristics as a photoconductive member for electrophotography and also excellent absorption spectrum characteristics on the longer wavelength side.

SUMMARY OF THE INVENTION

A primary object of the present invention is to provide a photoconductive member having electrical, optical and photoconductive characteristics which are constantly stable and all-environment type with virtually no dependence on the environment in which it is used which member has excellent photosensitive characteristics on the longer wavelength side and markedly good in light fatigue resistance, and also excellent in durability without causing deterioration phenomenon when used repeatedly, exhibiting no or substantially no residual potential observed.

Another object of the present invention is to provide a photoconductive member which is high in photosensitivity throughout the whole visible light region, particularly good in matching to a semiconductor laser and also rapid in response, to light.

Still another object of the present invention is to provide a photoconductive member which exhibits excellent close contact between a support and a layer overlying the support and that between the laminated layers, is elaborate and stable with respect to structural arrangement and has a high layer quality.

A still further object of the present invention is to provide an excellent photoconductive member which has a sufficient charge retentivity upon charging treatment for formation of electrostatic images to such an extent that a conventional electrophotographic method can be very effectively applied when it is used as an image forming member for electrophotography and further has an excellent electrophotographic characteristics which is little lowered even under high humidity.

Still another object of the present invention is to provide a photoconductive member for electrophotography capable of easily producing images of high quality having high density, clear halftone and high resolution.

A still further object of the present invention is to provide a photoconductive member having high photosensitivity, high SN ratio characteristics, and good electrical contact with the support.

According to one aspect of the present invention, there is provided a photoconductive member which comprises a support for a photoconductive member and a light receiving layer overlying the support comprising a first layer region (G) comprising an amorphous material containing silicon atoms and germanium atoms and a second layer region (S) exhibiting photoconductivity comprising an amorphous material containing silicon atoms, the first layer region (G) and the second layer region (S) being provided in this order from the support side, and the distribution of germanium atoms in the first layer region (G) being not uniform in the layer thickness direction and nitrogen atoms being contained in the light receiving layer.

According to another aspect of the present invention, there is provided a photoconductive member which comprises a support for a photoconductive member, a first layer and a second layer, the first layer overlying the support and comprising a first layer region (G) comprising an amorphous material containing silicon atoms and germanium atoms and a second layer region (S) exhibiting photoconductivity comprising an amorphous material containing silicon atoms, the first layer region (G) and the second layer region (S) being provided in this order from the support side, the second layer comprising an amorphous material containing silicon atoms and at least one of carbon atoms and oxygen atoms, the distribution of germanium in the first layer region (G) being not uniform in the layer thickness direction and nitrogen atoms being contained in the first layer.

DETAILED DESCRIPTION OF THE PREFERRED EMBODIMENTS

Figure 1:
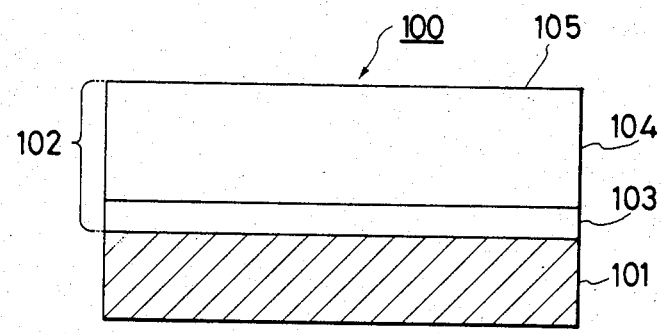
FIG. 1 and FIG. 11 schematically show layer structures of photoconductive members of the present invention.

In the following, the photoconductive member of the present invention will be explained referring to the drawing in detail below.

FIG. 1 schematically shows a layer structure of a photoconductive member of the first preferable embodiment according to the present invention.

In FIG. 1, photoconductive member 100 has support 101 and light receiving layer 102 overlying support 101. Light receiving layer 102 has free surface 105 at one of the end surfaces. Light receiving layer 102 is constituted of a first layer region (G) 103 composed of a-Si (H,X) containing germanium atoms [hereinafter referred to as "a-SiGe (H,X)"] and a second layer region (S) 104 having photoconductivity composed of a-Si (H,X). The first layer region (G) 103 and the second layer region (S) 104 are laminated on support 101 in the order as mentioned. Germanium atoms are contained in the first layer region (G) 103 such that the content is continuous in the layer thickness direction and is higher at the side of support 101 than at the side opposite to the support 101 (the side of the surface of light receiving layer 102).

In the photoconductive member of the present invention, it is preferable that the distribution of germanium in the first layer region (G) is such as mentioned above in the layer thickness direction while the distribution in the plane parallel to the surface of the support surface is uniform.

In the present invention, germanium atoms are not contained in the second layer region (S) provided on the first layer region (G), and such a layer structure of the light receiving layer can give a photoconductive member excellent in photosensitivity to lights of all region ranging from a relatively short wavelength containing visible light region to a relatively long wavelength.

In the first layer region (G), germanium atoms are distributed such that germanium atoms are continuously distributed over the whole layer region and the distribution concentration of germanium atoms in the layer thickness direction, C, decreases from the support side to the second layer region (S). Therefore, the affinity between the first layer region (G) and the second layer region (S) is good and further, the change in refractive index can be substantially continuous. As the result, it is possible to prevent interference due to reflection at the layer interface when a coherent light is used. Further, by making the distribution concentration of germanium atoms extremely high at the support side end portion as mentioned later, it is possible that a light at the long wavelength side which is hardly absorbed at the second layer region (S) when a semiconductor laser and the like are used is substantially completely absorbed at the first layer region (G) and the interference due to reflection from the support surface is prevented.

According to the present invention, the photoconductive member comprises silicon atoms common to both amorphous materials constituting the first layer region (G) and the second layer region (S) and therefore, chemical stability at the laminate interface can be sufficiently assured.

FIGS. 2 through 10 show typical examples of ununiform distribution in the direction of layer thickness of germanium atoms contained in the first layer region (G) of the photoconductive member in the present invention.

In FIGS. 2 through 10, the abscissa indicates the content C of germanium atoms and the ordinate the layer thickness of the first layer region (G), $t_B$ showing the position of the end surface of the first layer region (G) on the support side and $t_T$ the position of the end surface of the first layer region (G) on the side opposite to the support side. That is, layer formation of the first layer region (G) containing germanium atoms proceeds from the $t_B$ side toward the $t_T$ side.

Figure 2:
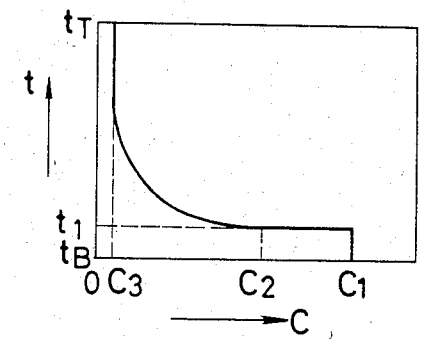
FIG. 2–FIG. 10 show the distribution of germanium atoms in each layer region (G)

In FIG. 2, there is shown a first typical embodiment of the depth profile of germanium atoms in the layer thickness direction contained in the first layer region (G).

In the embodiment as shown in FIG. 2, from the interface position $t_B$ at which the surface, on which the first layer region (G) containing germanium atoms is to be formed, is contacted with the surface of said first layer region (G) to the position $t_1$, germanium atoms are contained in the first layer region (G) formed, while the concentration C of germanium atoms taking a constant value of $C_1$, the concentration being gradually decreased from the concentration $C_2$ continuously from the position $t_1$ to the interface position $t_T$. At the interface position $t_T$, the concentration of germanium atoms is made $C_3$.

Figure 3:
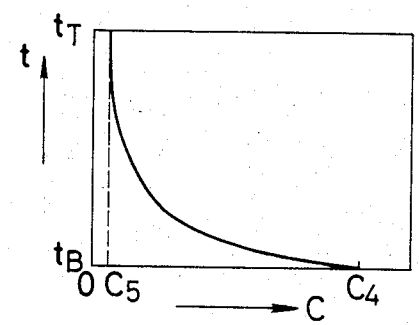

In the embodiment shown in FIG. 3, the concentration C of germanium atoms contained is decreased gradually and continuously from the position $t_B$ to the position $t_T$ from the concentration $C_4$ until it becomes the concentration $C_5$ at the position $t_T$.

Figure 4:
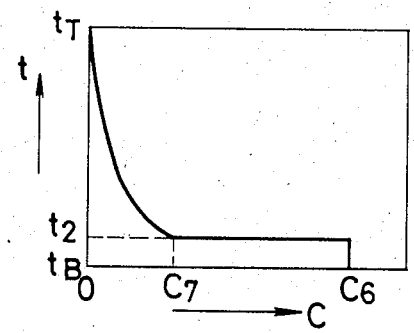

In case of FIG. 4, the concentration C of germanium atoms is made constant as $C_6$ from the position $t_B$ to the position $t_2$, gradually decreased continuously from the position $t_2$ to the position $t_T$, and the concentration C is made substantially zero at the position $t_T$ (substantially zero herein means the content less than the detectable limit).

Figure 5:
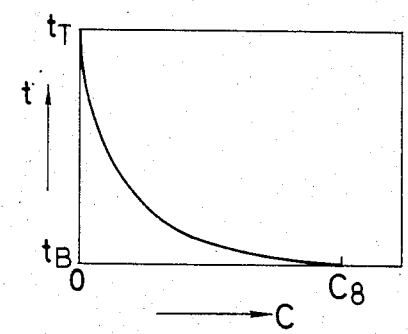

In case of FIG. 5, the concentration C of germanium atoms is decreased gradually and continuously from the position $t_B$ to the position $t_T$ from the concentration $C_8$, until it is made substantially zero at the position $t_T$.

Figure 6:
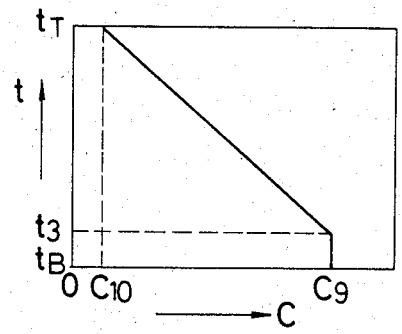

In the embodiment shown in FIG. 6, the concentration C of germanium atoms is constantly $C_9$ between the position $t_B$ and the position $t_3$, and it is made $C_{10}$ at the position $t_T$. Between the position $t_3$ and the position $t_T$, the concentration is reduced as a first order function from the position $t_3$ to the position $t_T$.

Figure 7:
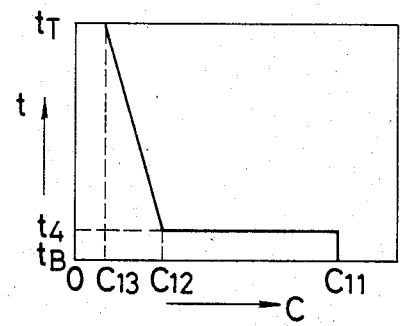

In the embodiment shown in FIG. 7, there is formed a depth profile such that the concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 8:
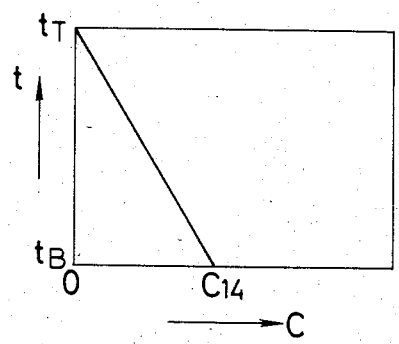

In the embodiment shown in FIG. 8, the concentration C of germanium atoms is decreased as a first order function from the concentration $C_{14}$ to substantially zero from the position $t_B$ to the position $t_T$.

Figure 9:
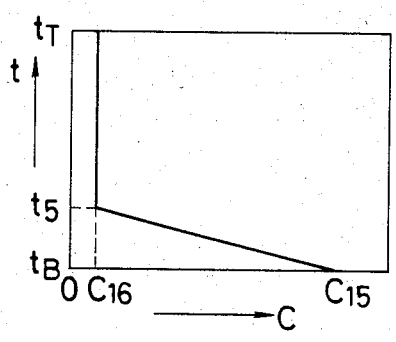

In FIG. 9, there is shown an embodiment, where the concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 10:
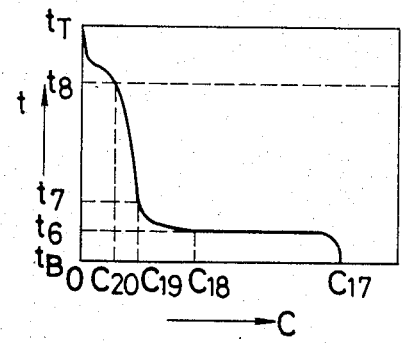

In the embodiment shown in FIG. 10, the concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration C is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the first layer region (G) in the direction of the layer thickness by referring to FIGS. 2 through 10, in the present invention, the first layer region (G) is provided desirably in a depth profile so as to have a portion enriched in concentration C of germanium atoms on the support side and a portion depleted in concentration C of germanium atoms to considerably lower than that of the support side on the interface $t_T$ side.

The first layer region (G) constituting the light receiving layer of the photoconductive member in the present invention is desired to have a localized region (A) containing germanium atoms preferably at a relatively higher concentration, on the support side as described above.

In the present invention, the localized region (A), as explained in terms of the symbols shown in FIG. 2 through FIG. 10, may be desirably provided within $5\mu$ from the interface position $t_B$.

In the present invention, the above localized region (A) may be made to be identical with the whole layer region ($L_T$) up to the depth of $5\mu$ from the interface position $t_B$, or alternatively a part of the layer region ($L_T$).

It may suitably be determined depending on the characteristics required for the light receiving layer to be formed, whether the localized region (A) is made a part or whole of the layer region ($L_T$).

The localized region (A) may preferably be formed according to such a layer formation that the maximum value Cmax of the concentration C of germanium atoms in a distribution in the layer thickness direction may preferably be 1000 atomic ppm or more, more preferably 5000 atomic ppm or more, most preferably $1 \times 10^4$ atomic ppm or more based on the sum of germanium atoms and silicon atoms.

That is, according to the present invention, the first layer region (G) containing germanium atoms is preferably formed so that the maximum value Cmax of the distribution concentration C (G) may exist within a layer thickness of $5\mu$ from the support side (the layer region within $5\mu$ thickness from $t_B$).

In the present invention, the content of germanium atoms in the first layer region (G) containing germanium atoms, which may suitably be determined as desired so as to achieve effectively the objects of the present invention, may preferably be 1 to $9.5 \times 10^5$ atomic ppm, more preferably 100 to $8.0 \times 10^5$ atomic ppm, most preferably 500 to $7 \times 10^5$ atomic ppm based on the sum of germanium atoms and silicon atoms.

In the photoconductive member of the present invention, the layer thickness of the first layer region (G) and the thickness of the second layer region (S) are one of important factors for accomplishing effectively the object of the present invention and therefore, sufficient care should be paid in designing of the photoconductive member so that desirable characteristics may be imparted to the photoconductive member formed.

In the present invention, the layer thickness $T_B$ of the first layer region (G) may preferably be 30 Å to $50\mu$, more preferably 40 Å to $40\mu$, most preferably 50 Å to $30\mu$.

On the other hand, the layer thickness T of the second layer region (S) may be preferably 0.5 to $90\mu$, more preferably 1 to $80\mu$, most preferably 2 to $50\mu$.

The sum of the layer thickness $T_B$ of the first layer region (G) and the layer thickness T of the second layer region (S), namely ($T_B+T$) may be suitably determined as desired in designing of the layers of the photoconductive member, based on the mutual organic relationship between the characteristics required for both layer regions and the characteristics required for the whole light receiving layer.

In the photoconductive member of the present invention, the numerical range for the above ($T_B+T$) may preferably be from 1 to $100\mu$, more preferably 1 to $80\mu$, most preferably 2 to $50\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer region (G) is $1 \times 10^5$ atomic ppm or more, the layer thickness $T_B$ of the first layer region (G) should desirably be made as thin as possible, preferably $30\mu$ or less, more preferably $25\mu$ or less, most preferably $20\mu$ or less.

In the photoconductive member of the present invention, the distribution of germanium atoms in the first layer region (G) is such that germanium atoms are continuously distributed over the whole layer region (G) and the distribution concentration of germanium atoms in the layer thickness direction, C, decreases from the support side to the free surface side of the light receiving layer, and therefore, a light receiving layer having required characteristics can be produced as desired by designing the change rate curve of the distribution concentration C.

For example, by selecting a distribution concentration curve of germanium atoms such that the distribution concentration C of germanium in the first layer region (G) is sufficiently high at the support side and is lowered as far as possible at the free surface side of the light receiving layer, the photoconductive member can be sensitive to all regions of wavelength ranging from a relatively short wavelength to a relatively long wavelength including visible light region.

As mentioned below, by rendering the distribution concentration C of germanium atoms extremely high at the support side end portion of the first layer region (G), it is possible that, when a semiconductor laser is used, a light at the long wavelength side which can not be sufficiently absorbed at the second layer region (S) at the laser irradiated surface side can be substantially completely absorbed at the layer region (G) and the interference due to reflection from the support surface can be effectively prevented.

In the case of the photoconductive member of the present invention, nitrogen atoms are incorporated in the light receiving layer for the purpose of enhancing the photosensitivity and dark resistance and further, improving the close contact property between the support and the light receiving layer.

Nitrogen atoms contained in the light receiving layer may be distributed all over the whole layer region, or contained locally only at a part of the layer region.

In addition, the distribution of nitrogen atoms may be such that the distribution concentration C (N) is uniform in the direction of the light receiving layer thickness or ununiform in a way similar to the distribution state of germanium as mentioned in FIG. 2–FIG. 10.

In short, when the distribution concentration of nitrogen atoms C (N) is ununiform in the layer thickness direction, the distribution of nitrogen atoms can be explained in a way similar to that of germanium atoms in FIG. 2–FIG. 10.

In the present invention, when improvement in photoconductivity and dark resistance is the main purpose, the layer region (N) containing nitrogen atoms provided in the light receiving layer is provided such that the layer region (N) occupies the whole layer region of the light receiving layer. When strengthening the close contact property between the support and the light receiving layer is the main purpose, the layer region (N) is provided at the support side end portion layer region (E) of the light receiving layer.

In the former case, it is preferable that the content of nitrogen atoms in layer region (N) is relatively low so as to keep a high photosensitivity while in the latter case the content of nitrogen is preferably relatively high so as to assure to strengthen the close contact property with the support.

In order to attain both the former and the latter purposes, the nitrogen atom distribution in layer region (N) is as follows: nitrogen atoms may be contained at the support side in a relatively high concentration and at the free surface side of the light receiving layer in a relatively low concentration, or nitrogen atoms may not be positively contained in the surface layer region at the free surface side of the light receiving layer.

In the present invention, the nitrogen atom content in the layer region (N) may be optionally selected in an organic relationship of characteristics required for the layer region (N) itself, characteristics at the interface contacting the support [when the layer region (N) is directly mounted on the support] and the like.

When other layer region is directly provided in contact with on the layer region (N), the nitrogen atom content is optionally selected taking into consideration the characteristics of said other layer region and characteristics at the interface contacting said other layer region.

The amount of nitrogen atoms in layer region (N) is optionally selected depending upon the characteristics required to photoconductive members to be formed. It is preferably 0.001–50 atomic %, more preferably 0.002–40 atomic %, most preferably 0.003–30 atomic %.

In the present invention, when the layer region (N) occupies the whole region of the light receiving layer, or though the layer region (N) does not occupy the whole region of the light receiving layer, the ratio of layer thickness (To) of the layer region (N) to layer thickness (T) of the light receiving layer is sufficiently large, it is desired that the upper limit of nitrogen atom content in layer region (N) is sufficiently less than the above-mentioned value.

According to the present invention, when the layer thickness To of layer region (N) is 2/5 times or more the layer thickness T, the upper limit of nitrogen atoms in layer region (N) is preferably 30 atomic % or less, more preferably 20 atomic % or less, most preferably 10 atomic % or less.

In the present invention, it is preferable that layer region (N) containing nitrogen atoms constituting the light receiving layer is formed, as mentioned above, in such a way that there is a localized region (B) which is at the support side and contains nitrogen atoms at a relatively high concentration, and in this case, the close contact property between the support and the light receiving layer can be more improved.

The above-mentioned localized region (B) is preferably present within $5\mu$ from the position of interface $t_B$ when explained using the sign in FIG. 2–FIG. 10.

That is, it is preferable that the layer region (N) containing nitrogen atoms is formed such that the maximum distribution concentration (N) Cmax is present within $5\mu$ of layer thickness from the support side (a layer region of $5\mu$ thick from $t_B$).

The above-mentioned localized region (B) may be the whole layer region ($L_T$) from the interface position $t_B$ to $5\mu$ thick or may be a part of the layer region ($L_T$).

It optionally depends on the characteristics required for the light receiving layer whether the localized layer is a part or the whole of the layer region ($L_T$).

Nitrogen atoms are distributed in the localized region (B) in the layer thickness direction such that the maximum distribution concentration (N) of nitrogen atoms, Cmax, is preferably 500 atomic ppm or more, more preferably 800 atomic ppm or more, most preferably 1000 atomic ppm or more.

In the present invention, halogen atom (X), if desired, contained in the first layer region (G) and the second layer region (S) constituting the light receiving layer may be fluorine, chlorine, bromine and iodine, preferably fluorine and chlorine.

Photoconductive member 100 as shown in FIG. 1 contains a substance (C) for controlling conductivity characteristic at least in the first layer region (G) 103, and it is preferable that a desired conductivity characteristic is imparted to the first layer region (G) 103.

In this case, the substance (C) for controlling conductivity characteristics contained in the first layer region (G) 103 may be uniformly contained over the whole layer region of the first layer region (G) or may be locally present only at a part of the first layer region (G).

When the substance (C) is incorporated in the first layer region (G) such that the substance (C) is locally present only at a part of the first layer region (G), a layer region (PN) where the substance (C) is contained is preferably provided as an end portion layer region of the first layer region (G). In particular, in case that the layer region is provided as an end portion layer region at the support side of the first layer region (G), injection of charge of a particular polarity into the light receiving layer from the support can be effectively by appropriately selecting optionally the type of the substance (C) and the amount thereof to be contained in the layer region (PN).

In the photoconductive layer of the present invention, the substance (C) may be incorporated in the first layer region (G) constituting a part of the light receiving layer in such a manner as mentioned above, that is, distributing the substance (C) over the whole region of the first layer region (G) or distributing locally in the direction of layer thickness, and further, the substance (C) may be incorporated in the second layer region (S) provided on the first layer region (G).

When the substance (C) is incorporated in the second layer region (S), the type of the substance (C) to be contained in the second layer region (S), an amount thereof and a manner of containing thereof are optionally determined depending upon the type of the substance (C) contained in the first layer region (G), an amount thereof and a manner of containing thereof.

In the present invention, when the substance (C) is incorporated in the second layer region (S), it is preferable to incorporate the substance (C) in at least a layer region including a contact interface with the first layer region (G).

The substance (C) may be incorporated in the whole layer region of the second layer region (S) or in a part of the layer region uniformly.

When the substance (C) is incorporated in both the first layer region (G) and the second layer region (S), it is preferable that the layer region containing the substance (C) in the first layer region (G) is contacted with that containing the substance (C) in the second layer region (S). The substance (C) contained in both layer regions (G) and (S) may be the same or different in both layer regions, and further, the content of the substance (C) may be the same or different in both layer regions. However, in the present invention, when the substance (C) contained in each layer region is the same, it is preferable that the content in the first layer region (G) is sufficiently high, or the substance (C) in each layer region is different from each other as to the electric characteristics.

In the present invention, when the substance (C) is incorporated at least in the first layer region (G) constituting the light receiving layer, the conductivity characteristics of the layer region [a part or the whole of the first layer region (G)] where the substance (C) is contained can be optionally controlled. The substance (C) may be so-called impurities as used in the art of semiconductor. In the present invention, p-type impurities imparting p-type conductivity to a-SiGe (H,X) constituting the light receiving layer or n-type impurities imparting n-type conductivity thereto may be mentioned.

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table (Group V atoms), such as P (phosphorus), As (arsenic), Sb (antimony), Bi (bismuth), etc., particularly preferably P and As.

In the present invention, the content of the substance (C) for controlling conductivity in the layer region (PN) may be suitably selected depending on the conductivity required for said layer region (PN), or the characteristics at the interface contacting with the support [when the layer region (PN) is directly contacted with the support] and the organic relationship therewith.

Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably $1-5 \times 10^3$ atomic ppm.

In the present invention, by making the content of the substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the support side into the light receiving layer can be effectively inhibited when the free surface of the light receiving layer is subjected to the charging treatment to $\oplus$ polarity. On the other hand, when the substance to be incorporated is a n-type impurity, migration of positive holes injected from the support side into the light receiving layer can be effectively inhibited when the free surface of the light receiving layer is subjected to the charging treatment to $\ominus$ polarity.

In the case as mentioned above, the layer region (Z) at the portion excluding the above layer region (PN) may contain a substance (C) for controlling conductivity of a polarity different from that of a substance (C) for controlling conductivity contained in layer region (PN), or a substance (C) for controlling conductivity characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance (C) for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other in the light receiving layer, thus providing a so called depletion layer at said contact region. In short, for example, a layer region containing the aforesaid p-type impurity and a layer region containing the aforesaid n-type impurity are provided in the light receiving layer in direct contact with each other to form the so called p-n junction, whereby a depletion layer can be provided.

In the present invention, formation of the first layer region (G) constituted of a-SiGe (H,X) may be conducted according to the vacuum deposition method utilizing discharging phenomenon, such as glow discharge method, sputtering method, ion-plating method and the like. For example, for formation of the first layer region (G) constituted of a-SiGe (H,X) according to the glow discharge method, the basic procedure comprises introducing a starting gas for Ge supply capable of supplying germanium atoms (Ge) together with a starting gas for Si supply capable of supplying silicon atoms (Si), and optionally a starting gas for introduction of hydrogen atoms (H) and/or a starting gas for introduction of halogen atoms (X) at a desired gas pressure into a deposition chamber which can be internally brought to a reduced pressure, and exciting glow discharge in said deposition chamber, thereby effecting layer formation on the surface of a support placed at a predetermined position. A layer consisting of a-SiGe (H,X) may be formed while controlling the depth profile of germanium atoms according to a desired change rate curve. Alternatively, for formation according to the sputtering method, when carrying out sputtering by use of a target constituted of Si or two sheets of targets of said target and a target constituted of Ge, or a target of a mixture of Si and Ge in an atmosphere of an inert gas such as Ar, He, etc. or a gas mixture based on these gases, a starting gas for Ge supply, if desired, diluted with a diluting gas such as He, Ar and the like, together with, if desired, a gas for introduction of hydrogen atoms (H) and/or a gas for introduction of halogen atoms (X) may be introduced into a deposition chamber for sputtering, thereby forming a plasma atmosphere of a desired gas, and sputtering of the aforesaid target may be effected, while controlling the gas flow rates of the starting gas for supply of Ge according to a desired change rate curve.

In the case of the ion-plating method, for example, a vaporizing source such as a polycrystalline silicon or a single crystalline silicon and a polycrystalline germanium or a single crystalline germanium may be placed as vaporizing source is an evaporating boat, and the vaporizing source is heated by the resistance heating method or the electron beam method (EB method) to be vaporized, and the flying vaporized product is permitted to pass through a desired gas plasma atmosphere, otherwise following the same procedure as in the case of sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substances which can be starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during layer formation and efficiency for supplying Ge.

Effective starting gases for introduction of halogen atoms to be used in the present invention may include a large number of halogenic compounds, as exemplified preferably by gaseous or gasifiable halogenic compounds such as halogenic gases, halides, interhalogen compounds, silane derivatives substituted with halogens, and the like.

Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the characteristic photoconductive member of the present invention is formed according to the glow discharge method by employment of such a silicon compound containing halogen atoms, it is possible to form the first layer region (G) comprising a-SiGe containing halogen atoms on a desired substrate without use of a hydrogenated silicon gas as the starting gas capable of supplying Si together with the starting gas for Ge supply.

In the case of forming the first layer region (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio and a gas flow rate into the deposition chamber for formation of the first layer region (G) and exciting glow discharge to form a plasma atmosphere of these gases, whereby the first layer region (G) can be formed on a desired support. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer region (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $SiH_2I_2$, $SiH_2Cl_2$, $SiHCl_3$, $SiH_2Br_2$, $SiHBr_3$, etc. ; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogen atoms, because hydrogen atoms, which are very effective for controlling electrical or photoelectric characteristics, can be introduced into the layer simultaneously with introduction of halogen atoms during formation of the first layer region (G).

For introducing hydrogen atoms structurally into the first layer region (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer region (G) constituting the photoconductive layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer region (G), for example, the support temperature and/or the amount of the starting materials used for incorporation of hydrogen atoms (H) or halogen atoms (X) to be introduced into the deposition device system, discharging power, etc. may be controlled.

In the present invention, in order to form the second layer region (S) composed of a-Si (H,X), starting materials which are the same as starting materials (I) for forming the first layer region (G) as mentioned above excluding a starting material for supplying Ge, [starting materials (II) for forming the second layer region (S)], are used under the same conditions and following the same method as those for producing the first layer region (G).

That is, in order to form the second layer region (S) composed of a-Si (H,X), for example, there may be used a vacuum deposition method utilizing discharging such as glow discharging method, sputtering method, ion plating method and the like.

For example, when a glow discharging method is used for producing the second layer region (S) composed of a-Si (H,X), the basic procedure comprises introducing a starting gas for supplying silicon atoms (Si), if desired, together with a starting gas for introducing hydrogen atoms (H) and/or a starting gas for introducing halogen atoms (X), into a deposition chamber capable of being internally brought to a reduced pressure, exciting glow discharge in the deposition chamber and thereby forming a layer of a-Si (H,X) on the surface of a predetermined support placed at a predetermined position. Alternatively, when sputtering method is used, for example, sputtering is carried out using a target composed of Si in an atmosphere of an inert gas such as Ar, He and the like or a gas mixture based on said gas and upon the sputtering, a gas for introducing hydrogen atoms (H) and/or halogen atoms (X) is introduced into the deposition chamber.

In the present invention, a layer region (N) containing nitrogen atoms may be formed in the light receiving layer by using a starting material for introducing nitrogen atoms together with a starting material for forming the light receiving layer upon forming the light receiving layer and incorporating nitrogen atoms in the layer formed while controlling the amount of nitrogen.

When a glow discharging method is employed for forming the layer region (N), a starting material for introducing nitrogen is added to starting materials optionally selected, as desired, from the above-mentioned starting materials for forming the light receiving layer.

As such a starting material for introducing nitrogen atoms, there may be used most of gaseous or gasified gasifiable material containing at least nitrogen atom as a constituent atom.

For example, a starting gas containing silicon atom (Si) as a constituent atom, a starting gas containing nitrogen atom (N) as a constituent atom, and if desired, a starting gas containing hydrogen atom (H) and/or halogen atom (X) as constituent atoms are mixed at a desired ratio and used, or a starting gas containing silicon atom (Si) as a constituent atom and a starting gas containing nitrogen atom (N) and hydrogen atom (H) as constituent atoms are mixed at a desired ratio and used.

Alternatively, a starting gas containing silicon atom (Si) and hydrogen atom (H) as constituent atoms and a starting gas containing nitrogen atom (N) as a constituent atom may be mixed and used.

As an effective starting material which is used as a starting gas for introducing nitrogen atoms (N) to form the layer region (N), there may be mentioned gaseous or gasifiable nitrogen compounds such as nitrogen, nitrides, azides and the like, for example, nitrogen ($N_2$), ammonia ($NH_3$), hydrazine ($H_2NNH_2$), hydrogen azide ($HN_3$), ammonium azide ($NH_4N_3$) and the like which contain N as a constituent atom or N and H as constituent atoms. Other than those, there may be mentioned nitrogen halides which serve to introduce halogen atoms (X) as well as nitrogen atoms (N), for example, nitrogen trifluoride ($F_3N$), nitrogen tetrafluoride ($F_4N_2$) and the like.

According to the present invention, oxygen atoms may be incorporated in the layer region (N) in addition to nitrogen atoms for the purpose of enhancing the effect of nitrogen atoms.

As a starting gas for introducing oxygen atoms into the layer region (N), there may be mentioned, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

Formation of the layer region (N) containing nitrogen atoms by sputtering may be effected by using single crystal or polycrystal Si wafer, or $Si_3N_4$ wafer, or a wafer comprising Si and $Si_3N_4$ as a target and conducting sputtering in an atmosphere of various gases.

For example, when Si wafer is used as a target, starting gases for introducing nitrogen atoms and, if desired, hydrogen atoms and/or halogen atoms which are diluted with a diluting gas, are introduced into a deposition chamber for sputtering to form gas plasma of these gases for effecting sputtering with the above-mentioned Si wafer.

Alternatively, Si and $Si_3N_4$ are used as separate targets, or Si and $Si_3N_4$ are made into one sheet of target, and sputtering is effected in an atmosphere of a diluting gas or in a gaseous atmosphere containing hydrogen atoms (H) and/or halogen atoms (X). As a starting gas for introducing nitrogen atoms, the starting gas for introducing nitrogen atoms in the starting gases as mentioned above in the example of glow discharging can be used as an effective sputtering gas.

In the present invention, when a layer region (N) containing nitrogen atoms is formed upon producing a light receiving layer, a layer region (N) having a desired distribution in the layer thickness direction (depth profile), that is, the change in the distribution concentration C (N) of nitrogen atoms in the layer thickness direction in the layer region (N), can be formed by, in the case of glow discharging, appropriately introducing a gas of a starting material for introducing nitrogen atoms to change the distribution concentration C (N) into a deposition chamber in such a way that the gas flow rate is properly changed in accordance with the desired change rate curve.

For example, the above-mentioned operation can be carried out by gradually changing the opening of a predetermined needle valve provided in the gas flow path system. The changing may be effected by a conventional means such as manual operation, an externally driven motor and the like. It is not necessary that the change of flow rate is linear, but the flow rate may be controlled following a preliminarily designed change rate curve by means of a microcomputer to obtain a desired content rate curve.

When the layer region (N) is formed by sputtering, the distribution concentration C (N) of nitrogen atoms in the layer thickness direction is changed to form a desired depth profile of nitrogen atoms by firstly using the starting material for introducing nitrogen atoms in a gaseous state in the same way as in the glow discharging method and appropriately changing the gas flow rate, as desired, upon introducing the gas into the deposition chamber, and secondly, for example, in the case of using a target composed of a mixture of Si and $Si_3N_4$ for sputtering, preliminarily changing the ratio of Si to $Si_3N_4$ in the layer thickness direction of the target.

In the present invention, the amount of hydrogen atoms (H), or halogen atoms (X), or the sum of hydrogen atoms and halogen atoms (H+X), in the second layer region (S) constituting the light receiving layer is preferably 1-40 atomic %, more preferably 5-30 atomic %, most preferably 5-25 atomic %.

When a substance (C) for controlling conductivity such as the group III atoms or the group V atoms is introduced structurally into a layer region constituting a light receiving layer to form a layer region (PN) containing the substance (C), a starting material for introduction of the group III atoms or a starting material for introduction of the group V atoms may be introduced under gaseous state into a deposition chamber together with the starting materials for formation of the light receiving layer during layer formation. As the starting material which can be used for introduction of the group III atoms, it is desirable to use those which are gaseous at room temperature under atmospheric pressure or can readily be gasified at least under layer forming conditions. Among typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydride such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like effectively as the starting material for introduction of the group V atoms.

Figure 11:
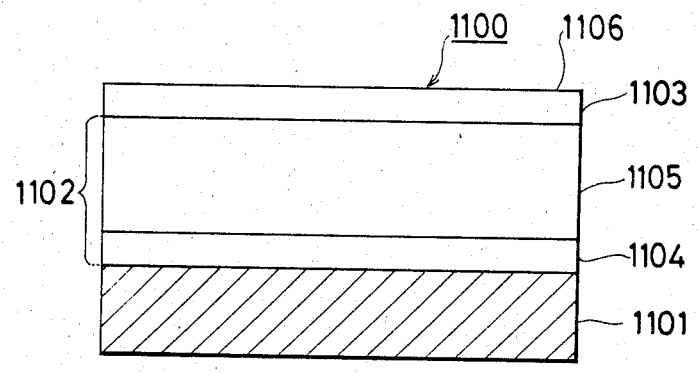

FIG. 11 shows schematically a layer structure of another embodiment of the photoconductive member according to the present invention.

Referring to FIG. 11, photoconductive member 1100 is constituted of support 1101 for a photoconductive member, a first layer (I) 1102 overlying support 1101, and a second layer (II) 1103 which has a free surface 1106 at one end surface.

Photoconductive member 1100 has the same layer structure as photoconductive member 100 in FIG. 1 except that photoconductive member 1100 includes the second layer (II) 1103, and the explanations as above can be applied to the photoconductive member 1100. That is, the first layer (I) 1102 corresponds to light receiving layer 102 and has the same layer structure as light receiving layer 102. The first layer (I) 1102 comprises a first layer region (G) 1104 composed of a-SiGe (H,X) and a second layer region (S) 1105 composed of a-Si (H,X) and having photoconductivity which are laminated in the order as mentioned from the support side.

In FIG. 11, the second layer (II) 1103 formed on the first layer (I) 1102 in photoconductive member 1100 has a free surface and is provided for achieving the objects of the present invention with respect to humidity resistance, continuous repeated use characteristics, dielectric strength, use environmental characteristics and durability.

In the case of photoconductive member 1100, the first layer (I) 1102 and the second layer (II) 1103 are composed of a common constituting material, that is, silicon atoms, in an amorphous form, and therefore, chemical stability is sufficiently assured at the laminate interface.

In FIG. 11, the second layer (II) 1103 of photoconductive member 1100 comprises an amorphous material comprising silicon atoms and at least one of carbon atoms and oxygen atoms, and, if desired, at least one of hydrogen atoms (H) and halogen atoms (X).

As such an amorphous material, there may be mentioned an amorphous material comprising silicon atoms (Si), carbon atoms (C), and, if desired, hydrogen atoms (H) and/or halogen atoms (hereinafter referred to as "a-$(Si_xC_{1-x})_y(H,X)_{1-y}$" where $0<x$, $y<1$) and an amorphous material comprising silicon atoms (Si), oxygen atoms (O), and, if desired, hydrogen atoms (H) and/or halogen atoms (X) (hereinafter referred to as "a-$(Si_xO_{1-x})_y(H,X)_{1-y}$" where $0<x$, $y<1$).

The second layer (II) may be produced by glow discharge, sputtering, ion plantation, ion plating, or electron beam method. These production methods are optionally selected depending on manufacturing conditions, load of capital investment, production scale, characteristics required for the photoconductive members to be produced, and the like, and according to these methods, the manufacturing conditions under which photoconductive members of desired characteristics are produced can be easily controlled. Glow discharging methods or sputtering methods are preferably employed since carbon atoms and halogen atoms together with silicon atoms can be easily introduced into the second layer (II).

Further, according to the present invention, the second layer (II) may be formed by using a glow discharging method and a sputtering method in combination in one and the same apparatus system.

Formation of the second layer (II) according to glow discharging may be carried out by introducing a starting gas for forming the second layer (II), if desired, mixed with a diluting gas at a desired ratio into a deposition chamber for vacuum deposition in which a support is placed, forming a gas plasma of the introduced gas by glow discharging, and depositing an amorphous material constituting the second layer (II) on the first layer (I) already formed on a support.

As an effective starting gas for producing the second layer (II) in the present invention, there may be mentioned materials which are in a gaseous state at room temperature and atmospheric pressure or can be easily gasified.

In the present invention, as a starting gas for forming a-$(Si_xC_{1-x})_y(H,X)_{1-y}$, there may be used most of the gaseous or gasifiable materials containing at least one of silicon atom (Si), carbon atom (C), hydrogen atom (H) and halogen atom (X) as the constituent atom.

When a starting gas containing Si as a constituent atom is used as one of Si, C, H and X, there may be used, for example, a starting gas containing Si as a constituent atom, a starting gas containing C as a constituent atom, and if desired, a starting gas containing H as a constituent atom and/or a starting gas containing X as a constituent gas at a desired mixing ratio; a starting gas containing Si as a constituent atom, a starting gas containing C and H as constituent atoms, and/or a starting gas containing X as a constituent atom at a desired mixing ratio; or a starting gas containing Si as a constituent atom and a starting gas containing Si, C and H as constituent atoms or a starting gas containing Si, C and X as constituent atoms in a form of mixture.

Alternatively, there may be used a mixture of a starting gas containing Si and H as constituent atoms and a starting gas containing C as a constituent atom, or a mixture of a starting gas containing Si and X as constituent atoms and a starting gas containing C as a constituent atom.

In the present invention, as starting gases for forming a-$(Si_xO_{1-x})_y(H,X)_{1-y}$, there may be used most of the gaseous or gasified gasifiable materials containing at least one of silicon atom (Si), oxygen atom (O), hydrogen atom (H), and halogen atom (X) as the constituent atom.

When a starting gas containing Si as a constituent atom is used as one of Si, O, H and X, there may be used, for example, a starting gas containing Si as a constituent atom, a starting gas containing O as a constituent atom, and if desired, a starting gas containing H as a constituent atom and/or a starting gas containing X as a constituent gas at a desired mixing ratio; a starting gas containing Si as a constituent atom, a starting gas containing O and H as constituent atoms, and/or a starting gas containing O and X as constituent atoms at a desired mixing ratio; or a starting gas containing Si as a constituent atom and a starting gas containing Si, O and H as constituent atoms or a starting gas containing Si, O, and X as constituent atoms in a form of mixture.

Alternatively, there may be used a mixture of a starting gas containing Si and H as constituent atoms and a starting gas containing O as a constituent atom, or a mixture of a starting gas containing Si and X as constituent atoms and a starting gas containing O as a constituent atom.

In the present invention, as an effective starting gas for forming the second layer (II), there may be used hydrogenated silicon gases containing Si and H as constituent atoms, for example, silanes such as $SiH_4$, $Si_2H_6$, $Si_3H_8$, $Si_4H_{10}$ and the like, materials containing C and H as constituent atoms such as saturated hydrocarbons having 1-4 carbon atoms, ethylenic hydrocarbons having 2-4 carbon atoms, and acetylenic hydrocarbons having 2-3 carbon atoms, simple substances or compounds containing O as a constituent O atom, or O and N as constituent atoms, halogen, hydrogen halides, interhalogen compounds, silicon halides, halogen-substituted silicon hydrides and the like. Examples are as follows: as saturated hydrocarbons, methane ($CH_4$), ethane $C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methyl acetylene ($C_3H_4$), and butyne ($C_4H_6$).

As halogen simple substances, there may be used halogen gases, i.e. fluorine, chlorine, bromine and iodine.

As hydrogen halides, there may be mentioned HF, HI, HCl and HBr.

As interhalogen compounds, there may be mentioned BrF, ClF, $ClF_3$, $BrF_5$, $BrF_3$, $IF_7$, $IF_5$, ICl, and IBr.

As silicon halides, there may be mentioned $SiF_4$, $Si_2F_6$, $SiCl_4$, $SiCl_3Br$, $SiCl_2Br_2$, $SiClBr_3$, $SiCl_3I$, and $SiBr_4$.

As halogen-substituted silicon hydrides, there may be mentioned $SiH_2F_2$, $SiH_2Cl_2$, $SiHCl_3$, $SiH_3Cl$, $SiH_3Br$, $SiH_2Br_2$, and $SiHBr_3$.

As single substances or compounds containing O as a constituent atom or containing N and O as constituent atoms, there may be mentioned, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), and nitrogen trioxide ($NO_3$).

As lower siloxanes containing silicon atoms (Si), oxygen atoms (O) and hydrogen atoms (H) as constituent atoms, there may be mentioned disiloxane ($H_3SiOSiH_3$), trisiloxane ($H_3SiOSiH_2OSiH_3$), and the like.

Other than above, there may be effectively used halogen-substituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$, etc., fluorinated sulfur compounds such as $SF_4$, $SF_6$, etc., silane derivatives, including alkyl silanes such as $Si(CH_3)_4$, $Si(C_2H_5)_4$, etc., and halo-containing alkyl silanes such as $SiCl(CH_3)_3$, $SiCl_2(CH_3)_2$, $SiCl_3CH_3$, etc.

These materials for forming the second layer (II) are selected as desired such that silicon atom, at least one of carbon atom and oxygen atom, and at least one of hydrogen atom and halogen atom are incorporated in the second layer (II) at a predetermined ratio.

For example, $Si(CH_3)_4$ as the material capable of incorporating easily silicon atoms, carbon atoms and hydrogen atoms and forming a layer having desired characteristics, and $SiHCl_3$, $SiCl_4$, $SiH_2Cl_2$ or $SiH_3Cl$ as the material for incorporating halogen atoms may be mixed at a predetermined mixing ratio and introduced under gaseous state into a device for formation of the second layer (II), followed by excitation of glow discharge, whereby there can be formed a second layer (II) comprising a-$(Si_xC_{1-x})_y(Cl+H)_{1-y}$.

For forming the second layer (II) by sputtering, there is used a single crystal or polycrystal Si wafer, or C wafer or $SiO_2$ wafer, or a wafer composed of Si and C and/or $SiO_2$ in a mixture state as a target, and the sputtering is effected, as desired, in various atmospheres containing halogen atom and/or hydrogen atom as the constituent atoms.

For example, when an Si wafer is used as a target, starting gases for introducing C and/or O, and H and/or X, are diluted with a diluting gas, as desired, and introduced into a deposition chamber for sputtering, and a gas plasma of these gases is formed followed by sputtering with the Si wafer.

Alternatively, Si and C and/or $SiO_2$, are made into separate targets, or Si and C and/or $SiO_2$ are mixed and made into a sheet of target, and then, sputtering is effected in a gas atmosphere containing hydrogen atom and/or halogen atom as desired. As starting gases for introducing C, O, H and X, the materials for forming the second layer (II) as illustrated in the case of glow discharging may be also used as effective materials for sputtering.

In the present invention, as the diluting gas to be used in formation of the second layer (II) by the glow discharge method or the sputtering method, there may be included the so called rare gases such as He, Ne, Ar and the like as preferable ones.

The second layer (II) in the present invention should be carefully formed so that the required characteristics may be given exactly as desired.

That is, the material containing Si, and C and/or O, optionally together with H and/or X as constituent atoms can take various forms from crystalline to amorphous and show electrical properties from conductive through semi-conductive to insulating and photoconductive properties from photoconductive to non-photoconductive depending on the preparation conditions. Therefore, in the present invention, the preparation conditions are strictly selected as desired so that there may be formed the amorphous material for constitution of the second layer (II) having desired characteristics depending on the purpose. For example, when the second layer (II) is to be provided primarily for the purpose of improvement in dielectric strength, a-$(Si_xC_{1-x})_y(H,X)_{1-y}$ and a-$(Si_xO_{1-x})_y(H,X)_{1-y}$ is prepared as an amorphous material having marked electric insulating behaviours under the use environment.

Alternatively, when the primary purpose for provision of the second layer (II) is improvement in continuous repeated use characteristics or environmental use characteristics, the degree of the above electric insulating property may be alleviated to some extent and a-$(Si_xC_{1-x})_y$-$(H,X)_{1-y}$ and a-$(Si_xO_{1-x})_y$-$(H,X)_{1-y}$ may be prepared as an amorphous material having sensitivity to some extent to the light irradiated.

In forming the second layer (II) on the surface of the first layer (I), the support temperature during layer formation is an important factor having influences on the structure and the characteristics of the layer to be formed, and it is desired in the present invention to control severely the support temperature during the layer formation so that the second layer (II) having the intended characteristics may be prepared as desired.

As the support temperature in forming the second layer (II) for accomplishing effectively the objects in the present invention, there may be selected suitably the optimum temperature range in conformity with the method for forming the second layer (II) in carrying out formation of the second layer (II), preferably 20° to 400° C., more preferably 50° to 350° C., most preferably 100° to 300° C. For formation of the second layer (II), the glow discharge method or the sputtering method may be advantageously adopted, because severe control of the composition ratio of atoms constituting the layer or control of layer thickness can be conducted with relative ease as compared with other methods. In case when the second layer (II) is to be formed according to these layer forming methods, the discharging power during layer formation is one of the important factors influencing the characteristics of a-$(Si_xC_{1-x})_y(H,X)$ and a-$(Si_xO_{1-x})_y(H,X)_{1-y}$, similarly to the aforesaid support temperature.

The discharging power condition for preparing effectively a-$(Si_xC_{1-x})_y(H,X)_{1-y}$ and a-$(Si_xO_{1-x})_y(H,X)_{1-y}$ having characteristics for accomplishing the objects of the present invention with good productivity may preferably be 10 to 300 W, more preferably 20 to 250 W, most preferably 50 to 200 W.

The gas pressure in a deposition chamber may preferably be 0.01 to 1 Torr, more preferably 0.1 to 0.5 Torr. In the present invention, the above numerical ranges may be mentioned as preferable numerical ranges for the support temperature, discharging power for preparation of the second layer (II). However, these factors for layer formation should not be determined separately independently of each other, but it is desirable that the optimum values of respective layer forming factors should be determined based on mutual organic relationships so that the second layer (II) having desired characteristics may be formed.

The respective contents of carbon atoms and/or oxygen atoms in the second layer (II) in the photoconductive member of the present invention are important factors for obtaining the desired characteristics to accomplish the objects of the present invention, similarly to the conditions for preparation of the second layer (II). The respective contents of carbon atoms and/or oxygen atoms contained in the second layer (II) in the present invention are determined as desired depending on the type of the amorphous material constituting the second layer (II) and its characteristics.

That is, the amorphous material represented by the above formula a-$(Si_xC_{1-x})_y(H,X)_{1-y}$ may be broadly classified into an amorphous material constituted of silicon atoms and carbon atoms (hereinafter written as "a-$Si_aC_{1-a}$", where $0<a<1$), an amorphous material constituted of silicon atoms, carbon atoms and hydrogen atoms (hereinafter written as a-$(Si_bC_{1-b})_cH_{1-c}$, where $0<b$, $c<1$) and an amorphous material constituted of silicon atoms, carbon atoms, halogen atoms and optionally hydrogen atoms (hereinafter written as "a-$(Si_dC_{1-d})_e(H,X)_{1-e}$", where $0<d$, $e<1$).

In the present invention, when the second layer (II) is to be constituted of a-$Si_aC_{1-a}$, the content of carbon atoms in the second layer (II) may preferably be $1\times 10^{-3}$ to 90 atomic %, more preferably 1 to 80 atomic %, most preferably 10 to 75 atomic %, namely in terms of representation by a in the above a-$Si_aC_{1-a}$, a being preferably 0.1 to 0.99999, more preferably 0.2 to 0.99, most preferably 0.25 to 0.9.

When the second layer (II) is to be constituted of a-$(Si_bC_{1-b})_cH_{1-c}$, the content of carbon atoms in the second layer (II) may preferably be $1\times 10^{-3}$ to 90 atomic %, more preferably 1 to 90 atomic %, most preferably 10 to 80 atomic %, the content of hydrogen atoms preferably 1 to 40 atomic %, more preferably 2 to 35 atomic %, most preferably 5 to 30 atomic %, and the photoconductive member formed when the hydrogen content is within these ranges can be sufficiently applicable as excellent one in practical aspect.

That is, in terms of the representation by the above a-$(Si_bC_{1-b})_cH_{1-c}$, b should preferably be 0.1 to 0.99999, more preferably 0.1 to 0.99, most preferably 0.15 to 0.9, and c preferably 0.6 to 0.99, more preferably 0.65 to 0.98, most preferably 0.7 to 0.95.

When the second layer (II) to be constituted of a-$(Si_dC_{1-d})_e(X,H)_{1-e}$, the content of carbon atoms in the second layer (II) may preferably be $1\times 10^{-3}$ to 90 atomic %, more preferably 1 to 90 atomic %, most preferably 10 to 80 atomic %, the content of halogen atoms preferably 1 to 20 atomic %, more preferably 1 to 18 atomic %, most preferably 2 to 15 atomic %. When the content of halogen atoms is within these ranges, the photoconductive member prepared is sufficiently applicable in practical aspect. The content of hydrogen atoms optionally contained may preferably be 19 atomic % or less, more preferably 13 atomic % or less.

In terms of representation by d and e in the above a-$(S_dC_{1-d})_e(H,X)_{1-e}$, d should preferably be 0.1 to 0.99999, more preferably 0.1 to 0.99, most preferably 0.15 to 0.9, and e preferably 0.8 to 0.99, more preferably 0.82–0.99, most preferably 0.85 to 0.98. Also the amorphous material represented by the above formula a-$(Si_xO_{1-x})_y(H,X)_{1-y}$ may be broadly classified into an amorphous material constituted of silicon atoms and oxygen atoms (hereinafter written as "a-$Si_aO_{1-a}$", where $0<a<1$), an amorphous material constituted of silicon atoms, oxygen atoms and hydrogen atoms [hereinafter written as a-$(Si_bO_{1-b})_cH_{1-c}$, where $0<b$, $c<1$], and an amorphous material constituted of silicon atoms, oxygen atoms, halogen atoms and optionally hydrogen atoms [hereinafter written as "a-$(Si_dO_{1-d})_e(X,H)_{1-e}$", where $0<d, e<1$].

In the present invention, when the second layer (II) is to be constituted of a-$Si_aO_{1-a}$, the content of oxygen atoms in the second layer (II) may be in terms of representation by a in the above a-$Si_aO_{1-a}$, a being preferably 0.33 to 0.99999, more preferably 0.5 to 0.99, most preferably 0.6 to 0.9.

In the present invention, when the second layer (II) is to be constituted of a-$(Si_bO_{1-b})_cH_{1-c}$, the content of oxygen atoms may be in terms of the representation by the above a-$(Si_bO_{1-b})_cH_{1-c}$, b should preferably be 0.33 to 0.99999, more preferably 0.5 to 0.99, most preferably 0.6 to 0.9, and c preferably 0.6 to 0.99, more preferably 0.65 to 0.98, most preferably 0.7 to 0.95.

When the second layer (II) is to be constituted of a-$(Si_dO_{1-d})_e(X,H)_{1-e}$, the content of oxygen atoms may be in terms of representation by d and e in the above a-$(Si_dO_{1-d})_e(X,H)_{1-e}$, d should preferably be 0.33 to 0.99999, more preferably 0.5 to 0.99, most preferably 0.6 to 0.9, and e preferably 0.8 to 0.99, more preferably 0.82 to 0.99, most preferably 0.85 to 0.98.

The range of the numerical value of layer thickness of the second layer (II) is an important factor to effectively accomplish the objects of the present invention and should desirably be determined depending on the intended purpose.

The layer thickness of the second layer (II) is also required to be determined as desired suitably with due considerations about the relationships with the contents of oxygen atoms, the relationship with the layer thickness of the first layer (I), as well as other organic relationships with the characteristics required for respective layer regions. In addition, it is also desirable to have considerations from economical point of view such as productivity or capability of mass production.

The second layer (II) in the present invention is desired to have a layer thickness preferably of 0.003 to 30μ, more preferably 0.004 to 20μ, most preferably 0.005 to 10μ.

As the halogen atom contained in the second layer according to the present invention, there may be preferably F, Cl, Br and I, more preferably F and Cl.

The support to be used in the present invention may be either electroconductive material or insulating material. As the electroconductive material, there may be mentioned metals such as NiCr, stainless steel, Al, Cr, Mo, Au, Nb, Ta, V, Ti, Pt, Pd etc. or alloys thereof.

As the insulating material, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and the like. These insulating supports should preferably have at least one surface subjected to electroconductivizing treatment, and it is desirable to provide other layers on the electroconductivized surface.

For example, electroconductivizing treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3$-$SnO_2$) thereon. Alternatively, a synthetic resin film such as polyester film can be subjected to the electroconductivizing treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member in FIG. 1 or FIG. 11 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have flexibility, the support is made as thin as possible, so far as the function of a support can be sufficiently exhibited. However, in such a case, the thickness is preferably 10μ or more from viewpoints of fabrication and handling of the support as well as its mechanical strength.

Next, an example of the process for producing the photoconductive member of this invention is to be briefly described.

Figure 12:
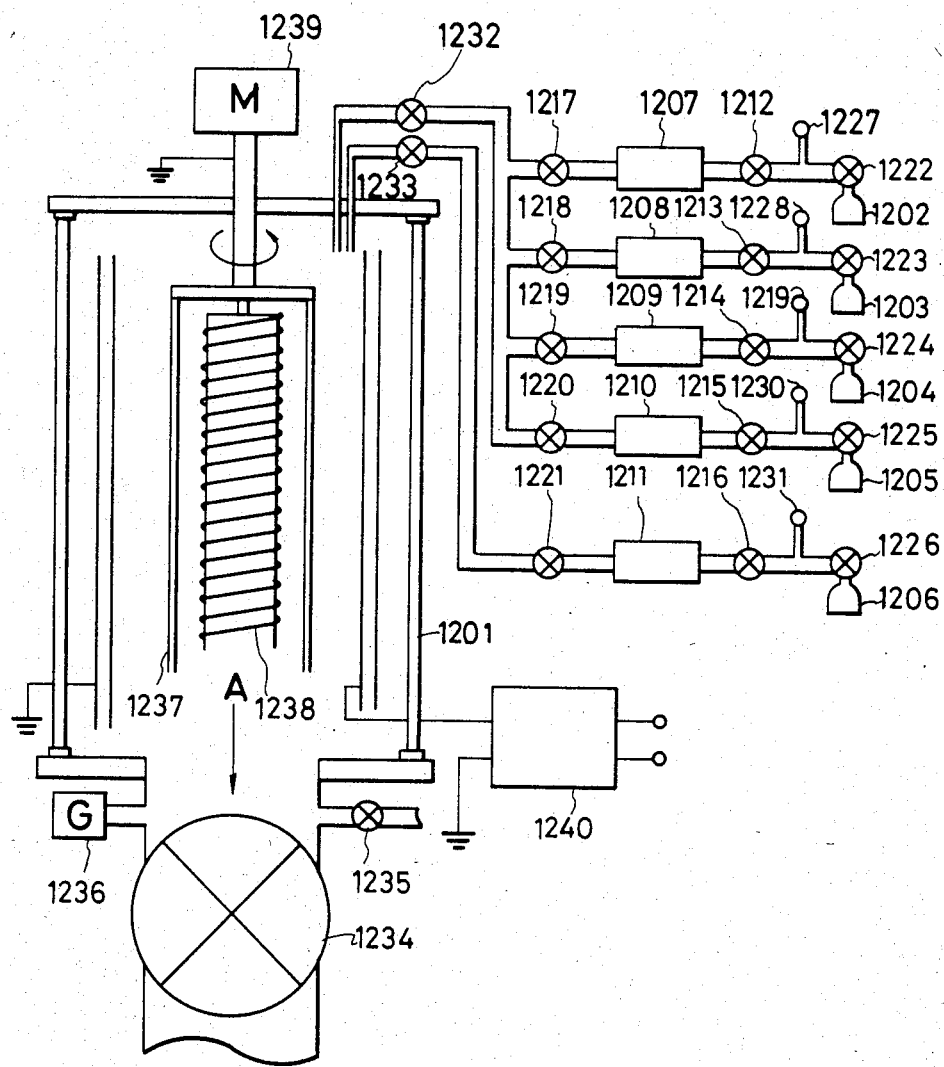
FIG. 12 schematically shows an apparatus which may be used for fabricating the photoconductive member according to the present invention.

FIG. 12 shows one example of a device for producing a photoconductive member.

In the gas bombs 1202 to 1206, there are hermetically contained starting gases for formation of the photosensitive member of the present invention. For example, 1202 is a bomb containing $SiH_4$ gas diluted with He (purity: 99.999%, hereinafter abbreviated as $SiH_4$/He), 1203 is a bomb containing $GeH_4$ gas diluted with He (purity: 99.999%, hereinafter abbreviated as $GeH_4$/He), 1204 is a bomb containing $SiF_4$ gas diluted with He (purity: 99.99%, hereinafter abbreviated as $SiF_4$/He), 1205 is a bomb containing $NH_3$ gas (purity: 99.999%) and 1206 is a bomb containing $H_2$ gas (purity: 99.999%).

For allowing these gases to flow into the reaction chamber 1201, on confirmation of the valves 1222–1226 of the gas bombs 1202–1206 and the leak valve 1235 to be closed, and the inflow valves 1212–1216, the outflow valves 1217–1221 and the auxiliary valves 1232, 1233 to be opened, the main valve 1234 is first opened to evacuate the reaction chamber 1201 and the gas pipelines. As the next step, when the reading on the vacuum indicator 1236 becomes about $5 \times 10^{-6}$ Torr, the auxiliary valves 1232, 1233 and the outflow valves 1217–1221 are closed.

Referring now to an example of forming the first layer (I) on a cylindrical substrate 1237, $SiH_4$/He gas from gas bomb 1202, $GeH_4$/He gas from gas bomb 1203, $NH_3$ gas from gas bomb 1205 are permitted to flow into the mass-flow controllers 1207, 1208, and 1210, respectively, by opening valves 1222, 1223 and 1225 to adjust the pressures at outlet pressure gauges 1227, 1228 and 1230 to 1 Kg/cm², and opening gradually inflow valves 1212, 1213 and 1215. Then, outflow valves 1217, 1218 and 1220, and auxiliary valve 1232 are gradually opened to permit respective gases to flow into reaction chamber 1201. Outflow valves 1217, 1218 and 1220 are adjusted so as to render the flow rate ratio of SiH$_4$/He gas:GeH$_4$/He gas:NH$_3$ gas to be a desired value, and further the pressure in reaction chamber 1201 is adjusted to a desired value by controlling the opening of main valve 1234 while observing the reading of vacuum meter 1236. Then, after confirming that the temperature of substrate 1237 is set to about 50°–400° C. by heater 1238, power source 1240 is set to a predetermined power to exite a glow discharge in reaction chamber 1201, and simultaneously the flow rate of GeH$_4$/He gas is controlled following a preliminarily designed change rate curve by gradually changing the opening of valve 1218 by manual operation or an externally driven motor and thereby the distribution concentration of germanium atoms to be contained in the resulting layer.

In a way as mentioned above, glow discharge is continued for a desired period of time to form the first layer region (G) on substrate 1237 in a desired thickness. After the first layer region (G) has been formed in a desired thickness, the second layer region (S) substantially not containing germanium atoms is formed on the first layer region (G) under the same conditions as and by the same procedure as above except that outflow valve 1218 is completely closed and, if desired, the discharging conditions are changed. A substance controlling conductivity may be incorporated in the second layer region (S) by adding a gas such as B$_2$H$_6$, PH$_3$ and the like into a gas introduced into deposition chamber 1201 upon forming the second layer region (S).

The second layer (II) may be formed on the first layer (I) which has been formed in a desired thickness by the same valve operation as that for producing the first layer (I), for example, diluting SiH$_4$ gas. C$_2$H$_4$ gas and/or NO gas with a diluting gas such as He, if desired, and exiting a glow discharging under desired conditions.

Halogen atoms may be incorporated in the second layer (II) by, for example, forming the second layer (II) in a way similar to that as mentioned above with the introduction of SiF$_4$ gas, NO gas, and/or C$_2$H$_4$ gas, or further adding SiH$_4$ thereto.

Outflow valves other than an outflow valve necessary to form a particular layer are naturally closed upon forming said particular layer. Also, during formation of respective layers, in order to avoid remaining of the gas employed for formation of the preceding layer in the reaction chamber 1201 and the gas pipelines from the outflow valves 1217–1221 to the reaction chamber 1201, the operation of evacuating the system to high vacuum by closing the outflow valves 1217–1221, opening the auxiliary valves 1232, 1233 and opening fully the main valve 1234 is conducted, if necessary.

The amount of carbon atoms and/or oxygen atoms may be optionally controlled as desired by, for example, in the case of glow discharge, changing the gas flow rate ratio of SiH$_4$:C$_2$H$_4$: NO introduced into reaction chamber 1201 as desired, or in the case of layer formation by sputtering, mixing a sputtering gas (Ar) with C$_2$H$_4$ gas and/or NO gas under controlling the flow rates, or changing the sputtering area ratio of silicon wafer to C and/or SiO$_2$ wafer upon forming the target, or changing the ratio of silicon powders to C and/or SiO$_2$ powders upon forming the target.

The content of halogen atoms (X) contained in the second layer (II) can be controlled by controlling the flow rate of the starting gas for introduction of halogen atoms such as SiF$_4$ gas when introduced into the reaction chamber 1201.

Also, for uniformization of the layer formation, it is desirable to rotate the substrate 1237 by means of a motor 1239 at a constant speed during layer formation.

The photoconductive members of the present invention having the layer structure as mentioned above can solve the drawbacks of the prior art and have excellent electrical, optical, photoconductive characteristics, dielectric strength, and use environmental characteristics.

In particular, when the photoconductive member is used as an image forming member for electrophotography, there is not any effect of residual potential on the image formation, the electric characteristics are stable, the sensitivity is high and the SN ratio is high. In addition, the photoconductive member exhibits high light fatigue resistance, good repeated use characteristics, and can stably and repeatedly produce high quality images of high density, clear half tone and high resolution.

In the photoconductive member of the present invention, as to the light receiving layer formed on the support, the layer itself is strong and can be closely contacted with the support and also can be used repeatedly at a high speed for a long time continuously.

EXAMPLE 1

Figure 13:
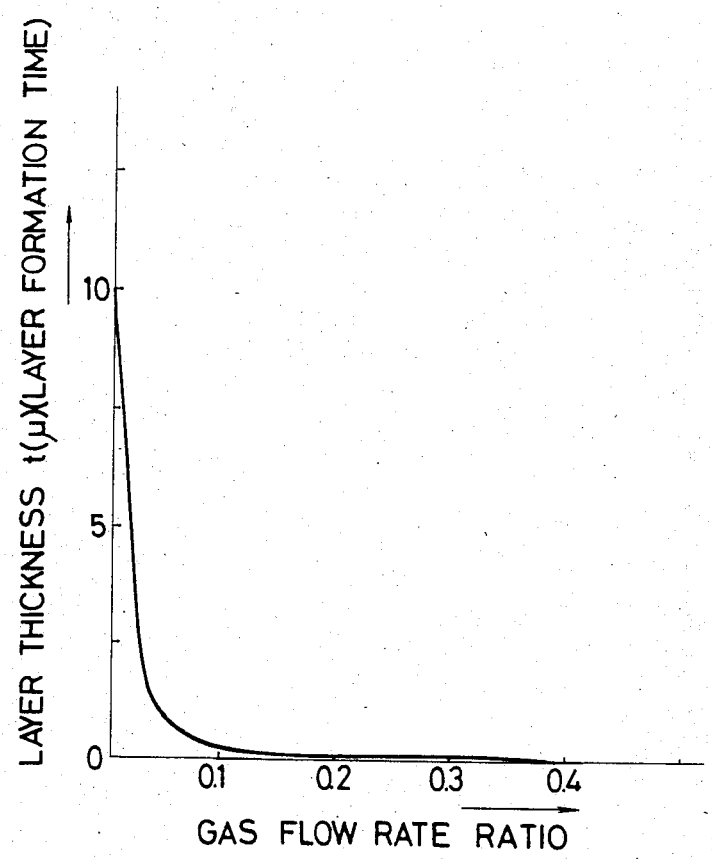
FIG. 13–FIG. 21 show changing rate curves of gas flow rate ratio in the examples of the present invention.

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table 1A following the changing curve of the gas flow rate ratio as shown in FIG. 13, and thereby, an electrophotographic image forming member was produced.

The resulting image forming member was set in an experimental device for charging and exposure, and corona charging was effected at ⊖5.0 KV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖5.0 KV, there was obtained a clear image of high density excellent in resolution with good gradation reproducibility.

EXAMPLE 2

Figure 14:
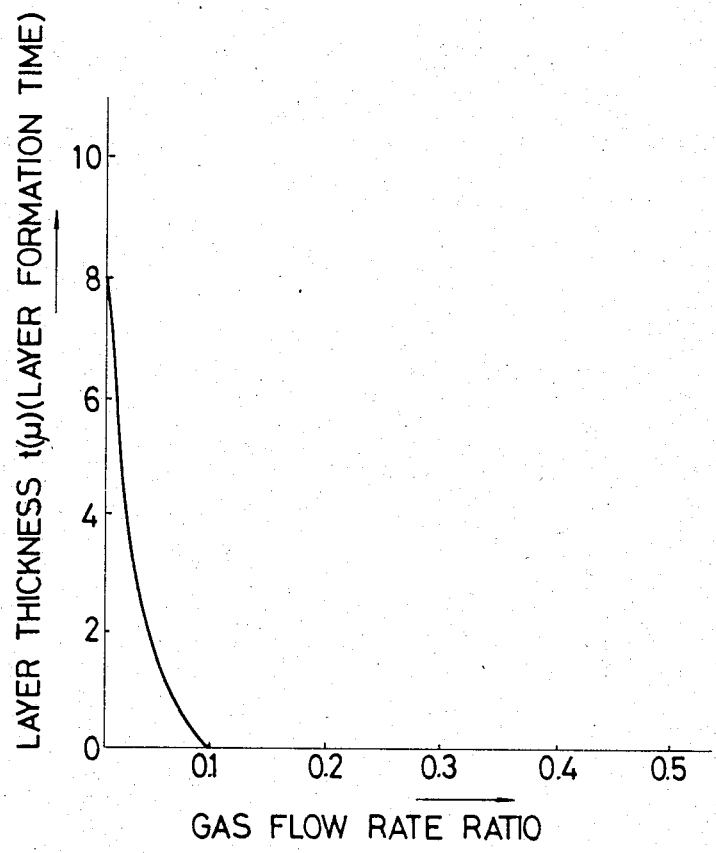

By the preparation device as shown in FIG. 12, layers were formed by changing the gas flow rate ratio of GeH$_4$/He gas to SiH$_4$/He gas along with the lapse of time for forming the layer under the condition of Table 2A following the changing curve of the gas flow rate ratio as shown in FIG. 14 and other conditions were the same as in Example 1. Thereby, an electrophotographic image forming member was produced.

Using the resulting image forming member, image formation was effected on a transfer paper acording to the same procedure and under the same conditions as in Example 1, whereby a very clear image quality was obtained.

EXAMPLE 3

Figure 15:
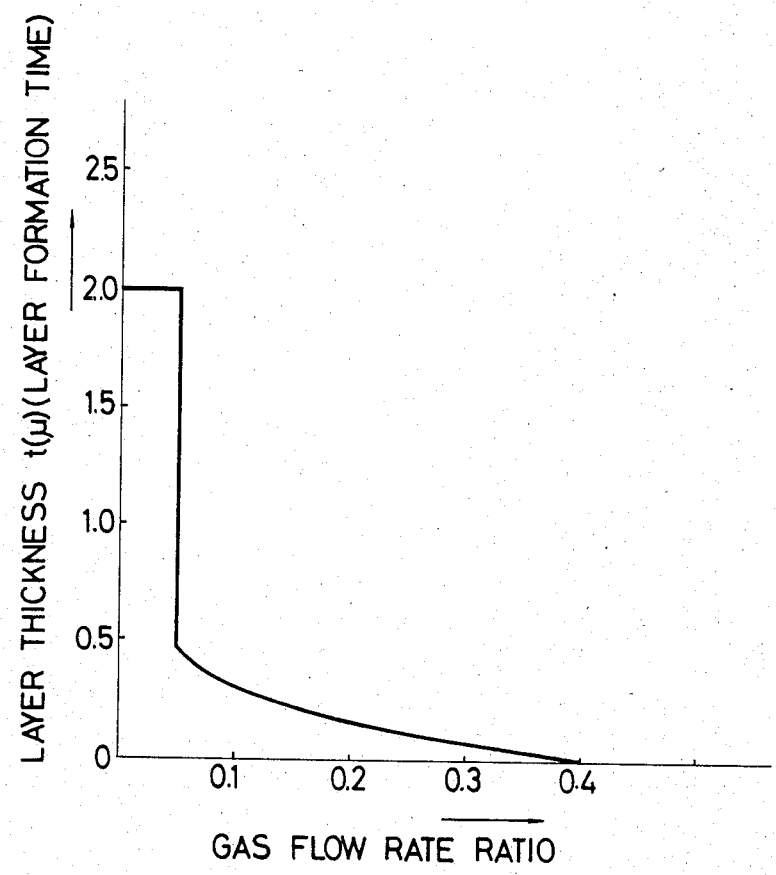

By the preparation device as shown in FIG. 12, layers were formed by changing the gas flow rate ratio of $GeH_4/He$ gas to $SiH_4/He$ gas along with the lapse of time for forming the layer under the condition of Table 3A following the changing curve of the gas flow rate ratio as shown in FIG. 15 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 4

Figure 16:
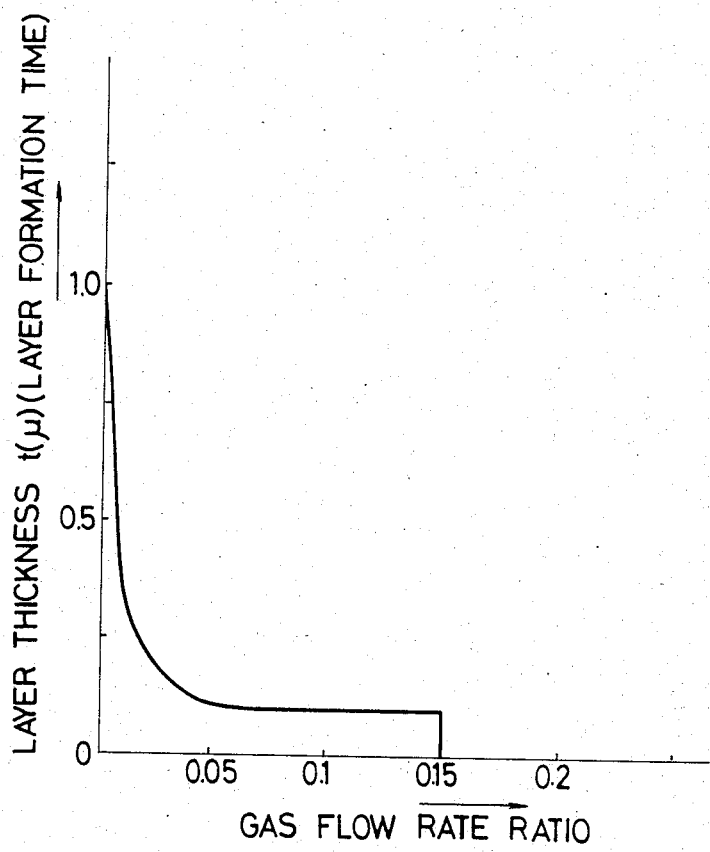

By the preparation device as shown in FIG. 12, layers were formed by changing the gas flow rate ratio of $GeH_4/He$ gas to $SiH_4/He$ gas along with the lapse of time for forming the layer under the condition of Table 4A following the changing curve of the gas flow rate ratio as shown in FIG. 16 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 5

Figure 17:
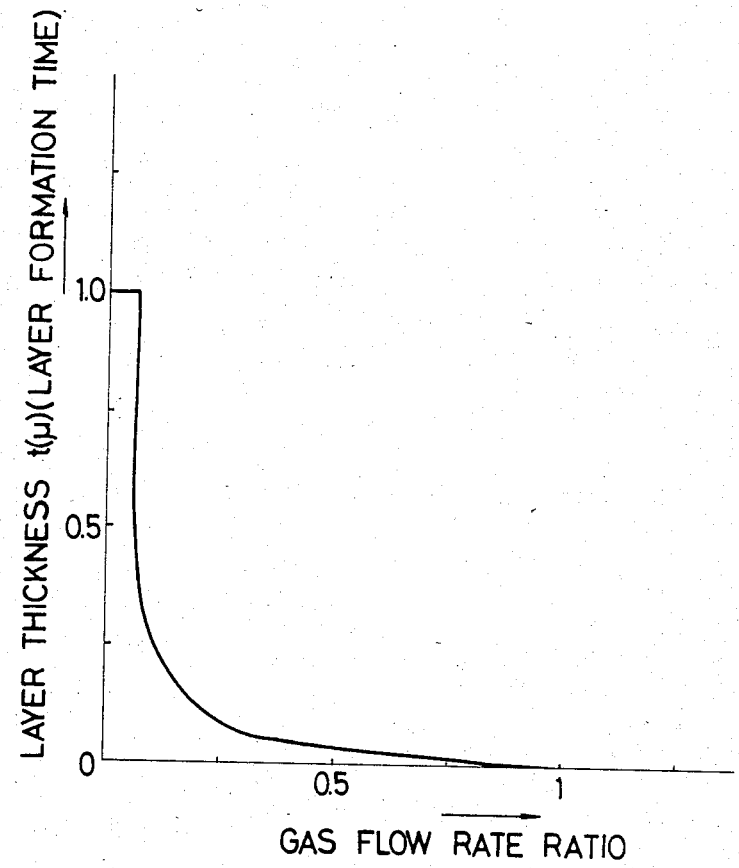

By the preparation device as shown in FIG. 12, layers were formed by changing the gas flow rate ratio of $GeH_4/He$ gas to $SiH_4/He$ gas along with the lapse of time for forming the layer under the condition of Table 5A following the changing curve of the gas flow rate ratio as shown in FIG. 17 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 6

Figure 18:
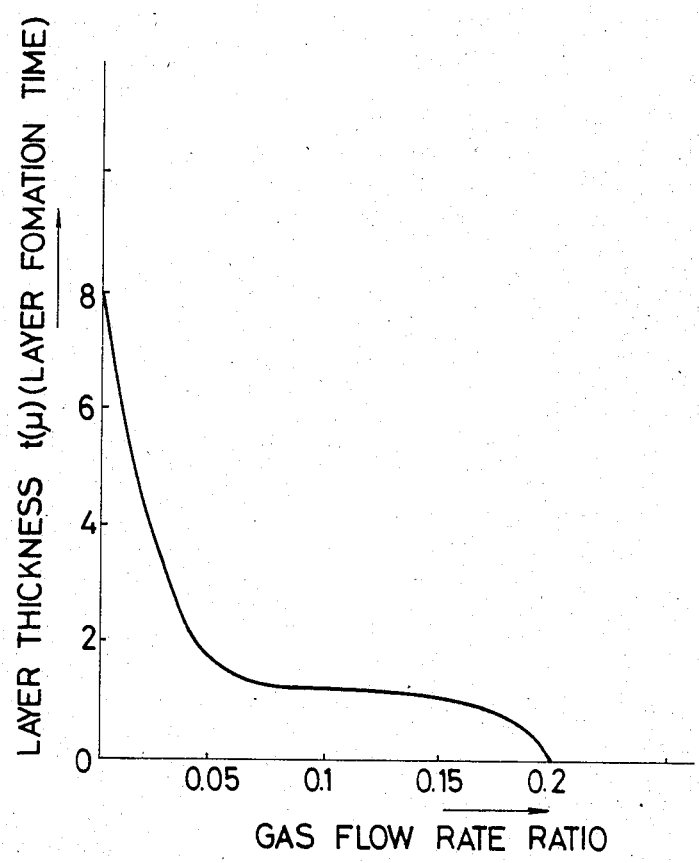

By the preparation device as shown in FIG. 12, layers were formed by changing the gas flow rate ratio of $GeH_4/He$ gas to $SiH_4/He$ gas along with the lapse of time for forming the layer under the condition of Table 6A following the changing curve of the gas flow rate ratio as shown in FIG. 18 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 7

Figure 19:
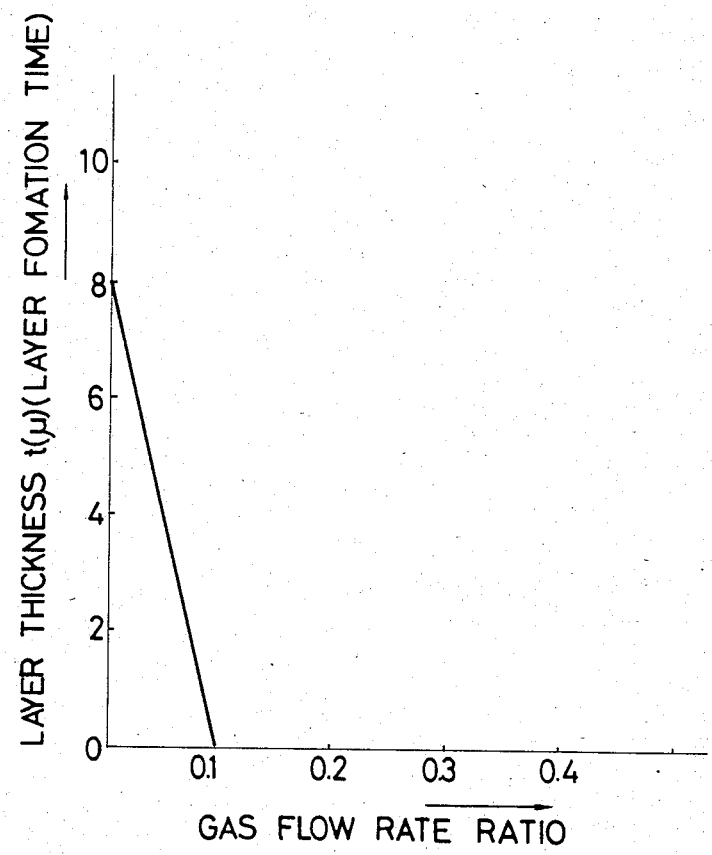

By the preparation device as shown in FIG. 12, layers were formed by changing the gas flow rate ratio of $GeH_4/He$ gas to $SiH_4/He$ gas along with the lapse of time for forming the layer under the condition of Table 7A following the changing curve of the gas flow rate ratio as shown in FIG. 19 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 8

Layers were formed under the same conditions as Example 1 except that $Si_2H_6/He$ gas was used in place of $SiH_4/He$ gas used in Example 1 and that the operating condition was changed to that us shown in Table 8A. Thereby, an electrophotographic image forming member was produced.

Using the resulting image forming member, image formation was effected on the transfer paper according to the same procedure and under the same conditions as in Example 1, whereby a very clear image quality was obtained.

EXAMPLE 9

Layers were formed under the same conditions as Example 1 except that $SiF_4/He$ gas was used in place of $SiH_4/He$ gas used in Example 1 and that the operating condition was changed to that as shown in Table 9A. Thereby, an electrophotographic image forming member was produced.

Using the resulting image forming member, image formation was effected on the transfer paper according to the same procedure and under the same conditions as in Example 1, whereby a very clear image quality was obtained.

EXAMPLE 10

Layers were formed under the same conditions as Example 1 except that $(SiH_4/He+SiF_4/He)$ gas was used in place of $SiH_4/He$ gas used in Example 1 and that the operating condition was changed to that us shown in Table 10A. Thereby, an electrophotographic image forming member was produced.

Using the resulting image forming member, image formation was effected on the transfer paper according to the same procedure and under the same conditions as in Example 1, whereby a very clear image quality was obtained.

EXAMPLE 11

Electrophotographic image forming members were produced under the same conditions as in Examples 1–10 except that preparation condition of the third layer in Examples 1–10 were changed as shown in Table 11A.

Using the resulting image forming members, image formation was effected on the transfer paper according to the same procedure and under the same conditions as in example 1, whereby the results as shown in Table 11AA were obtained.

EXAMPLE 12

Electrophotographic image forming members were produced under the same conditions as in Examples 1–10 except that preparation condition of the third layer in Examples 1–10 were changed as shown in Table 12A.

Using the resulting image forming members, image formation was effected on the transfer paper according to the same procedure and under the same conditions as in Example 1, whereby the results as shown in Table 12A were obtained.

EXAMPLE 13

Figure 20:
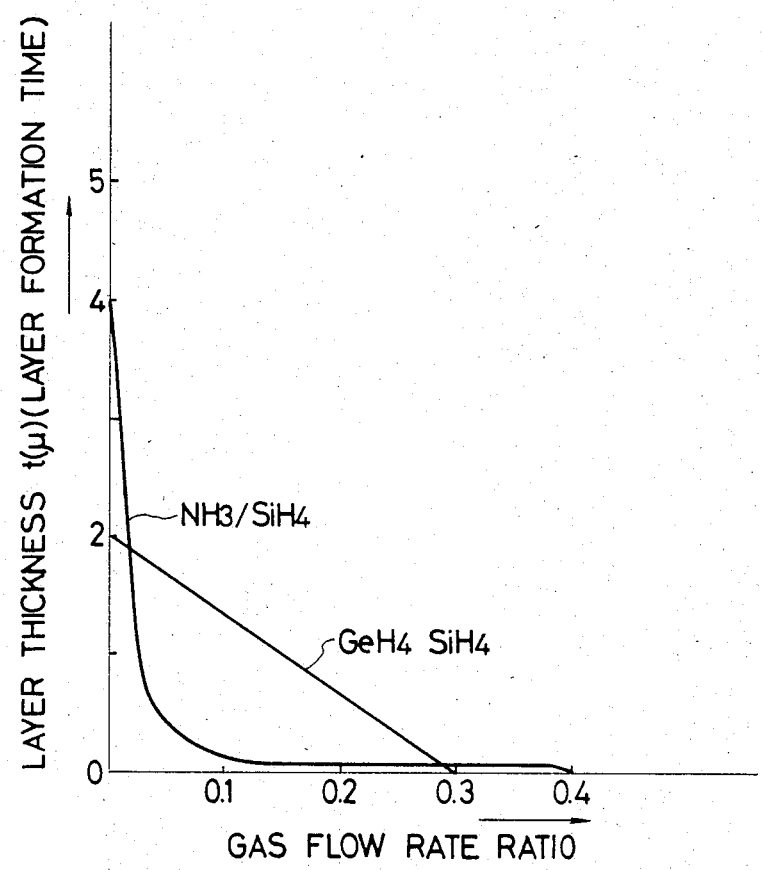

By the preparation device as shown in FIG. 12, layers were formed by changing the gas flow rate ratio of GeH$_4$/He gas to SiH$_4$/He gas and that of NH$_3$ gas to SiH$_4$/He gas along with the lapse of time for forming the layer under the condition of Table 13A following the changing curve of the gas flow rate ratio as shown in FIG. 20 and other conditions were the same as in Example 1. Thereby an electrophotographic image forming member was produced.

Using the resulting image forming member, image formation was effected on a transfer paper according to the same procedure and under the same conditions as in Example 1, whereby a very clear image quality was obtained.

EXAMPLE 14

Figure 21:
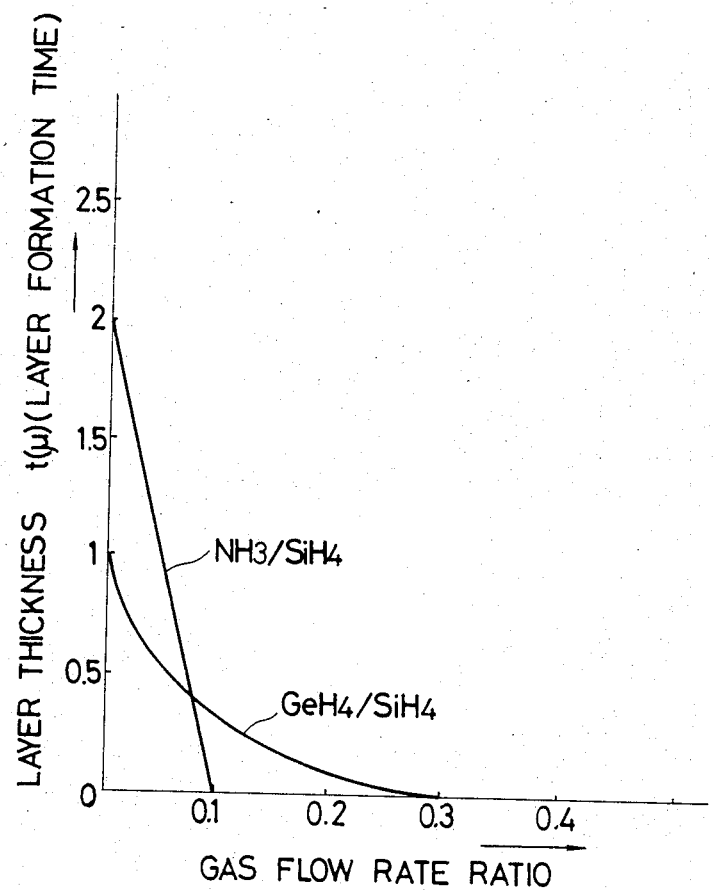

By the preparation device as shown in FIG. 12, layers were formed by changing the gas flow rate ratio of GeH$_4$/He gas to SiH$_4$/He gas and that of NH$_3$ gas to SiH$_4$/He gas along with the lapse of time for forming the layer under the condition of Table 14A following the changing curve of the gas flow rate ratio as shown in FIG. 21 and other conditions were the same as in Example 1. Thereby, an electrophotographic image forming member was produced.

Using the resulting image forming member, image formation was effected on a transfer paper according to the same procedure and under the same conditions as in Example 1, whereby a very clear image quality was obtained.

EXAMPLE 15

Toner images were formed under the same conditions for a toner image formation as in Example 1 except that electrostatic images were formed by using GaAs type semiconductor laser (10 mW) of 810 nm in place of a tungsten lamp used in Examples 1–10. The electrophotographic image forming members produced under the same conditions as in Examples 1–10 were evaluated as to quality of the transferred toner images. The images were clear images of high quality excellent in resolution with good gradation reproducibility.

EXAMPLE 16

By the preparation device as shown in FIG. 12, layers were formed on an Al cylinder substrate by changing the gas flow rate ratio of GeH$_4$/He gas to SiH$_4$/He gas along with the lapse of time for forming the layer under the condition of Table 1B following the changing curve of the gas flow rate ratio as shown in FIG. 13, and thereby, an electrophotographic image forming member was produced.

The resulting image forming member was set in an experimental device for charging and exposure, and corona charging was effected at $\ominus$5.0 KV for 0.3 second, followed immediately by irradiation of a light image from a tungsten lamp source at a close of 2 lux·sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus$5.0 KV, there was obtained a clear image of high density excellent in resolution with good gradation reproducibility.

EXAMPLE 17

By the preparation device as shown in FIG. 12, layers were formed by changing the gas flow rate ratio of GeH$_4$/He gas to SiH$_4$/He gas along with the lapse of time for forming the layer under the condition of Table 2B following the changing curve of the gas flow rate ratio as shown in FIG. 14 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 18

By the preparation device as shown in FIG. 12, layers were formed by changing the gas flow rate ratio of GeH$_4$/He gas to SiH$_4$/He gas along with the lapse of time for forming the layer under the condition of Table 3B following the changing curve of the gas flow rate ratio as shown in FIG. 15 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 19

By the preparation device as shown in FIG. 12, layers were formed by changing the gas flow rate ratio of GeH$_4$/He gas to SiH$_4$/He gas along with the lapse time for forming the layer under the condition of Table 4B following the changing curve of the gas flow rate ratio as shown in FIG. 16 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 20

By the preparation device as shown in FIG. 12, layers were formed by changing the gas flow rate ratio of $GeH_4/He$ gas to $SiH_4/He$ gas along with the lapse of time for forming the layer under the condition of Table 5B following the changing curve of the gas flow rate ratio as shown in FIG. 17 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 21

By the preparation device as shown in FIG. 12, layers were formed by changing the gas flow rate ratio of $GeH_4/He$ gas to $SiH_4/He$ gas along with the lapse of time for forming the layer under the condition of Table 6B following the changing curve of the gas flow rate ratio as shown in FIG. 18 and other conditions were the same as in Example 16. Thereby, an electrophotographic image forming member was produced.

Using the resulting image forming member, image formation was effected on a transfer paper according to the same procedure and under the same conditions as in Example 16, whereby a very clear image quality was obtained.

EXAMPLE 22

By the preparation device as shown in FIG. 12, layers were formed by changing the gas flow rate ratio of $GeH_4/He$ gas to $SiH_4/He$ gas along with the lapse of time for forming the layer under the condition of Table 7B following the changing curve of the gas flow rate ratio as shown in FIG. 19 and other conditions were the same as in Example 16. Thereby, and electrophotographic image forming member was produced.

Using the resulting image forming member, image formation was effected on a transfer paper according to the same procedure and under the same conditions as in Example 16, wherbey a very clear image quality was obtained.

EXAMPLE 23

Layers were formed under the same conditions as Example 16 except that $Si_2H_6/He$ gas was used in place of $SiH_4/He$ gas used in Example 16 and that the operating condition was changed to that as shown in Table 8B. Thereby, an electrophotographic image forming member was produced.

Using the resulting image forming member, image formation was effected on the transfer paper according to the same procedure and under the same conditions as in Example 16, whereby a very clear image quality was obtained.

EXAMPLE 24

Layers were formed under the same conditions as Example 16 except that $SiF_4/He$ gas was used in place of $SiH_4/He$ gas used in Example 16 and that the operating condition was changed to that as shown in Table 9B. Thereby, an electrophotographic image forming member was produced.

Using the resulting image forming member, image formation was effected on the transfer paper according to the same procedure and under the same conditions as in Example 16, whereby a very clear image quality was obtained.

EXAMPLE 25

Layers were formed under the same conditions as Example 16 except that $(SiH_4/He + SiF_4/He)$ gas was used in place of $SiH_4/He$ gas used in Example 16 and that the operating condition was changed to that as shown in Table 10B. Thereby, an electrophotographic image forming member was produced.

Using the resulting image forming member, image formation was effected on the transfer paper according to the same procedure and under the same conditions as in Example 16, whereby a very clear image quality was obtained.

EXAMPLE 26

By the preparation device as shown in FIG. 12, layers were formed on an Al cylinder substrate by changing the gas flow rate ratio of $GeH_4/He$ gas to $SiH_4/He$ gas along with the lapse of time for forming the layer under the condition of Table 11B following the changing curve of the gas flow rate ratio as shown in FIG. 13, and thereby, an electrophotographic image forming member was produced.

The resulting image forming member was set in an experimental device for charging and exposure, and corona charging was effected at $\ominus 5.0$ KV for 0.3 second, followed immediately by irradiation of a light image from a tungsten lamp source at a dose of 2 lux-sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus 5.0$ KV, there was obtained a clear image of high density excellent in resolution with good gradation reproducibility.

EXAMPLE 27

Electrophotographic image forming members were produced under the same conditions as in Example 26 except that the flow rate ratio of $B_2H_6$ to ($SiH_4+GeH_4$) upon formation of the first layer in Example 26 and the flow rate ratio of $B_2H_6$ to $SiH_4$ upon formation of the second layer in Example 26 were changed as shown in Table 12B.

Using the resulting image forming members, image formation was effected on the transfer paper according to the same procedure and under the same conditions as in Example 26, whereby the results as shown in Table 12B were obtained.

EXAMPLE 28

Electrophotographic image forming members (Sample Nos. 1301B–1310B, 1401B–1410B) were produced under the same conditions as in Examples except that preparation conditions of second layer in Examples 16–25 were changed as shown in Tables 13B and 14B.

Using the resulting image forming members, image formation was effected on the transfer paper according to the same procedure and under the same conditions as in Example 16, whereby the results as shown in Tables 13 and 14AB were obtained.

EXAMPLE 29

Toner images were formed under the same conditions for a toner image formation as in Example 16 except that electrostatic images were formed by using GaAs type semiconductor laser (10 mW) of 810 nm in place of a tungsten lamp used in Example 16. The electrophotographic image forming members produced under the same conditions as in Example 16 were evaluated as to quality of the transferred toner images. The images were clear images of high quality excellent in resolution with good gradation reproducibility.

EXAMPLE 30

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table 1C following the changing curve of the gas flow rate ratio as shown in FIG. 13, and thereby, an electrophotographic image forming member was produced.

The resulting image forming member was set in an experimental device for charging and exposure, and corona charging was effected at ⊖5.0 KV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖5.0 KV, there was obtained a clear image of high density excellent in resolution with good gradation reproducibility.

EXAMPLE 31

By the preparation device as shown in FIG. 12, layers were formed by changing the gas flow rate ratio of $GeH_4$/He gas to $SiH_4$/He gas along with the lapse of time for forming the layer under the condition of Table 2C following the changing curve of the gas flow rate ratio as shown in FIG. 14 and other conditions were the same as in Example 30. Thereby, an electrophotographic image forming member was produced.

Using the resulting image forming member, image formation was effected on a transfer paper according to the same procedure and under the same conditions as in Example 30, whereby a very clear image quality was obtained.

EXAMPLE 32

By the preparation device as shown in FIG. 12, layers were formed by changing the gas flow rate ratio of $GeH_4$/He gas to $SiH_4$/He gas along with the lapse of time for forming the layer under the condition of Table 3C following the changing curve of the gas flow rate ratio as shown in FIG. 15 and other conditions were the same as in Example 30. Thereby, an electrophotographic image forming member was produced.

Using the resulting image forming member, image formation was effected on a transfer paper according to the same procedure and under the same conditions as in Example 30, whereby a very clear image quality was obtained.

EXAMPLE 33

By the preparation device as shown in FIG. 12, layers were formed by changing the gas flow rate ratio of $GeH_4$/He gas to $SiH_4$/He gas along with the lapse of time for forming the layer under the condition of Table 4C following the changing curve of the gas flow rate ratio as shown in FIG. 16 and other conditions were the same as in Example 30. Thereby, an electrophotographic image forming member was produced.

Using the resulting image forming member, image formation was effected on a transfer paper according to the same procedure and under the same conditions as in Example 30, whereby a very clear image quality was obtained.

EXAMPLE 34

By the preparation device as shown in FIG. 12, layer were formed by changing the gas flow rate ratio of $GeH_4$/He gas to $SiH_4$/He gas along with the lapse of time for forming the layer under the condition of Table 5C following the changing curve of the gas flow rate ratio as shown in FIG. 17 and other conditions were the same as in Example 30. Thereby, an electrophotographic image forming member was produced.

Using the resulting image forming member, image formation was effected on a transfer paper according to the same procedure and under the same conditions as in Example 30, whereby a very clear image quality was obtained.

EXAMPLE 35

By the preparation device as shown in FIG. 12, layer were formed by changing the gas flow rate ratio of $GeH_4$/He gas to $SiH_4$/He gas along with the lapse of time for forming the layer under the condition of Table 6C following the changing curve of the gas flow rate ratio as shown in FIG. 18 and other conditions were the same as in Example 30. Thereby, an electrophotographic image forming member was produced.

Using the resulting image forming member, image formation was effected on a transfer paper according to the same procedure and under the same conditions as in Example 30, whereby a very clear image quality was obtained.

EXAMPLE 36

By the preparation device as shown in FIG. 12, layers were formed by changing the gas flow rate ratio of $GeH_4/He$ gas to $SiH_4/He$ gas along with the lapse of time for forming the layer under the condition of Table 7C following the changing curve of the gas flow rate ratio as shown in FIG. 19 and other conditions were the same as in Example 30. Thereby, an electrophotographic image forming member was produced.

Using the resulting image forming member, image formation was effected on a transfer paper according to the same procedure and under the same conditions as in Eample 30, whereby a very clear image quality was obtained.

EXAMPLE 37

Layers were formed under the same conditions as Example 30 except that $Si_2H_6/He$ gas was used in place of $SiH_4/He$ gas used in Example 30 and that the operating condition was changed to that as shown in Table 8C. Thereby, an electrophotographic image forming member was produced.

Using the resulting image forming member, image formation was effected on the transfer paper according to the same procedure and under the same conditions as in Example 30, whereby a very clear image quality was obtained.

EXAMPLE 38

Layers were formed under the same conditions as Example 30 except that $SiF_4/He$ gas was used in place of $SiH_4/He$ gas used in Example 30 and that the operating condition was changed to that as shown in Table 9C. Thereby, an electrophotographic image forming member was produced.

Using the resulting image forming member, image formation was effected on the transfer paper according to the same procedure and under the same conditions as in Example 30, whereby a very clear image quality was obtained.

EXAMPLE 39

Layers were formed under the same conditions as Example 30 except that $(SiH_4/He_4+SiF_4/He)$ gas was used in place of $SiH_4/He$ gas used in Example 30 and that the operating condition was changed to that as shown in Table 10C. Thereby, an electrophotographic image forming member was produced.

Using the resulting image forming member, image formation was effected on the transfer paper according to the same procedure and under the same conditions as in Example 30, whereby a very clear image quality was obtained.

EXAMPLE 40

Electrophotographic image forming members were produced under the same conditions as in Examples 30-39 except that preparation condition of the third layer in Examples 30-39 were changed as shown in Table 11C.

Using the resulting image forming members, image formation was effected on the transfer paper according to the same procedure and under the same conditions as in Example 30, whereby the results as shown in Table 11AC were obtained.

EXAMPLE 41

Electrophotographic image forming members were produced under the same conditions as in Examples 30-39 except that preparation condition of the third layer in Examples 30-39 were changed as shown in Table 12C.

Using the resulting image forming members, image formation was effected on the transfer paper according to the same procedure and under the same conditions as in Example 30, whereby the results as shown in Table 12AC were obtained.

EXAMPLE 42

By the preparation device as shown in FIG. 12, layers were formed by changing the gas flow rate ratio of $GeH_4/He$ gas to $SiH_4/He$ gas and that of $NH_3$ gas to $SiH_4/He$ gas along with the lapse of time for forming the layer under the condition of Table 13C following the changing curve of the gas flow rate ratio as shown in FIG. 20 and other conditions were the same as in Example 30. Thereby, an electrophotographic image forming member was produced.

Using the resulting image forming member, image formation was effected on a transfer paper according to the same procedure and under the same conditions as in Example 30, whereby a very clear image quality was obtained.

EXAMPLE 43

By the preparation device as shown in FIG. 12, layer were formed by changing the gas flow rate ratio of $GeH_4/He$ gas to $SiH_4/He$ gas and that of $NH_3$ gas to $SiH_4/He$ gas along with the lapse of time for forming the layer under the condition of Table 14C following the changing curve of the gas flow rate ratio as shown in FIG. 21 and other conditions were the same as in Example 30. Thereby, an electrophotographic image forming member was produced.

Using the resulting image forming member, image formation was effected on a transfer paper according to the same procedure and under the same conditions as in Example 30, whereby a very clear image quality was obtained.

EXAMPLE 44

Toner images were formed under the same conditions for a toner image formation as in Example 30 except that electrostatic images were formed by using Ga As type semiconductor laser (10 mW) of 810 nm in place of a tungsten lamp used in Examples 30–39. The electrophotographic image forming members produced under the same conditions as in Examples 30–39 were evaluated as to quality of the transferred toner images. The images were clear images of high quality excellent in resolution with good gradation reproducibility.

EXAMPLE 45

Electrophotographic image forming members (Sample Nos. 12-401C–12-408C, 12-701C– 12-708C, 12-801C–12-808C; 72 samples) were produced under the same conditions and according to the same procedure as in Example 30 except that the conditions for formation of layer (II) were changed to those as shown in Table 15C.

The resulting electrophotographic image forming members were set individually in a reproduction device and then evaluated for the overall image quality and durability for repetition of copying under the same conditions as in the Examples.

Whereby the results as shown in Table 16C were obtained.

EXAMPLE 46

Each of image forming members was produced according to the same procedure as in Example 30 except that, upon formation of layer (II), the target area ratio of silicon wafer to graphite was changed, and the content ratio of silicon atom to carbon atom in the layer (II) was changed. The resulting image forming members were evaluated for the image quality after about 50,000 repetitions of image formation, development and cleaning as described in Example 30. Whereby the results as shown in Table 17C were obtained.

EXAMPLE 47

Each of image forming members was produced according to the same procedure as in Example 30 except that, upon formation of layer (II), the flow rate ratio of $SiH_4$ gas to $C_2H_4$ gas was changed and the content ratio of silicon atom to carbon atom in the layer (II) was changed. The resulting image forming members were evaluated for the image quality after about 50,000 repetitions of process up to a transfer as described in Example 30. Whereby the results as shown in Table 18C were obtained.

EXAMPLE 48

Each of image forming members was produced according to the same procedure as in Example 30 except that, upon formation of layer (II), the flow rate ratio of $SiH_4$ gas: $SiF_4$ gas: $C_2H_4$ gas was changed and the content ratio of silicon atom to carbon atom in the layer (II) was changed. The resulting image forming members were evaluated for the image quality after about 50,000 repetitions of image formation, development and cleaning as described in Example 30. Whereby the results as shown in Table 19C were obtained.

EXAMPLE 49

Each of image forming members was produced according to the same procedure as in Example 30 except that the layer thickness of layer (II) was changed. Image formation, development and cleaning as described in Example 30 were repeated. Whereby the results as shown in Table 20C were obtained.

EXAMPLE 50

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table 1D following the changing curve of the gas flow rate ratio as shown in FIG. 13, and thereby, an electrophotographic image forming member was produced.

The resulting image forming member was set in an experimental device for charging and exposure, and corona charging was effected at $\ominus 5.0KV$ for 0.3 second, followed immediately by irradiation of a light image from a tungsten lamp source at a dose of 2 lux·sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus 5.0KV$, there was obtained a clear image of high density excellent in resolution with good gradation reproducibility.

EXAMPLE 51

By the preparation device as shown in FIG. 12, layers were formed by changing the gas flow rate ratio of $GeH_4$/He gas to $SiH_4$/He gas along with the lapse of time for forming the layer under the condition of Table 2D following the changing curve of the gas flow rate ratio as shown in FIG. 14 and other conditions were the same as in Example 50. Thereby, an electrophotographic image forming member was produced.

Using the resulting image forming member, image formation was effected on a transfer paper according to the same procedure and under the same conditions as in Example 50, whereby a very clear image quality was obtained.

EXAMPLE 52

By the preparation device as shown in FIG. 12, layers were formed by changing the gas flow rate ratio of $GeH_4$/He gas to $SiH_4$/He gas along with the lapse of time for forming the layer under the condition of Table 3D following the changing curve of the gas flow rate ratio as shown in FIG. 15 and other conditions were the same as in Example 50. Thereby, an electrophotographic image forming member was produced.

Using the resulting image forming member, image formation was effected on a transfer paper according to the same procedure and under the same conditions as in Example 50, whereby a very clear image quality was obtained.

EXAMPLE 53

By the preparation device as shown in FIG. 12, layers were formed by changing the gas flow rate ratio of GeH$_4$/He gas to SiH$_4$/He gas along with the lapse of time for forming the layer under the condition of Table 4D following the changing curve of the gas flow rate ratio as shown in FIG. 16 and other conditions were the same as in Example 50. Thereby, an electrophotographic image forming member was produced.

Using the resulting image forming member, image formation was effected on a transfer paper according to the same procedure and under the same conditions as in Example 50, whereby a very clear image quality was obtained.

EXAMPLE 54

By the preparation device as shown in FIG. 12, layers were formed by changing the gas flow rate ratio of GeH$_4$/He gas to SiH$_4$/He gas along with the lapse of time for forming the layer under the condition of Table 5D following the changing curve of the gas flow rate ratio as shown in FIG. 17 and other conditions were the same as in Example 50. Thereby, an electrophotographic image forming member was produced.

Using the resulting image forming member, image formation was effected on a transfer paper according to the same procedure and under the same conditions as in Example 50, whereby a very clear image quality was obtained.

EXAMPLE 55

By the preparation device as shown in FIG. 12, layers were formed by changing the gas flow rate ratio of GeH$_4$/He gas to SiH$_4$/He gas along with the lapse of time for forming the layer under the condition of Table 7D following the changing curve of the gas flow rate ratio as shown in FIG. 18 and other conditions were the same as in Example 50. Thereby, an electrophotographic image forming member was produced.

Using the resulting image forming member, image formation was effected on a transfer paper according to the same procedure and under the same conditions as in Example 50, whereby a very clear image quality was obtained.

EXAMPLE 56

By the preparation device as shown in FIG. 12, layers were formed by changing the gas flow rate ratio of GeH$_4$/He gas to SiH$_4$/He gas along with the lapse of time for forming the layer under the condition of Table 7D following the changing curve of the gas flow rate ratio as shown in FIG. 19 and other conditions were the same as in Example 50. Thereby, an electrophotographic image forming member was produced.

Using the resulting image forming member, image formation was effected on a transfer paper according to the same procedure and under the same conditions as in Example 50, whereby a very clear image quality was obtained.

EXAMPLE 57

Layers were formed under the same conditions as Example 50 except that Si$_2$H$_6$/He gas was used in place of SiH$_4$/He gas used in Example 50 and that the operating condition was changed to that as shown in Table 8D. Thereby, an electrophotographic image forming member was produced.

Using the resulting image forming member, image formation was effected on the transfer paper according to the same procedure and under the same conditions as in Example 50, whereby a very clear image quality was obtained.

EXAMPLE 58

Layers were formed under the same conditions as Example 50 except that SiF$_4$/He gas was used in place of SiH$_4$/He gas used in Example 50 and that the operating condition was changed to that as shown in Table 9D. thereby, an electrophotographic image forming member was produced.

Using the resulting image forming member, image formation was effected on the transfer paper according to the same procedure and under the same conditions as in Example 50, whereby a very clear image quality was obtained.

EXAMPLE 59

Layers were formed under the same conditions as Example 50 except that (SiH$_4$/He+SiF$_4$/He) gas was used in place of SiH$_4$/He gas used in Example 50 and that the operating condition was changed to that as shown in Table 10D. Thereby, an electrophotographic image forming member was produced.

Using the resulting image forming member, image formation was effected on the transfer paper according to the same procedure and under the same conditions as in Example 50, whereby a very clear image quality was obtained.

EXAMPLE 60

By the preparation device as shown in FIG. 12, layers were formed on an Al cylinder substrate by changing the gas flow rate ratio of GeHe/He gas to SiH$_4$/He gas along with the lapse of time for forming the layer under the condition of Table 11D following the changing curve of the gas flow rate ratio as shown in FIG. 13, and thereby, an electrophotographic image forming member was produced.

The resulting image forming member was set in an experimental device for charging and exposure, and corona charging was effected at ⊖5.0KV for 0.3 second, followed immediately by irradiation of a light image from a tungsten lamp source at a close of 2 lux-sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖5.0KV, there was obtained a clear image of high density excellent in resolution with good gradation reproducibility.

EXAMPLE 61

Electrophotographic image forming members were produced under the same conditions as in Example 60 except that the flow rate ratio of $B_2H_6$ to $(SiH_4+GeH_4)$ upon formation of the first layer in Example 60 and the flow rate ratio of $B_2H_6$ to $SiH_4$ upon formation of the second layer in Example 60 were changed as shown in Table 12D.

Using the resulting image forming members, image formation was effected on the transfer paper according to the same procedure and under the same conditions as in Example 60, whereby the results as shown in Table 12D were obtained.

EXAMPLE 62

Electrophotographic image forming members (Sample Nos. 1301D–1310D, 1401D–1410D) were produced under the same conditions as in Examples except that preparation conditions of second layer in Examples 50–59 were changed as shown in Tables 13D and 14D.

Using the resulting image forming members, image formation was effected on the transfer paper according to the same procedure and under the same conditions as in Example 50, whereby the results as shown in Tables 13AD and 14AD were obtained.

EXAMPLE 63

Toner images were formed under the same conditions for a toner image formation as in Example 50 except that electrostatic images were formed by using GaAs type semiconductor laser (10mW) of 810nm in place of a tungsten lamp used in Example 50. The electrophotographic image forming members produced under the same conditions as in Example 50 were evaluated as to quality of the transferred toner images. The images were clear images of high quality excellent in resolution with good gradation reproducibility.

EXAMPLE 64

Electrophotographic image forming members (Sample Nos. 12-101D-12-108D, 12-701D-12-708D, 12-1101D-12 -1108D; 24 samples) were produced under the same conditions and according to the same procedure as in Examples 50, 56 and 60 except that the conditions for formation of layer (II) were changed to those as shown in Table 15D.

The resulting electrophotographic image forming members were set individually in a reproduction device and then evaluated for the overall image quality and durability for repetition of copying under the same conditions as in the Examples.

Whereby the results as shown in Table 16D were obtained.

EXAMPLE 65

Each of image forming members was produced according to the same procedure as in Example 50 except that, upon formation of layer (II), the target area ratio of silicon wafer to graphite was changed, and the content ratio of silicon atom to carbon atom in the layer (II) was changed. The resulting image forming members were evaluated for the image quality after about 50,000 repetitions of image formation, development and cleaning as described in Example 50. Whereby the results as shown in Table 17D were obtained.

EXAMPLE 66

Each of image forming members was produced according to the same procedure as in Example 50 except that, upon formation of layer (II), the flow rate ratio of $SiH_4$ gas to $C_2H_4$ gas was changed and the content ratio of silicon atom to carbon atom in the layer (II) was changed. The resulting image forming members were evaluated for the image quality after about 50,000 repetitions of process up to a transfer as described in Example 50. Whereby the results as shown in Table 18D were obtained.

EXAMPLE 67

Each of image forming members was produced according to the same procedure as in Example 50 except that, upon formation of layer (II), the flow rate ratio of $SiH_4$ gas: $SiF_4$ gas: $C_2H_4$ gas was changed and the content ratio of silicon atom to carbon atom in the layer (II) was changed. The resulting image forming members were evaluated for the image quality after about 50,000 repetitions of image formation, development and cleaning as described in Example 50. Whereby the results as shown in Table 19D were obtained.

EXAMPLE 68

Each of image forming members was produced according to the same procedure as in Example 50 except that the layer thickness of layer (II) was changed. Image formation, development and cleaning as described in Example 50 were repeated. Whereby the results as shown in Table 20D were obtained.

EXAMPLE 69

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table 1E following the changing curve of the gas flow rate ratio as shown in FIG. 13, and thereby, an electrophotographic image forming member was produced.

The resulting image forming member was set in an experimental device for charging and exposure, and corona charging was effected at ⊖5.0KV for 0.3 second, followed immediately by irradiation of a light image from a tungsten lamp source at a dose of 2 lux·sec through a transmissive type test chart.

Immediately thereafter, by cascading on the image forming member surface with ⊕ charged developer (containing toner and carrier), a good toner image was obtained on the image forming member surface. When the toner image on the image forming member was transferred to a transfer paper by corona charging at ⊖5.0KV, there was obtained a clear image of high density excellent in resolution with good gradation reproducibility.

EXAMPLE 70

By the preparation device as shown in FIG. 12, layers were formed by changing the gas flow rate ratio of $GeH_4$/He gas to $SiH_4$/He gas along with the lapse of time for forming the layer under the condition of Table 2E following the changing curve of the gas flow rate ratio as shown in FIG. 14 and other conditions were the same as in Example 69. Thereby, an electrophotographic image forming member was produced.

Using the resulting image forming member, image formation was effected on a transfer paper according to the same procedure and under the same conditions as in Example 69, whereby a very clear image quality was obtained.

EXAMPLE 71

By the preparation device as shown in FIG. 12 layers were formed by changing the gas flow rate ratio of GeH$_4$/He gas to SiH$_4$/He gas along with the lapse of time for forming the layer under the condition of Table 3E following the changing curve of the gas flow rate ratio as shown in FIG. 15 and other conditions were the same as in Example 69. Thereby, an electrophotographic image forming member was produced.

Using the resulting image forming member, image formation was effected on a transfer paper according to the same procedure and under the same conditions as in Example 69, whereby a very clear image quality was obtained.

EXAMPLE 72

By the preparation device as shown in FIG. 12, layers were formed by changing the gas flow rate ratio of GeH$_4$/He gas to SiH$_4$/He gas along with the lapse of time for forming the layer under the condition of Table 4E following the changing curve of the gas flow rate ratio as shown in FIG. 16 and other conditions were the same as in Example 69. Thereby, an electrophotographic image forming member was produced.

Using the resulting image forming member, image formation was effected on a transfer paper according to the same procedure and under the same conditions as in Example 69, whereby a very clear image quality was obtained.

EXAMPLE 73

By the preparation device as shown in FIG. 12, layers were formed by changing the gas flow rate ratio of GeH$_4$/He gas to SiH$_4$/He gas along with the lapse of time for forming the layer under the condition of Table 5E following the changing curve of the gas flow rate ratio as shown in FIG. 17 and other conditions were the same as in Example 69. Thereby, an electrophotographic image forming member was produced.

Using the resulting image forming member, image formation was effected on a transfer paper according to the same procedure and under the same conditions as in Example 69, whereby a very clear image quality was obtained.

EXAMPLE 74

By the preparation device as shown in FIG. 12, layers were formed by changing the gas flow rate ratio of GeH$_4$/He gas to SiH$_4$/He gas along with the lapse of time for forming the layer under the condition of Table 6E following the changing curve of the gas flow rate ratio as shown in FIG. 18 and other conditions were the same as in Example 69. Thereby, an electrophotographic image forming member was produced.

Using the resulting image forming member, image formation was effected on a transfer paper according to the same procedure and under the same conditions as in Example 69, whereby a very clear image quality was obtained.

EXAMPLE 75

By the preparation device as shown in FIG. 12, layers were formed by changing the gas flow rate ratio of GeH$_4$/He gas to SiH$_4$/He gas along with the lapse of time for forming the layer under the condition of Table 7E following the changing curve of the gas flow rate ratio as shown in FIG. 19 and other conditions were the same as in Example 69. Thereby, an electrophotographic image forming member was produced.

Using the resulting image forming member, image formation was effected on a transfer paper according to the same procedure and under the same conditions as in example 69, whereby a very clear image quality was obtained.

EXAMPLE 76

Layers were formed under the same conditions as Example 69 except that Si$_2$H$_6$/He gas was used in place of SiH$_4$/He gas used in Example 69 and that the operating condition was changed to that as shown in Table 8E. Thereby, an electrophotographic image forming member was produced Using the resulting image forming member, image formation was effected on the transfer paper according to the same procedure and under the same conditions as in Example 69, whereby a very clear image quality was obtained.

EXAMPLE 77

Layers were formed under the same conditions as Example 69 except that SiF$_4$/He gas was used in place of SiH$_4$/He gas used in Example 69 and that the operating condition was changed to that as shown in Table 9E. Thereby, an electrophotographic image forming member was produced.

Using the resulting image forming member, image formation was effected on the transfer paper according to the same procedure and under the same conditions as in Example 69, whereby a very clear image quality was obtained.

EXAMPLE 78

Layers were formed under the same conditions as Example 69 except that (SiH$_4$/He+SiF$_4$/He) gas was used in place of SiH$_4$/He gas used in Example 69 and that the operating condition was changed to that as shown in Table 10E. Thereby, an electrophotographic image forming member was produced.

Using the resulting image forming member, image formation was effected on the transfer paper according to the same procedure and under the same conditions as in Example 69, whereby a very clear image quality was obtained.

EXAMPLE 79

Electrophotographic image forming members were produced under the same conditions as in Examples 69-78 except that preparation condition of the third layer in Examples 69-78 were changed as shown in Table 11E.

Using the resulting image forming members, image formation was effected on the transfer paper according to the same procedure and under the same conditions as in Example 69, whereby the results as shown in Table 11AE were obtained.

EXAMPLE 80

Electrophotographic image forming members were produced under the same conditions as in Examples 69-78 except that preparation condition of the third layer in Examples 69-78 were changed as shown in Table 12E.

Using the resulting image forming members, image formation was effected on the transfer paper according to the same procedure and under the same conditions as in Example 69, whereby the results as shown in Table 12AE were obtained.

EXAMPLE 81

By the preparation device as shown in FIG. 12, layers were formed by changing the gas flow rate ratio of $GeH_4$/He gas to $SiH_4$/He gas and that of $NH_3$ gas to $SiH_4$/He gas along with the lapse of time for forming the layer under the condition of Table 13E following the changing curve of the gas flow rate ratio as shown in FIG. 20 and other conditions were the same as in Example 69. Thereby, an electrophotographic image forming member was produced.

Using the resulting image forming member, image formation was effected on a transfer paper according to the same procedure and under the same conditions as in Example 69, whereby a very clear image quality was obtained.

EXAMPLE 82

By the preparation device as shown in FIG. 12, layers were formed by changing the gas flow rate ratio of $GeH_4$/He gas to $SiH_4$/He gas and that of $NH_3$ gas to $SiH_4$/He gas along with the lapse of time for forming the layer under the condition of Table 14E following the changing curve of the gas flow rate ratio as shown in FIG. 21 and other conditions were the same as in Example 69. Thereby, an electrophotographic image forming member was produced.

Using the resulting image forming member, image formation was effected on a trasnfer paper according to the same procedure and under the same conditions as in Example 69, whereby a very clear image quality was obtained.

EXAMPLE 83

Toner images were formed under the same conditions for a toner image formation as in Example 69 except that electrostatic images were formed by using GaAs type semiconductor laser (10mW) of 810nm in place of a tungsten lamp used in Examples 69-78. The electrophotographic image forming members produced under the same conditions as in Examples 69-78 were evaluated as to quality of the transferred toner images. The images were clear images of high quality excellent in resolution with good gradation reproducibility.

EXAMPLE 84

Electrophotographic image forming members (Sample Nos. 11-401E-11-408E, 11-701E-11-708E, 11-801E-12-808E; 24 samples) were produced under the same conditions and according to the same procedure as in Examples 72, 74 and 75 except that the conditions for formation of layer (II) were changed to those as shown in Table 15E.

The resulting electrophotographic image forming members were set individually in a reproduction device and then evaluated for the overall image quality and durability for repetition of copying under the same conditions as in the Examples.

Whereby the results as shown in Table 16E were obtained.

EXAMPLE 85

Each of image forming members was produced according to the same procedure as in Example 69 except that, upon formation of layer (II), the mixing ratio of Ar to No, and the target area ratio of silicon wafer to $SiO_2$ were changed, and the content ratio of silicon atom to oxygen atom in the layer (II) was changed. The resulting image forming members were evaluated for the image quality after about 50,000 repetitions of image formation, development and cleaning as described in Example 69. hereby the results as shown in Table 17E were obtained.

EXAMPLE 86

Each of image forming members was produced according to the same procedure as in Example 69 except that, upon formation of layer (II), the flow rate ratio of $SiH_4$ gas to No gas was changed and the content ratio of silicon atom to oxygen atom in the layer (II) was changed. The resulting image forming members were evaluated for the image quality after about 50,000 repetitions of process up to a transfer as described in Example 69. Whereby the results as shown in Table 18E were obtained.

EXAMPLE 87

Each of image forming members was produced according to the same procedure as in Example 69 except that, upon formation of layer (II), the flow rate ratio of $SiH_4$ gas: $SiF_4$ gas: No gas was changed and the content ratio of silicon atom to oxygen atom in the layer (II) was changed. The resulting image forming members were evaluated for the image quality after about 50,000 repetitions of image formation, development and cleaning as described in Example 69. Whereby the results as shown in Table 19E were obtained.

EXAMPLE 88

Each of image forming members was produced according to the same procedure as in Example 69 except that the layer thickness of layer (II) was changed.

Image formation, development and cleaning as described in Example 69 were repeated. Whereby the results as shown in Table 20E were obtained.

EXAMPLE 89

By the preparation device as shown in FIG. 12, layers were formed on an Al cylinder substrate by changing the gas flow rate ratio of $GeH_4$/He gas to $SiH_4$/He gas along with the lapse of time for forming the layer under the condition of Table 1F following the changing curve of the gas flow rate ratio as shown in FIG. 13, and thereby, an electrophotographic image forming member was produced.

The resulting image forming member was set in an experimental device for charging and exposure, and corona charging was effected $\ominus 5.0KV$ for 0.3 second, followed immediately by irradiation of a light image from a tungsten lamp source at a dose of 2 lux·sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus 5.0KV$, there was obtained a clear image of high density excellent in resolution with good gradation reproducibility.

EXAMPLE 90

By the preparation device as shown in FIG. 12, layers were formed by changing the gas flow rate ratio of $GeH_4$/He gas to $SiH_4$/He gas along with the lapse of time for forming the layer under the condition of Table 2F following the changing curve of the gas flow rate ratio as shown in FIG. 14 and other conditions were the same as in Example 89. Thereby, an electrophotographic image forming member was produced.

Using the resulting image forming member, image formation was effected on a transfer paper according to the same procedure and under the same conditions as in Example 89, whereby a very clear image quality was obtained.

EXAMPLE 91

By the preparation device as shown in FIG. 12, layers were formed by changing the gas flow rate ratio of $GeH_4$/He gas to $SiH_4$/He gas along with the lapse of time for forming the layer under the condition of Table 3F following the changing curve of the gas flow rate ratio as shown in FIG. 15 and other conditions were the same as in Example 89. Thereby, an electrophotographic image forming member was produced.

Using the resulting image forming member, image formation was effected on a transfer paper according to the same procedure and under the same conditions as in Example 89, whereby a very clear image quality was obtained.

EXAMPLE 92

By the preparation device as shown in FIG. 12, layers were formed by changing the gas flow rate ratio of $GeH_4$/He gas to $SiH_4$/He gas along with the lapse of time for forming the layer under the condition of Table 4F following the changing curve of the gas flow rate ratio as shown in FIG. 16 and other conditions were the same as in Example 89. Thereby, an electrophotographic image forming member was produced.

Using the resulting image forming member, image formation was effected on a transfer paper according to the same procedure and under the same conditions as in Example 89, whereby a very clear image quality was obtained.

EXAMPLE 93

By the preparation device as shown in FIG. 12, layers were formed by changing the gas flow rate ratio of $GeH_4$/He gas to $SiH_4$/He gas along with the lapse of time for forming the layer under the condition of Table 5F following the changing curve of the gas flow rate ratio as shown in FIG. 17 and other conditions were the same as in Example 89. Thereby, an electrophotographic image forming member was produced.

Using the resulting image forming member, image formation was effected on a transfer paper according to the same procedure and under the same conditions as in Example 89, whereby a very clear image quality was obtained.

EXAMPLE 94

By the preparation device as shown in FIG. 12, layers were formed by changing the gas flow rate ratio of $GeH_4$/He gas to $SiH_4$/He gas along with the lapse of time for forming the layer under the condition of Table 6F following the changing curve of the gas flow rate ratio as shown in FIG. 18 and other conditions were the same as in Example 89. Thereby, an electrophotographic image forming member was produced.

Using the resulting image forming member, image formation was effected on a transfer paper according to the same procedure and under the same conditions as in Example 89, whereby a very clear image quality was obtained.

EXAMPLE 95

By the preparation device as shown in FIG. 12, layers were formed by changing the gas flow rate ratio of $GeH_4$/He gas to $SiH_4$/He gas along with the lapse of time for forming the layer under the condition of Table 7F following the changing curve of the gas flow rate ratio as shown in FIG. 19 and other conditions were the same as in Example 89. Thereby, an electrophotographic image forming member was produced.

Using the resulting image forming member, image formation was effected on a transfer paper according to the same procedure and under the same conditions as in Example 89, whereby a very clear image quality was obtained.

EXAMPLE 96

Layers were formed under the same conditions as Example 89 except that $Si_2H_6$He gas was used in place of $SiH_4$/He gas used in Example 89 and that the operating condition was changed to that as shown in Table 8F.

Thereby, an electrophotographic image forming member was produced.

Using the resulting image forming member, image formation was effected on the transfer paper according to the same procedure and under the same conditions as in Example 89, whereby a very clear image quality was obtained.

EXAMPLE 97

Layers were formed under the same conditions as Example 89 except that $SiF_4/He$ gas was used in place of $SiH_4/He$ gas used in Example 89 and that the operating condition was changed to that as shown in Table 9F. Thereby, an electrophotographic image forming member was produced.

Using the resulting image forming member, image formation was effected on the transfer paper according to the same procedure and under the same conditions as in Example 89, whereby a very clear image quality was obtained.

EXAMPLE 98

Layers were formed under the same conditions as Example 89 except that $(SiH_4/He + SiF_4/He)$ gas was used in place of $SiH_4/He$ gas used in Example 89 and that the operating condition was changed to that as shown in Table 10F. Thereby, an electrophotographic image forming member was produced.

Using the resulting image forming member, image formation was effected on the transfer paper according to the same procedure and under the same conditions as in Example 89, whereby a very clear image quality was obtained.

EXAMPLE 99

By the preparation device as shown in FIG. 12, layers were formed on an Al cylinder substrate by changing the gas flow rate ratio of $GeH_4/He$ gas to $SiH_4/He$ gas along with the lapse of time for forming the layer under the condition of Table 11F following the changing curve of the gas flow rate ratio as shown in FIG. 13, and thereby, an electrophotographic image forming member was produced.

The resulting image forming member was set in an experimental device for charging and exposure, and corona charging was effected at $\ominus 5.0KV$ for 0.3 second, followed immediately by irradiation of a light image from a tungsten lamp source at a dose of 2 lux·sec through a transmissive type test chart.

Immediately thereafter, by cascading on the image forming member surface with $\oplus$ charged developer (containing toner and carrier), a good toner image was obtained on the image forming member surface. When the toner image on the image forming member was transferred to a transfer paper by corona charging at $\ominus 5.0KV$, there was obtained a clear image of high density excellent in resolution with good gradation reproducibility.

EXAMPLE 100

Electrophotographic image forming members were produced under the same conditions as in Example 99 except that the flow rate ratio of $B_2H_6$ to $(SiH_4+GeH_4)$ upon formation of the first layer in Example 99 and the flow rate ratio of $B_2H_6$ to $SiH_4$ upon formation of the second layer in Example 99 were changed as shown in Table 12F.

Using the resulting image forming members, image formation was effected on the transfer paper according to the same procedure and under the same conditions as in Example 99, whereby the results as shown in Table 12F were obtained.

EXAMPLE 101

Electrophotographic image forming members (Sample Nos. 1301F–1310F, 1401F–1410F) were produced under the same conditions as in Examples except that preparation conditions of second layer in Examples 89–98 were changed as shown in Tables 13F and 14F.

Using the resulting image forming members, image formation was effected on the transfer paper according to the same procedure and under the same conditions as in Example 89, whereby the results as shown in Tables 13AF and 14AF were obtained.

EXAMPLE 102

Toner images were formed under the same conditions for a toner image formation as in Example 89 except that electrostatic images were formed by using GaAs type semiconductor laser (10mW) of 810nm in place of a tungsten lamp used in Example 89. The electrophotographic image forming members produced under the same conditions as in Example 89 were evaluated as to quality of the transferred toner images. The images were clear images of high quality excellent in resolution with good gradation reproducibility.

EXAMPLE 103

Electrohptographic image forming members (Sample Nos. 11-401F–11-408F, 11-701F–11-708F, 11-801F–11-808F; 24 samples) were produced under the same conditions and according to the same procedure as in Examples 92, 95 and 96 except that the conditions for formation of layer (II) were changed to those as shown in Table 15F.

The resulting electrophotographic image forming members were set individually in a reproduction device and then evaluated for the overall image quality and durability for repetition of copying under the same conditions as in the Examples.

Whereby the results as shown in Table 16F were obtained.

EXAMPLE 104

Each of image forming members was produced according to the same procedure as in Example 89 except that, upon formation of layer (II), the mixing ratio of Ar to No, and the target area ratio of silicon wafer to graphite were changed, and the content ratio of silicon atom to oxygen atom in the layer (II) was changed. The resulting image forming members were evaluated for the image quality after about 50,000 repetitions of image formation, development and cleaning as described in Example 89. Whereby the results as shown in Table 17F were obtained.

EXAMPLE 105

Each of image forming members was produced according to the same procedure as in Example 89 except that, upon formation of layer (II), the flow rate ratio of $SiH_4$ gas to No gas was changed and the content ratio of silicon atom to oxygen atom in the layer (II) was changed. The resulting image forming members were evaluated for the image quality after about 50,000 repetitions of process up to a transfer as described in Example 89. Whereby the results as shown in Table 18F were obtained.

EXAMPLE 106

Each of image forming members was produced according to the same procedure as in Example 89 except that, upon formation of layer (II), the flow rate ratio of $SiH_4$ gas: $SiF_4$ gas: No gas was changed and the content ratio of silicon atom to oxygen atom in the layer (II) was changed. The resulting image forming members were evaluated for the image quality after about 50,000 repetitions of image formation, development and cleaning as described in Example 89. Whereby the results as shown in Table 19F were obtained.

EXAMPLE 107

Each of image forming members was produced according to the same procedure as in Example 89 except that the layer thickness of layer (II) was changed. Image formation, development and cleaning as described in Example 89 were repeated. Whereby the results as shown in Table 20F were obtained.

The common layer forming conditions in Examples the present invention are as follows:

Substrate Temperature:
  Layer containing germanium atom (Ge) . . . about 200° C.
  Layer not containing germanium atom (Ge) . . . about 250° C.
Discharge frequency : 13.56 MHz.
Inner pressure in reaction chamber upon reaction : 0.3 Torr.

TABLE 1A

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First Layer | $SiH_4$/He = 0.05  $GeH_4$/He = 0.05  $NH_3$ | $SiH_4$ + $GeH_4$ = 50 | $GeH_4/SiH_4$ = 4/10~3/100  $NH_3/(GeH_4 + SiH_4)$ = 3/100 | 0.18 | 5 | 2 |
| Second Layer | $SiH_4$/He = 0.05  $GeH_4$/He = 0.05 | $SiH_4$ + $GeH_4$ = 50 | $GeH_4/SiH_4$ = 3/100~0 | 0.18 | 5 | 8 |
| Third Layer | $SiH_4$/He = 0.5 | $SiH_4$ = 200 | | 0.18 | 15 | 10 |

TABLE 2A

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First Layer | $SiH_4$/He = 0.05  $GeH_4$/He = 0.05  $NH_3$ | $SiH_4$ + $GeH_4$ = 50 | $GeH_4/SiH_4$ = 1/10~4/100  $NH_3/(GeH_4 + SiH_4)$ = 3/100 | 0.18 | 5 | 5 |
| Second Layer | $SiH_4$/He = 0.05  $GeH_4$/He = 0.05 | $SiH_4$ + $GeH_4$ = 50 | $GeH_4/SiH_4$ = 4/100~0 | 0.18 | 5 | 3 |
| Third Layer | $SiH_4$/He = 0.5 | $SiH_4$ = 200 | | 0.18 | 15 | 10 |

TABLE 3A

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First Layer | $SiH_4$/He = 0.05  $GeH_4$/He = 0.05  $NH_3$ | $SiH_4$ + $GeH_4$ = 50 | $GeH_4/SiH_4$ = 4/10~4/100  $NH_3/(GeH_4 + SiH_4)$ = 3/100 | 0.18 | 5 | 1 |
| Second Layer | $SiH_4$/He = 0.05  $GeH_4$/He = 0.05 | $SiH_4$ + $GeH_4$ = 50 | $GeH_4/SiH_4$ = 4/100 | 0.18 | 5 | 1 |
| Third Layer | $SiH_4$/He = 0.5 | $SiH_4$ = 200 | | 0.18 | 15 | 15 |

TABLE 4A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>NH$_3$ | SiH$_4$ + GeH$_4$ = 50 | GeH$_4$/SiH$_4$ = 15/100~1/100<br>NH$_3$/(GeH$_4$ + SiH$_4$) = 3/100 | 0.18 | 5 | 0.4 |
| Second Layer | SiH$_4$/He = 0.05<br>GeH$_4$/He = 0.05 | SiH$_4$ + GeH$_4$ = 50 | GeH$_4$/SiH$_4$ = 1/100~0 | 0.18 | 5 | 0.6 |
| Third Layer | SiH$_4$/He = 0.5 | SiH$_4$ = 200 | | 0.18 | 15 | 20 |

TABLE 5A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>NH$_3$ | SiH$_4$ + GeH$_4$ = 50 | GeH$_4$/SiH$_4$ = 1/1~14/100<br>NH$_3$/(GeH$_4$ + SiH$_4$) = 3/100 | 0.18 | 5 | 0.2 |
| Second Layer | SiH$_4$/He = 0.05<br>GeH$_4$/He = 0.05 | SiH$_4$ + GeH$_4$ = 50 | GeH$_4$/SiH$_4$ = 14/100~0 | 0.18 | 5 | 0.8 |
| Third Layer | SiH$_4$/He = 0.5 | SiH$_4$ = 200 | | 0.18 | 10 | 20 |

TABLE 6A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>NH$_3$ | SiH$_4$ + GeH$_4$ = 50 | GeH$_4$/SiH$_4$ = 2/10~45/1000<br>NH$_3$/(GeH$_4$ + SiH$_4$) = 1/100 | 0.18 | 5 | 2 |
| Second Layer | SiH$_4$/He = 0.05<br>GeH$_4$/He = 0.05 | SiH$_4$ + GeH$_4$ = 50 | GeH$_4$/SiH$_4$ = 45/1000~0 | 0.18 | 5 | 6 |
| Third Layer | SiH$_4$/He = 0.5 | SiH$_4$ = 200 | | 0.18 | 15 | 10 |

TABLE 7A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>NH$_3$ | SiH$_4$ + GeH$_4$ = 50 | GeH$_4$/SiH$_4$ = 1/10~45/1000<br>NH$_3$/(GeH$_4$ + SiH$_4$) = 1/100 | 0.18 | 5 | 4 |
| Second Layer | SiH$_4$/He = 0.05<br>GeH$_4$/He = 0.05 | SiH$_4$ + GeH$_4$ = 50 | GeH$_4$/SiH$_4$ = 45/1000~0 | 0.18 | 5 | 4 |
| Third Layer | SiH$_4$/He = 0.5 | SiH$_4$ = 200 | | 0.18 | 10 | 10 |

TABLE 8A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | Si$_2$H$_6$/He = 0.05<br>GeH$_4$/He = 0.05<br>NH$_3$ | Si$_2$H$_6$ + GeH$_4$ = 50 | GeH$_4$/Si$_2$H$_6$ = 4/10~3/100<br>NH$_3$/(GeH$_4$ + Si$_2$H$_6$) = 3/100 | 0.18 | 5 | 2 |
| Second Layer | Si$_2$H$_6$/He = 0.05<br>GeH$_4$/He = 0.05 | Si$_2$H$_6$ + GeH$_4$ = 50 | GeH$_4$/Si$_2$H$_6$ = 3/100~0 | 0.18 | 5 | 8 |
| Third Layer | Si$_2$H$_6$/He = 0.5 | Si$_2$H$_6$ = 200 | | 0.18 | 15 | 10 |

TABLE 9A

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First Layer | SiF$_4$/He = 0.05<br>GeH$_4$/He = 0.05<br>NH$_3$ | SiF$_4$ + GeH$_4$ = 50 | GeH$_4$/SiF$_4$ = 4/10~3/100<br>NH$_3$/(GeH$_4$ + SiF$_4$) = 3/100 | 0.18 | 5 | 2 |
| Second Layer | SiF$_4$/He = 0.05<br>GeH$_4$/He = 0.05 | SiF$_4$ + GeH$_4$ = 50 | GeH$_4$/SiF$_4$ = 3/100~0 | 0.18 | 5 | 8 |
| Third Layer | SiF$_4$/He = 0.5 | SiF$_4$ = 200 | | 0.18 | 15 | 10 |

TABLE 10A

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First Layer | SiH$_4$/He = 0.05<br>SiF$_4$/He = 0.05<br>GeH$_4$/He = 0.05<br>NH$_3$ | SiH$_4$ + SiF$_4$ + GeH$_4$ = 50 | GeH$_4$/(SiH$_4$ + SiF$_4$) = 4/10~3/100<br>NH$_3$/(GeH$_4$ + SiH$_4$ + SiF$_4$) = 3/100 | 0.18 | 5 | 2 |
| Second Layer | SiH$_4$/He = 0.05<br>SiF$_4$/He = 0.05<br>GeH$_4$/He = 0.05 | SiH$_4$ + SiF$_4$ + GeH$_4$ = 50 | GeH$_4$/(SiH$_4$ + SiF$_4$) = 3/100~0 | 0.18 | 5 | 8 |
| Third Layer | SiH$_4$/He = 0.5<br>SiF$_4$/He = 0.5 | SiH$_4$ + SiF$_4$ = 200 | | 0.18 | 15 | 10 |

TABLE 11A

| Layer constitution | Gases employed | Flow rate (SCCM) | Flow rate ratio | Discharging power (W/cm$^2$) | Layer formation rate (Å/sec) |
|---|---|---|---|---|---|
| Third layer | SiH$_4$/He = 0.5<br>B$_2$H$_6$/He = 10$^{-3}$ | SiH$_4$ = 200 | B$_2$H$_6$/SiH$_4$ = 4 × 10$^{-4}$ | 0.18 | 15 |

TABLE 11AA

| Sample No. | 1101A | 1102A | 1103A | 1104A | 1105A | 1106A | 1107A | 1108A | 1109A | 1110A |
|---|---|---|---|---|---|---|---|---|---|---|
| First layer | The same as that in Example 1 | The same as that in Example 2 | The same as that in Example 3 | The same as that in Example 4 | The same as that in Example 5 | The same as that in Example 6 | The same as that in Example 7 | The same as that in Example 8 | The same as that in Example 9 | The same as that in Example 10 |
| Thickness of third layer (μ) | 10 | 10 | 15 | 20 | 20 | 10 | 10 | 10 | 10 | 10 |
| Evaluation | ○ | ○ | ⊙ | ⊙ | ⊙ | ⊙ | ○ | ○ | ○ | ○ |

⊙: Excellent
○: Good

TABLE 12A

| Layer constitution | Gases employed | Flow rate (SCCM) | Flow rate ratio | Discharging power (W/cm$^2$) | Layer formation rate (Å/sec) |
|---|---|---|---|---|---|
| Third layer | SiH$_4$/He = 0.5<br>PH$_3$/He = 10$^{-3}$ | SiH$_4$ = 200 | PH$_3$/SiH$_4$ = 2 × 10$^{-5}$ | 0.18 | 15 |

TABLE 12AA

| Sample No. | 1201A | 1202A | 1203A | 1204A | 1205A | 1206A | 1207A | 1208A | 1209A | 1210A |
|---|---|---|---|---|---|---|---|---|---|---|
| First layer | The same as that in Example 1 | The same as that in Example 2 | The same as that in Example 3 | The same as that in Example 4 | The same as that in Example 5 | The same as that in Example 6 | The same as that in Example 7 | The same as that in Example 8 | The same as that in Example 9 | The same as that in Example 10 |
| Thickness of third layer (μ) | 10 | 10 | 15 | 20 | 20 | 10 | 10 | 10 | 10 | 10 |
| Evaluation | ○ | ○ | ⊙ | ⊙ | ⊙ | ⊙ | ○ | ○ | ○ | ○ |

TABLE 12AA-continued

| Sample No. | 1201A | 1202A | 1203A | 1204A | 1205A | 1206A | 1207A | 1208A | 1209A | 1210A |
|---|---|---|---|---|---|---|---|---|---|---|
| tion | | | | | | | | | | |

⊙: Excellent
○ : Good

TABLE 13A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>NH$_3$ | SiH$_4$ + GeH$_4$ = 50 | GeH$_4$/SiH$_4$ = 3/10~0<br>NH$_3$/SiH$_4$ = 4/10~2/100 | 0.18 | 5 | 2 |
| Second Layer | SiH$_4$/He = 0.5<br>NH$_3$ | SiH$_4$ = 200 | NH$_3$/SiH$_4$ = 2/100~0 | 0.18 | 15 | 2 |
| Third Layer | SiH$_4$/He = 0.5 | SiH$_4$ = 200 | | 0.18 | 15 | 15 |

TABLE 14A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>NH$_3$ | SiH$_4$ + GeH$_4$ = 50 | GeH$_4$/SiH$_4$ = 3/10~0<br>NH$_3$/SiH$_4$ = 1/10~5/100 | 0.18 | 5 | 1 |
| Second Layer | SiH$_4$/He = 0.5<br>NH$_3$ | SiH$_4$ = 200 | NH$_3$/SiH$_4$ = 5/100~0 | 0.18 | 15 | 1 |
| Third Layer | SiH$_4$/He = 0.5 | SiH$_4$ = 200 | | 0.18 | 15 | 18 |

TABLE 1B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~0<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| Second Layer | SiH$_4$/He = 0.5 | SiH$_4$ = 200 | | 0.18 | 15 | 19 |

TABLE 2B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~0<br>B$_2$H$_6$/(GeH$_4$ + SiH$_4$) = 1 × 10$^{-3}$<br>NH$_3$/(GeH$_4$ + SiH$_4$) = 1/100 | 0.18 | 5 | 2 |
| Second Layer | SiH$_4$/He = 0.5 | SiH$_4$ = 200 | | 0.18 | 15 | 15 |

TABLE 3B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~2/1000<br>B$_2$H$_6$/(GeH$_4$ + SiH$_4$) = 1 × 10$^{-3}$<br>NH$_3$/(GeH$_4$ + SiH$_4$) = 1/100 | 0.18 | 5 | 2 |
| Second Layer | SiH$_4$/He = 0.5 | SiH$_4$ = 200 | | 0.18 | 15 | 15 |

TABLE 4B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 15/100~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| Second Layer | SiH$_4$/He = 0.5 | SiH$_4$ = 200 | | 0.18 | 15 | 15 |

TABLE 5B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/1~5/100<br>B$_2$H$_6$/(GeH$_4$ + SiH$_4$) = 3 × 10$^{-3}$<br>NH$_4$/(GeH$_4$ + SiH$_4$) = 2/100 | 0.18 | 5 | 1 |
| Second Layer | SiH$_4$/He = 0.5 | SiH$_4$ = 200 | | 0.18 | 15 | 15 |

TABLE 6B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 2/10~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| Second Layer | SiH$_4$/He = 0.5 | SiH$_4$ = 200 | | 0.18 | 15 | .15 |

TABLE 7B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| Second Layer | SiH$_4$/He = 0.5 | SiH$_4$ = 200 | | 0.18 | 15 | 15 |

TABLE 8B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | Si$_2$H$_6$/He = 0.05<br>GeH$_4$/He = 0.05<br>B$_2$H$_6$/He = 10$^{-3}$<br>NH$_3$ | Si$_2$H$_6$ + GeH$_4$ = 50 | GeH$_4$/Si$_2$H$_6$ = 4/10~0<br>B$_2$H$_6$/(GeH$_4$ + Si$_2$H$_6$) = 3 × 10$^{-3}$<br>NH$_3$/(GeH$_4$ + Si$_2$H$_6$) = 2/100 | 0.18 | 5 | 1 |
| Second Layer | Si$_2$H$_6$/He = 0.5 | Si$_2$H$_6$ = 200 | | 0.18 | 15 | 19 |

TABLE 9B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiF$_4$/He = 0.05<br>GeH$_4$/He = 0.05<br>B$_2$H$_6$/He = 10$^{-3}$<br>NH$_3$ | SiF$_4$ + GeH$_4$ = 50 | GeH$_4$/SiF$_4$ = 4/10~0<br>B$_2$H$_6$/(GeH$_4$ + SiF$_4$) = 3 × 10$^{-3}$<br>NH$_3$/(GeH$_4$ + SiF$_4$) = 1/100 | 0.18 | 5 | 1 |

TABLE 9B-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Second Layer | SiH$_4$/He = 0.05 | SiF$_4$ = 200 | | 0.18 | 5 | 19 |

TABLE 10B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>SiF$_4$/He = 0.05<br>GeH$_4$/He = 0.05<br>B$_2$H$_6$/He = 10$^{-3}$<br>NH$_3$ | SiH$_4$ + SiF$_4$ + GeH$_4$ + 50 | GeH$_4$/(SiH$_4$ + SiF$_4$) = 4/10~0<br>B$_2$H$_6$(GeH$_4$ + SiF$_4$ + SiH$_4$) = 3 × 10$^{-3}$<br>NH$_3$/(GeH$_4$ + SiH$_4$ + SiF$_4$) = 1/100 | 0.18 | 5 | 1 |
| Second Layer | SiH$_4$/He = 0.5<br>SiF$_4$/He = 0.5 | SiH$_4$ + SiF$_4$ = 200 | | 0.18 | 5 | 19 |

TABLE 11B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| First Layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~0<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| Second Layer | SiH$_4$/He = 0.5<br>B$_2$H$_6$/He = 10$^{-3}$ | SiH$_4$ = 200 | B$_2$H$_6$/SiH$_4$ = 3 × 10$^{-3}$ | 0.18 | 15 | 19 |

TABLE 12B

| Sample No. | 1201B | 1202B | 1203B | 1204B | 1205B | 1206B | 1207B | 1208B |
|---|---|---|---|---|---|---|---|---|
| B$_2$H$_6$/SiH$_4$ Flow rate ratio | 1 × 10$^{-2}$ | 5 × 10$^{-3}$ | 2 × 10$^{-3}$ | 1 × 10$^{-3}$ | 8 × 10$^{-4}$ | 5 × 10$^{-4}$ | 3 × 10$^{-4}$ | 1 × 10$^{-4}$ |
| B content (atomic ppm) | 1 × 10$^4$ | 6 × 10$^3$ | 2.5 × 10$^3$ | 1 × 10$^3$ | 800 | 500 | 300 | 100 |
| Evaluation | ○ | ⊙ | ⊙ | ⊙ | ⊙ | ○ | ○ | ○ |

⊙: Excellent
○: Good

TABLE 13B

| Layer constitution | Gases employed | Flow rate (SCCM) | Flow rate ratio | Discharging power (W/cm$^2$) | Layer formation rate (Å/sec) |
|---|---|---|---|---|---|
| Second layer | SiH$_4$/He = 0.5<br>B$_2$H$_6$/He = 10$^{-3}$ | SiH$_4$ = 200 | B$_2$H$_6$/SiH$_4$ = 8 × 10$^{-5}$ | 0.18 | 15 |

TABLE 13AB

| Sample No. | 1301B | 1302B | 1303B | 1304B | 1305B | 1306B | 1307B | 1308B | 1309B | 1310B |
|---|---|---|---|---|---|---|---|---|---|---|
| First layer | The same as that in Example 16 | The same as that in Example 17 | The same as that in Example 18 | The same as that in Example 19 | The same as that in Example 20 | The same as that in Example 21 | The same as that in Example 22 | The same as that in Example 23 | The same as that in Example 24 | The same as that in Example 25 |
| Thickness of second layer ($\mu$) | 10 | 10 | 20 | 15 | 20 | 15 | 10 | 10 | 10 | 10 |
| Evaluation | ○ | ○ | ⊙ | ⊙ | ⊙ | ⊙ | ○ | ○ | ○ | ○ |

⊙: Excellent
○: Good

TABLE 14B

| Layer constitution | Gases employed | Flow rate (SCCM) | Flow rate ratio | Discharging power (W/cm$^2$) | Layer formation rate (Å/sec) |
|---|---|---|---|---|---|
| Second layer | $SiH_4/He = 0.5$<br>$PH_3/He = 10^{-3}$ | $SiH_4 = 200$ | $PH_3/SiH_4 = 1 \times 10^{-5}$ | 0.18 | 15 |

TABLE 14AB

| Sample No. | 1401B | 1402B | 1403B | 1404B | 1405B | 1406B | 1407B | 1408B | 1409B | 1410B |
|---|---|---|---|---|---|---|---|---|---|---|
| First layer | The same as that in Example 16 | The same as that in Example 17 | The same as that in Example 18 | The same as that in Example 19 | The same as that in Example 20 | The same as that in Example 21 | The same as that in Example 22 | The same as that in Example 23 | The same as that in Example 24 | The same as that in Example 25 |
| Thickness of second layer (μ) | 10 | 10 | 20 | 15 | 20 | 15 | 10 | 10 | 10 | 10 |
| Evaluation | ○ | ○ | ◉ | ◉ | ◉ | ◉ | ○ | ○ | ○ | ○ |

◉: Excellent
○: Good

TABLE 1C

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer region | $SiH_4/He = 0.05$<br>$GeH_4/He = 0.05$<br>$NH_3$ | $SiH_4 + GeH_4 = 50$ | $GeH_4/SiH_4 = 4/10 \sim 3/100$<br>$NH_3/(GeH_4 + SiH_4) = 3/100$ | 0.18 | 5 | 2 |
| | Second layer region | $SiH_4/He = 0.05$<br>$GeH_4/He = 0.05$ | $SiH_4 + GeH_4 = 50$ | $GeH_4/SiH_4 = 3/100 \sim 0$ | 0.18 | 5 | 8 |
| | Third layer region | $SiH_4/He = 0.5$ | $SiH_4 = 200$ | | 0.18 | 15 | 10 |
| Layer (II) | | $SiH_4/He = 0.5$<br>$C_2H_4$ | $SiH_4 = 100$ | $SiH_4/C_2H_4 = 3/7$ | 0.18 | 10 | 0.5 |

TABLE 2C

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | $SiH_4/He = 0.05$<br>$GeH_4/He = 0.05$<br>$NH_3$ | $SiH_4 + GeH_4 = 50$ | $GeH_4/SiH_4 = 1/10 \sim 4/100$<br>$NH_3/(GeH_4 + SiH_4) = 3/100$ | 0.18 | 5 | 5 |
| | Second layer | $SiH_4/He = 0.05$<br>$GeH_4/He = 0.05$ | $SiH_4 + GeH_4 = 50$ | $GeH_4/SiH_4 = 4/100 \sim 0$ | 0.18 | 5 | 3 |
| | Third layer | $SiH_4/He = 0.5$ | $SiH_4 = 200$ | | 0.18 | 15 | 10 |

TABLE 3C

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | $SiH_4/He = 0.05$<br>$GeH_4/He = 0.05$<br>$NH_3$ | $SiH_4 + GeH_4 = 50$ | $GeH_4/SiH_4 = 4/10 \sim 4/100$<br>$NH_3/(GeH_4 + SiH_4) = 3/100$ | 0.18 | 5 | 1 |
| | Second layer | $SiH_4/He = 0.05$<br>$GeH_4/He = 0.05$ | $SiH_4 + GeH_4 = 50$ | $GeH_4/SiH_4 = 4/100$ | 0.18 | 5 | 1 |
| | Third layer | $SiH_4/He = 0.5$ | $SiH_4 = 200$ | | 0.18 | 15 | 15 |

TABLE 4C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$NH_3$ | $SiH_4 + GeH_4 = 50$ | $GeH_4/SiH_4 = 15/100 \sim 1/100$<br>$NH_3/(GeH_4 + SiH_4) = 3/100$ | 0.18 | 5 | 0.4 |
| | Second layer | $SiH_4/He = 0.05$<br>$GeH_4/He = 0.05$ | $SiH_4 + GeH_4 = 50$ | $GeH_4/SiH_4 = 1/100 \sim 0$ | 0.18 | 5 | 0.6 |
| | Third layer | $SiH_4/He = 0.5$ | $SiH_4 = 200$ | | 0.18 | 15 | 20 |

TABLE 5C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$NH_3$ | $SiH_4 + GeH_4 = 50$ | $GeH_4/SiH_4 = 1/1 \sim 14/100$<br>$NH_3/(GeH_4 + SiH_4) = 3/100$ | 0.18 | 5 | 0.2 |
| | Second layer | $SiH_4/He = 0.05$<br>$GeH_4/He = 0.05$ | $SiH_4 + GeH_4 = 50$ | $GeH_4/SiH_4 = 14/100 \sim 0$ | 0.18 | 5 | 0.8 |
| | Third layer | $SiH_4/He = 0.5$ | $SiH_4 = 200$ | | 0.18 | 15 | 20 |

TABLE 6C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$NH_3$ | $SiH_4 + GeH_4 = 50$ | $GeH_4/SiH_4 = 2/10 \sim 45/1000$<br>$NH_3/(GeH_4 + SiH_4) = 1/100$ | 0.18 | 5 | 2 |
| | Second layer | $SiH_4/He = 0.05$<br>$GeH_4/He = 0.05$ | $SiH_4 + GeH_4 = 50$ | $GeH_4/SiH_4 = 45/1000 \sim 0$ | 0.18 | 5 | 6 |
| | Third layer | $SiH_4/He = 0.5$ | $SiH_4 = 200$ | | 0.18 | 15 | 10 |

TABLE 7C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$NH_3$ | $SiH_4 + GeH_4 = 50$ | $GeH_4/SiH_4 = 1/10 \sim 45/1000$<br>$NH_3/(GeH_4 + SiH_4) = 1/100$ | 0.18 | 5 | 4 |
| | Second layer | $SiH_4/He = 0.05$<br>$GeH_4/He = 0.05$ | $SiH_4 + GeH_4 = 50$ | $GeH_4/SiH_4 = 45/1000 \sim 0$ | 0.18 | 5 | 4 |
| | Third layer | $SiH_4/He = 0.5$ | $SiH_4 = 200$ | | 0.18 | 15 | 10 |

TABLE 8C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $Si_2H_6/He = 0.05$<br>$GeH_4/He = 0.05$<br>$NH_3$ | $Si_2H_6 + GeH_4 = 50$ | $GeH_4/Si_2H_6 = 4/10 \sim 3/100$<br>$NH_3/(GeH_4 + Si_2H_6) = 3/100$ | 0.18 | 5 | 2 |
| | Second layer | $Si_2H_6/He = 0.05$<br>$GeH_4/He = 0.05$ | $Si_2H_6 + GeH_4 = 50$ | $GeH_4/Si_2H_6 = 3/100 \sim 0$ | 0.18 | 5 | 8 |
| | Third layer | $Si_2H_6/He = 0.5$ | $Si_2H_6 = 200$ | | 0.18 | 15 | 10 |

TABLE 9C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05<br>GeH$_4$/He = 0.05<br>NH$_3$ | SiF$_4$ + GeH$_4$ = 50 | GeH$_4$/SiF$_4$ = 4/10~3/100<br>NH$_3$/(GeH$_4$ + SiF$_4$) = 3/100 | 0.18 | 5 | 2 |
| | Second layer | SiF$_4$/He = 0.05<br>GeH$_4$/He = 0.05 | SiF$_4$ + GeH$_4$ = 50 | GeH$_4$/SiF$_4$ = 3/100~0 | 0.18 | 5 | 8 |
| | Third layer | SiF$_4$/He = 0.5 | SiF$_4$ = 200 | | 0.18 | 15 | 10 |

TABLE 10C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>SiF$_4$/He = 0.05<br>GeH$_4$/He = 0.05<br>NH$_3$ | SiH$_4$ + SiF$_4$ + GeH$_4$ = 50 | GeH$_4$/(SiH$_4$ + SiF$_4$) = 4/10~3/100<br>NH$_3$/(GeH$_4$ + SiH$_4$ + SiF$_4$) = 3/100 | 0.18 | 5 | 2 |
| | Second layer | SiH$_4$/He = 0.05<br>SiF$_4$/He = 0.05<br>GeH$_4$/He = 0.05 | SiH$_4$ + SiF$_4$ + GeH$_4$ = 50 | GeH$_4$/(SiH$_4$ + SiF$_4$) = 3/100~0 | 0.18 | 5 | 8 |
| | Third layer | SiH$_4$/He = 0.5<br>SiF$_4$/He = 0.5 | SiH$_4$ + SiF$_4$ = 200 | | 0.18 | 15 | 10 |

TABLE 11C

| Layer constitution | | Gases employed | Flow rate (SCCM) | Flow rate ratio | Discharging power (W/cm$^2$) | Layer formation rate (Å/sec) |
|---|---|---|---|---|---|---|
| Layer (I) | Third layer | SiH$_4$/He = 0.5<br>B$_2$H$_6$/He = 10$^{-3}$ | SiH$_4$ = 200 | B$_2$H$_6$/SiH$_4$ = 4 × 10$^{-4}$ | 0.18 | 15 |

TABLE 11AC

| Sample No | 1101C | 1102C | 1103C | 1104C | 1105C | 1106C | 1107C | 1108C | 1109C | 1110C |
|---|---|---|---|---|---|---|---|---|---|---|
| First layer | The same as that in Example 29 | The same as that in Example 30 | The same as that in Example 31 | The same as that in Example 32 | The same as that in Example 33 | The same as that in Example 34 | The same as that in Example 35 | The same as that in Example 36 | The same as that in Example 37 | The same as that in Example 38 |
| Thickness of third layer ($\mu$) | 10 | 10 | 15 | 20 | 20 | 10 | 10 | 10 | 10 | 10 |
| Evaluation | ○ | ○ | ⊙ | ⊙ | ⊙ | ⊙ | ○ | ○ | ○ | ○ |

⊙: Excellent
○: Good

TABLE 12C

| Layer constitution | | Gases employed | Flow rate (SCCM) | Flow rate ratio | Discharging power (W/cm$^2$) | Layer formation rate (Å/sec) |
|---|---|---|---|---|---|---|
| Layer (I) | Third layer | SiH$_4$/He = 0.5<br>PH$_3$/He = 10$^{-3}$ | SiH$_4$ = 200 | PH$_3$/SiH$_4$ = 2 × 10$^{-5}$ | 0.18 | 15 |

TABLE 12AC

| Sample No. | 1201C | 1202C | 1203C | 1204C | 1205C | 1206C | 1207C | 1208C | 1209C | 1210C |
|---|---|---|---|---|---|---|---|---|---|---|
| First layer | The same as that in Example 29 | The same as that in Example 30 | The same as that in Example 31 | The same as that in Example 32 | The same as that in Example 33 | The same as that in Example 34 | The same as that in Example 35 | The same as that in Example 36 | The same as that in Example 37 | The same as that in Example 38 |
| Thickness of third layer ($\mu$) | 10 | 10 | 15 | 20 | 20 | 10 | 10 | 10 | 10 | 10 |
| Evaluation | ○ | ○ | ○ | ⊙ | ⊙ | ⊙ | ⊙ | ○ | ○ | ○ |

TABLE 12AC-continued

| Sample No. | 1201C | 1202C | 1203C | 1204C | 1205C | 1206C | 1207C | 1208C | 1209C | 1210C |
|---|---|---|---|---|---|---|---|---|---|---|
| tion | | | | | | | | | | |

⊙: Excellent
○ : Good

TABLE 13C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 3/10~0<br>NH$_3$/SiH$_4$ = 4/10~2/100 | 0.18 | 5 | 2 |
| | Second layer | SiH$_4$/He = 0.5<br>NH$_3$ | SiH$_4$ = 200 | NH$_3$/SiH$_4$ = 2/100~0 | 0.18 | 15 | 2 |
| | Third layer | SiH$_4$/He = 0.5 | SiH$_4$ = 200 | | 0.18 | 15 | 15 |

TABLE 14C

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 3/10~0<br>NH$_3$/SiH$_4$ = 1/10~5/100 | 0.18 | 5 | 1 |
| | Second layer | SiH$_4$/He = 0.5<br>NH$_3$ | SiH$_4$ = 200 | NH$_3$/SiH$_4$ = 5/100~0 | 0.18 | 15 | 1 |
| | Third layer | SiH$_4$/He = 0.5 | SiH$_4$ = 200 | | 0.18 | 15 | 18 |

TABLE 15C

| conditions | Gases employed | Flow rate (SCCM) | Flow rate ratio or area ratio | Discharging power (W/cm$^2$) | Layer thickness ($\mu$) |
|---|---|---|---|---|---|
| 12-1C | Ar | 200 | Si wafer:graphite = 1.5:8.5 | 0.3 | 0.5 |
| 12-2C | Ar | 200 | Si wafer:gratphige = 0.5:9.5 | 0.3 | 0.3 |
| 12-3C | Ar | 200 | Si wafer:graphite = 6:4 | 0.3 | 1.0 |
| 12-4C | SiH$_4$/He = 1<br>C$_2$H$_4$ | SiH$_4$ = 15 | SiH$_4$:C$_2$H$_4$ = 0.4:9.6 | 0.18 | 0.3 |
| 12-5C | SiH$_4$/He = 0.5<br>C$_2$H$_4$ | SiH$_4$ = 100 | SiH$_4$:C$_2$H$_4$ = 5:5 | 0.18 | 1.5 |
| 12-6C | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 12-7C | SiH$_4$/He = 0.5<br>SiH$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 12-8C | SiH$_4$/He = 0.5<br>SiF$_4$<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE 16C

| Layer (II) forming conditions | Sample No./Evaluation | | |
|---|---|---|---|
| 12-1C | 12-401C ○ ○ | 12-701C ○ ○ | 12-801C ○ ○ |
| 12-2C | 12-402C ○ ○ | 12-702C ○ ○ | 12-802C ○ ○ |
| 12-3C | 12-403C ○ ○ | 12-703C ○ ○ | 12-803C ○ ○ |
| 12-4C | 12-404C ⊙ ⊙ | 12-704C ⊙ ⊙ | 12-804C ⊙ ⊙ |
| 12-5C | 12-405C ⊙ ⊙ | 12-705C ⊙ ⊙ | 12-805C ⊙ ⊙ |
| 12-6C | 12-406C ⊙ ⊙ | 12-706C ⊙ ⊙ | 12-806C ⊙ ⊙ |
| 12-7C | 12-407C ○ ○ | 12-707C ○ ○ | 12-807C ○ ○ |
| 12-8C | 12-408C ○ ○ | 12-708C ○ ○ | 12-808C ○ ○ |

Sample No.
Overall image quality evaluation   Durability evaluation
Evaluation standard:
⊙ . . . Excellent
○ . . . Good

TABLE 17C

| Sample No. | 1301C | 1302C | 1303C | 1304C | 1305C | 1306C | 1307C |
|---|---|---|---|---|---|---|---|
| Si:C (Target area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | ∆ | ○ | ⊚ | ⊚ | ○ | ∆ | x |

⊚: Very good
○: Good
∆: Sufficiently practically usable
x: Image defect formed

TABLE 18C

| Sample No. | 1401C | 1402C | 1403C | 1404C | 1405C | 1406C | 1407C | 1408C |
|---|---|---|---|---|---|---|---|---|
| SiH$_4$:C$_2$H$_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | ∆ | ○ | ⊚ | ⊚ | ⊚ | ○ | ∆ | x |

⊚: Very good
○: Good
∆: Sufficiently practically usable
x: Image defect formed

TABLE 19C

| Sample No. | 1501C | 1502C | 1503C | 1504C | 1505C | 1506C | 1507C | 1508C |
|---|---|---|---|---|---|---|---|---|
| SiH$_4$:SiF$_4$:C$_2$H$_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | ∆ | ○ | ⊚ | ⊚ | ⊚ | ○ | ∆ | x |

⊚: Very good
○: Good
∆: Practically satisfactory
x: Image defect formed

TABLE 20C

| Sample No. | Thickness of layer (II) (µ) | Results |
|---|---|---|
| 1601C | 0.001 | Image defect liable to occur |
| 1602C | 0.02 | No image defect during 20,000 repetitions |
| 1603C | 0.05 | Stable for 50,000 repetitions |
| 1604C | 1 | Stable for 200,000 repetitions |

TABLE 1D

| Layer constitution | | Gases employed | Flow rate (SCCM) | Flow rate ratio | Discharging power (W/cm$^2$) | Layer formation rate (Å/sec) | Layer thickness (µ) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~0<br>B$_2$H$_6$/(GeH$_4$ + SiH$_4$) = 3/10$^{-3}$<br>NH$_3$/(GeH$_4$ + SiH$_4$) = 3/100 | 0.18 | 5 | 1 |
| | Second layer | SiH$_4$/He = 0.5 | SiH$_4$ = 200 | | 0.18 | 15 | 19 |
| Layer (II) | | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE 2D

| Layer constitution | | Gases employed | Flow rate (SCCM) | Flow rate ratio | Discharging power (W/cm$^2$) | Flow formation rate (Å/sec) | Flow thickness (µ) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~0<br>B$_2$H$_6$/(GeH$_4$ + SiH$_4$) = 1 × 10$^{-3}$<br>NH$_3$/(GeH$_4$ + SiH$_4$) = | 0.18 | 5 | 2 |

TABLE 2D-continued

| Layer constitution | | Gases employed | Flow rate (SCCM) | Flow rate ratio | Discharging power (W/cm$^2$) | Flow formation rate (Å/sec) | Flow thickness ($\mu$) |
|---|---|---|---|---|---|---|---|
| | | | | 1/100 | | | |
| | Second layer | SiH$_4$/He = 0.5 | SiH$_4$ = 200 | | 0.18 | 15 | 15 |

TABLE 3D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~2/1000<br>B$_2$H$_6$/(GeH$_4$ + SiH$_4$) = 1 × 10$^{-3}$<br>NH$_3$/(GeH$_4$ + SiH$_4$) = 1/100 | 0.18 | 5 | 2 |
| | Second layer | SiH$_4$/He = 0.5 | SiH$_4$ = 200 | | 0.18 | 15 | 15 |

TABLE 4D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 15/100~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| | Second layer | SiH$_4$/He = 0.5 | SiH$_4$ = 200 | | 0.18 | 15 | 15 |

TABLE 5D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/1~5/100<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| | Second layer | SiH$_4$/He = 0.5 | SiH$_4$ = 200 | | 0.18 | 15 | 15 |

TABLE 6D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 2/10~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| | Second layer | SiH$_4$/He = 0.5 | SiH$_4$ = 200 | | 0.18 | 15 | 15 |

TABLE 7D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| | Second layer | SiH$_4$/He = 0.5 | SiH$_4$ = 200 | | 0.18 | 15 | 15 |

TABLE 8D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | Si$_2$H$_6$/He = 0.05<br>GeH$_4$/He = 0.05<br>B$_2$H$_6$/He = 10$^{-3}$<br>NH$_3$ | Si$_2$H$_6$ + GeH$_4$ = 50 | GeH$_4$/Si$_2$H$_6$ = 4/10~0<br>B$_2$H$_6$/(GeH$_4$ + Si$_2$H$_6$) = 3 × 10$^{-3}$<br>NH$_3$/(GeH$_4$ + Si$_2$H$_6$) = 2/100 | 0.18 | 5 | 1 |
| | Second layer | Si$_2$H$_6$/He = 0.5 | Si$_2$H$_6$ = 200 | | 0.18 | 15 | 19 |

TABLE 9D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05<br>GeH$_4$/He = 0.05<br>B$_2$H$_6$/He = 10$^{-3}$<br>NH$_3$ | SiF$_4$ + GeH$_4$ = 50 | GeH$_4$/SiH$_4$ = 4/10~0<br>B$_2$H$_6$/(GeH$_4$ + SiF$_4$) = 3 × 10$^{-3}$<br>NH$_3$/(GeH$_4$ + SiF$_4$) = 1/100 | 0.18 | 5 | 1 |
| | Second layer | SiF$_4$/He = 0.05 | SiF$_4$ = 200 | | 0.18 | 5 | 19 |

TABLE 10D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>SiF$_4$/He = 0.05<br>GeH$_4$/He = 0.05<br>B$_2$H$_6$/He = 10$^{-3}$<br>NH$_3$ | SiH$_4$ + SiF$_4$ + GeH$_4$ = 50 | GeH$_4$/(SiH$_4$ + SiF$_4$) = 4/10~0<br>B$_2$H$_6$/(GeH$_4$ + SiH$_4$ + SiF$_4$) = 3 × 10$^{-3}$<br>NH$_3$/(GeH$_4$ + SiH$_4$ + SiF$_4$) = 1/100 | 0.18 | 5 | 1 |
| | Second layer | SiH$_4$/He = 0.5<br>SiF$_4$/He = 0.5 | SiH$_4$ + SiF$_4$ = 200 | | 0.18 | 5 | 19 |

TABLE 11D

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 4/10~0<br>B$_2$H$_6$/(GeH$_4$ + SiH$_4$) = 3 × 10$^{-3}$<br>NH$_3$/(GeH$_4$ + SiH$_4$) = 3/100 | 0.18 | 5 | 1 |
| | Second layer | SiH$_4$/He = 0.5<br>B$_2$H$_6$/He = 10$^{-3}$ | SiH$_4$ = 200 | B$_2$H$_6$/SiH$_4$ = 3 × 10$^{-3}$ | 0.18 | 15 | 19 |
| Layer (II) | | SiH$_4$/He = 0.5 | SiH$_4$ = 100<br>C$_2$H$_4$ | SiH$_4$/C$_2$H$_4$ = 3/7 | 0.18 | 10 | 0.5 |

TABLE 12D

| Sample No. | 1201D | 1202D | 1203D | 1204D | 1205D | 1206D | 1207D | 1208D |
|---|---|---|---|---|---|---|---|---|
| B$_2$H$_6$/SiH$_4$ + GeH$_4$ or B$_2$H$_6$/SiH$_4$ Flow rate ratio | 1 × 10$^{-2}$ | 5 × 10$^{-3}$ | 2 × 10$^{-3}$ | 1 × 10$^{-3}$ | 8 × 10$^{-4}$ | 5 × 10$^{-4}$ | 3 × 10$^{-4}$ | 1 × 10$^{-4}$ |
| B content (atomic ppm) | 1 × 10$^4$ | 6 × 10$^3$ | 25 × 10$^3$ | 1 × 10$^3$ | 800 | 500 | 300 | 100 |
| Evaluation | ○ | ⊙ | ⊙ | ⊙ | ⊙ | ○ | ○ | ○ |

⊙: Excellent
○ : Good

TABLE 13D

| Layer constitution | | Gases employed | Flow rate (SCCM) | Flow rate ratio | Discharging power (W/cm$^2$) | Layer formation rate (Å/sec) |
|---|---|---|---|---|---|---|
| Layer | Second | SiH$_4$/He = 0.5 | SiH$_4$ = 200 | B$_2$H$_6$/SiH$_4$ = 8 × 10$^{-5}$ | 0.18 | 15 |

TABLE 13D-continued

| Layer constitution | Gases employed | Flow rate (SCCM) | Flow rate ratio | Discharging power (W/cm$^2$) | Layer formation rate (Å/sec) |
|---|---|---|---|---|---|
| (I) layer | $B_2H_6/He = 10^{-3}$ | | | | |

TABLE 13AD

| Sample No. | 1301D | 1302D | 1303D | 1304D | 1305D | 1306D | 1307D | 1308D | 1309D | 1310D |
|---|---|---|---|---|---|---|---|---|---|---|
| First layer | The same as that in Example 49 | The same as that in Example 50 | The same as that in Example 51 | The same as that in Example 52 | The same as that in Example 53 | The same as that in Example 54 | The same as that in Example 55 | The same as that in Example 56 | The same as that in Example 57 | The same as that in Example 58 |
| Thickness of second layer (μ) | 10 | 10 | 20 | 15 | 20 | 15 | 10 | 10 | 10 | 10 |
| Evaluation | ○ | ○ | ⊚ | ⊚ | ⊚ | ⊚ | ○ | ○ | ○ | ○ |

⊚: Excellent
○: Good

TABLE 14D

| Layer constitution | Gases employed | Flow rate (SCCM) | Flow rate ratio | Discharging power (W/cm$^2$) | Layer formation rate (Å/sec) |
|---|---|---|---|---|---|
| Layer (I) Second layer | $SiH_4/He = 0.5$ $PH_3/He = 10^{-3}$ | $SiH_4 = 200$ | $PH_3/SiH_4 = 1 \times 10^{-5}$ | 0.18 | 15 |

TABLE 14AD

| Sample No. | 1401D | 1402D | 1403D | 1404D | 1405D | 1406D | 1407D | 1408D | 1409D | 1410D |
|---|---|---|---|---|---|---|---|---|---|---|
| First layer | The same as that in Example 49 | The same as that in Example 50 | The same as that in Example 51 | The same as that in Example 52 | The same as that in Example 53 | The same as that in Example 54 | The same as that in Example 55 | The same as that in Example 56 | The same as that in Example 57 | The same as that in Example 58 |
| Thickness of second layer (μ) | 10 | 10 | 20 | 15 | 20 | 15 | 10 | 10 | 10 | 10 |
| Evaluation | ○ | ○ | ⊚ | ⊚ | ⊚ | ⊚ | ○ | ○ | ○ | ○ |

⊚: Excellent
○: Good

TABLE 15D

| Conditions | Gases employed | Flow rate (SCCM) | Flow rate ratio or area ratio | Discharging power (W/cm$^2$) | Layer thickness (μ) |
|---|---|---|---|---|---|
| 12-1D | Ar | 200 | Si wafer:graphite = 1.5:8.5 | 0.3 | 0.5 |
| 12-2D | Ar | 200 | Si wafer:graphite = 0.5:9.5 | 0.3 | 0.3 |
| 12-3D | Ar | 200 | Si wafer:graphite = 6:4 | 0.3 | 1.0 |
| 12-4D | $SiH_4/He = 1$ $C_2H_4$ | $SiH_4 = 15$ | $SiH_4:C_2H_4 = 0.4:9.6$ | 0.18 | 0.3 |
| 12-5D | $SiH_4/He = 0.5$ $C_2H_4$ | $SiH_4 = 100$ | $SiH_4:C_2H_4 = 5:5$ | 0.18 | 1.5 |
| 12-6D | $SiH_4/He = 0.5$ $SiF_4/He = 0.5$ $C_2H_4$ | $SiH_4 + SiF_4 = 150$ | $SiH_4:SiF_4:C_2H_4 = 1.5:1.5:7$ | 0.18 | 0.5 |
| 12-7D | $SiH_4/He = 0.5$ $SiF_4/He = 0.5$ $C_2H_4$ | $SiH_4 + SiF_4 = 15$ | $SiH_4:SiF_4:C_2H_4 = 0.3:0.1:9.6$ | 0.18 | 0.3 |
| 12-8D | $SiH_4/He = 0.5$ $SiF_4/He = 0.5$ $C_2H_4$ | $SiH_4 + SiF_4 = 150$ | $SiH_4:SiF_4:C_2H_4 = 3:3:4$ | 0.18 | 1.5 |

TABLE 16D

| Layer (II) forming conditions | Sample No./Evaluation | | | | | |
|---|---|---|---|---|---|---|
| 12-1D | 12-101D ○ | ○ | 12-701D ○ | ○ | 12-1101D ○ | ○ |

TABLE 16D-continued

| Layer (II) forming conditions | Sample No./Evaluation | | | | | |
|---|---|---|---|---|---|---|
| 12-2D | 12-102D ◯ | ◯ | 12-702D ◯ | ◯ | 12-1102D ◯ | ◯ |
| 12-3D | 12-103D ◯ | ◯ | 12-703D ◯ | ◯ | 12-1103D ◯ | ◯ |
| 12-4D | 12-104D ◉ | ◉ | 12-704D ◉ | ◉ | 12-1104D ◉ | ◉ |
| 12-5D | 12-105D ◉ | ◉ | 12-705D ◉ | ◉ | 12-1105D ◉ | ◉ |
| 12-6D | 12-106D ◉ | ◉ | 12-706D ◉ | ◉ | 12-1106D ◉ | ◉ |
| 12-7D | 12-107D ◯ | ◯ | 12-707D ◯ | ◯ | 12-1107D ◯ | ◯ |
| 12-8D | 12-108D ◯ | ◯ | 12-708D ◯ | ◯ | 12-1108D ◯ | ◯ |

Sample No.
Overall image   Durability

TABLE 16D-continued

| Layer (II) forming conditions | Sample No./Evaluation |
|---|---|
| quality evaluation | evaluation |

Evaluation standard:
◉ .. Excellent
◯ ... Good

TABLE 17D

| Sample No. | 1301D | 1302D | 1303D | 1304D | 1305D | 1306D | 1307D |
|---|---|---|---|---|---|---|---|
| Si:C (Target area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | △ | ◯ | ◉ | ◉ | ◯ | △ | x |

◉: Very good
◯ : Good
△: Sufficiently practically usable
x: Image defect formed

TABLE 18D

| Sample No. | 1401D | 1402D | 1403D | 1404D | 1405D | 1406D | 1407D | 1408D |
|---|---|---|---|---|---|---|---|---|
| $SiH_4:C_2H_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ◯ | ◉ | ◉ | ◉ | ◯ | △ | x |

◉: Very good
◯ : Good
△: Sufficiently practically usable
x: Image defect formed

TABLE 19D

| Sample No. | 1501D | 1502D | 1503D | 1504D | 1505D | 1506D | 1507D | 1508D |
|---|---|---|---|---|---|---|---|---|
| $SiH_4:SiF_4:C_2H_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | △ | ◯ | ◉ | ◉ | ◉ | ◯ | △ | x |

◉: Very good
◯ : Good
△: Practically satisfactory
x: Image defect formed

TABLE 20D

| Sample No. | Thickness of layer (II) ($\mu$) | Results |
|---|---|---|
| 1601D | 0.001 | Image defect liable to occur |
| 1602D | 0.02 | No image defect during 20,000 repetitions |
| 1603D | 0.05 | Stable for 50,000 repetitions |
| 1604D | 1 | Stable for 200,000 repetitions |

TABLE 1E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$ $GeH_4/He = 0.05$ $NH_3$ | $SiH_4 + GeH_4 = 50$ | $GeH_4/SiH_4 = 4/10\sim3/100$ $NH_3/(GeH_4 + SiH_4) = 3/100$ | 0.18 | 5 | 2 |
| | Second layer | $SiH_4/He = 0.05$ $GeH_4/He = 0.05$ | $SiH_4 + GeH_4 = 50$ | $GeH_4/SiH_4 = 3/100\sim 0$ | 0.18 | 5 | 8 |
| | Third layer | $SiH_4/He = 0.5$ | $SiH_4 = 200$ | | 0.18 | 15 | 10 |
| Layer (II) | | $SiH_4/He = 0.5$ | $SiH_4 = 100$ | $SiH_4/NO = 1$ | 0.18 | 10 | 0.5 |

TABLE 1E-continued

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| | NO | | | | | |

TABLE 2E

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/10~4/100<br>NH$_3$/(GeH$_4$ + SiH$_4$) = 3/100 | 0.18 | 5 | 5 |
| | Second layer | SiH$_4$/He = 0.05<br>GeH$_4$/He = 0.05 | SiH$_4$ + GeH$_4$ = 50 | GeH$_4$ + SiH$_4$ = 4/100~0 | 0.18 | 5 | 3 |
| | Third layer | SiH$_4$/He = 0.5 | SiH$_4$ = 200 | | 0.18 | 15 | 10 |

TABLE 3E

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 4/10~4/100<br>NH$_3$/(GeH$_4$ + SiH$_4$) = 3/100 | 0.18 | 5 | 1 |
| | Second layer | SiH$_4$/He = 0.05<br>GeH$_4$/He = 0.05 | SiH$_4$ + GeH$_4$ = 50 | GeH$_4$/SiH$_4$ = 4/100 | 0.18 | 5 | 1 |
| | Third layer | SiH$_4$/He = 0.5 | SiH$_4$ = 200 | | 0.18 | 15 | 15 |

TABLE 4E

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 15/100~1/100<br>NH$_3$/(GeH$_4$ + SiH$_4$) = 3/100 | 0.18 | 5 | 0.4 |
| | Second layer | SiH$_4$/He = 0.05<br>GeH$_4$/He = 0.05 | SiH$_4$ + GeH$_4$ = 50 | GeH$_4$/SiH$_4$ = 1/100~0 | 0.18 | 5 | 0.6 |
| | Third layer | SiH$_4$/He = 0.5 | SiH$_4$ = 200 | | 0.18 | 15 | 20 |

TABLE 5E

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 1/10~14/100<br>NH$_3$/(GeH$_4$ + SiH$_4$) = 3/100 | 0.18 | 5 | 0.2 |
| | Second layer | SiH$_4$/He = 0.05<br>GeH$_4$/He = 0.05 | SiH$_4$ + GeH$_4$ = 50 | GeH$_4$/SiH$_4$ = 14/100~0 | 0.18 | 5 | 0.8 |
| | Third layer | SiH$_4$/He = 0.5 | SiH$_4$ = 200 | | 0.18 | 15 | 20 |

TABLE 6E

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05 | SiH$_4$ + GeH$_4$ = 50 | GeH$_4$/SiH$_4$ = 2/10~45/1000 | 0.18 | 5 | 2 |

TABLE 6E-continued

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| | | NH$_3$ | | NH$_3$/(GeH$_4$ + SiH$_4$) = 1/100 | | | |
| | Second layer | SiH$_4$/He = 0.05 GeH$_4$/He = 0.05 | SiH$_4$ + GeH$_4$ = 50 | GeH$_4$/SiH$_4$ = 45/1000~0 | 0.18 | 5 | 6 |
| | Third layer | SiH$_4$/He = 0.5 | SiH$_4$ = 200 | | 0.18 | 15 | 10 |

TABLE 7E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 NH$_3$ | SiH$_4$ + GeH$_4$ = 50 | GeH$_4$/SiH$_4$ = 1/10~45/1000 NH$_3$/(GeH$_4$ + SiH$_4$) = 1/100 | 0.18 | 5 | 4 |
| | Second layer | SiH$_4$/He = 0.05 GeH$_4$/He = 0.05 | SiH$_4$ + GeH$_4$ = 50 | GeH$_4$/SiH$_4$ = 45/1000~0 | 0.18 | 5 | 4 |
| | Third layer | SiH$_4$/He = 0.5 | SiH$_4$ = 200 | | 0.18 | 15 | 10 |

TABLE 8E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | Si$_2$H$_6$/He = 0.05 GeH$_4$/He = 0.05 NH$_3$ | Si$_2$H$_6$ + GeH$_4$ = 50 | GeH$_4$/Si$_2$H$_6$ = 4/10~3/100 NH$_3$/(GeH$_4$ + Si$_2$H$_6$) = 3/100 | 0.18 | 5 | 2 |
| | Second layer | Si$_2$H$_6$/He = 0.05 GeH$_4$/He = 0.05 | Si$_2$H$_6$ + GeH$_4$ = 50 | GeH$_4$/Si$_2$H$_6$ = 3/100~0 | 0.18 | 5 | 8 |
| | Third layer | Si$_2$H$_6$/He = 0.5 | Si$_2$H$_6$ = 200 | | 0.18 | 15 | 10 |

TABLE 9E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05 GeH$_4$/He = 0.05 NH$_3$ | SiF$_4$ + GeH$_4$ = 50 | GeH$_4$/SiF$_4$ = 4/10~3/100 NH$_3$/(GeH$_4$ + SiF$_4$) = 3/100 | 0.18 | 5 | 2 |
| | Second layer | SiF$_4$/He = 0.05 GeH$_4$/He = 0.05 | SiF$_4$ + GeH$_4$ = 50 | GeH$_4$/SiF$_4$ = 3/100~0 | 0.18 | 5 | 8 |
| | Third layer | SiF$_4$/He = 0.5 | SiF$_4$ = 200 | | 0.18 | 15 | 10 |

TABLE 10E

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 SiF$_4$/He = 0.05 GeH$_4$/He = 0.05 NH$_3$ | SiH$_4$ + SiF$_4$ + GeH$_4$ = 50 | GeH$_4$/(SiH$_4$ + SiF$_4$) = 4/10~3/100 NH$_3$/(GeH$_4$ + SiH$_4$ + SiF$_4$) = 3/100 | 0.18 | 5 | 2 |
| | Second layer | SiH$_4$/He = 0.05 SiF$_4$/He = 0.05 GeH$_4$/He = 0.05 | SiH$_4$ + SiF$_4$ + GeH$_4$ = 50 | GeH$_4$/(SiH$_4$ + SiF$_4$) = 3/100~0 | 0.18 | 5 | 8 |
| | Third layer | SiH$_4$/He = 0.5 SiF$_4$/He = 0.5 | SiH$_4$ + SiF$_4$ = 200 | | 0.18 | 15 | 10 |

TABLE 11E

| Layer constitution | Gases employed | Flow rate (SCCM) | Flow rate ratio | Discharging power (W/cm$^2$) | Layer formation rate (Å/sec) |
|---|---|---|---|---|---|
| Layer (I) Third layer | SiH$_4$/He = 0.5<br>B$_2$H$_6$/He = 10$^{-3}$ | SiH$_4$ = 200 | B$_2$H$_6$/SiH$_4$ = 4 × 10$^{-4}$ | 0.18 | 15 |

TABLE 11AE

| Sample No. | 1101E | 1102E | 1103E | 1104E | 1105E | 1106E | 1107E | 1108E | 1109E | 1110E |
|---|---|---|---|---|---|---|---|---|---|---|
| First layer | The same as that in Example 68 | The same as that in Example 69 | The same as that in Example 70 | The same as that in Example 71 | The same as that in Example 72 | The same as that in Example 73 | The same as that in Example 74 | The same as that in Example 75 | The same as that in Example 76 | The same as that in Example 77 |
| Thickness of third layer (μ) | 10 | 10 | 15 | 20 | 20 | 10 | 10 | 10 | 10 | 10 |
| Evaluation | ○ | ○ | ○ | ○ | ○ | ○ | ○ | ○ | ○ | ○ |

◉: Excellent
○: Good

TABLE 12E

| Layer constitution | Gases employed | Flow rate (SCCM) | Flow rate ratio | Discharging power (W/cm$^2$) | Layer formation rate (Å/sec) |
|---|---|---|---|---|---|
| Third layer | SiH$_4$/He = 0.5<br>PH$_3$/He = 10$^{-3}$ | SiH$_4$ = 200 | PH$_3$/SiH$_4$ = 1 × 10$^{-5}$ | 0.18 | 15 |

TABLE 12AE

| Sample No. | 1201E | 1202E | 1203E | 1204E | 1205E | 1206E | 1207E | 1208E | 1209E | 1210E |
|---|---|---|---|---|---|---|---|---|---|---|
| First layer | The same as that in Example 68 | The same as that in Example 69 | The same as that in Example 70 | The same as that in Example 71 | The same as that in Example 72 | The same as that in Example 73 | The same as that in Example 74 | The same as that in Example 75 | The same as that in Example 76 | The same as that in Example 77 |
| Thickness of third layer (μ) | 10 | 10 | 15 | 20 | 20 | 10 | 10 | 10 | 10 | 10 |
| Evaluation | ○ | ○ | ◉ | ◉ | ◉ | ◉ | ○ | ○ | ○ | ○ |

◉: Excellent
○: Good

TABLE 13E

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 3/10~0<br>NH$_3$/SiH$_4$ = 4/10~2/100 | 0.18 | 5 | 2 |
| | Second layer | SiH$_4$/He = 0.05<br>NH$_3$ | SiH$_4$ = 200 | NH$_3$/SiH$_4$ = 2/100~0 | 0.18 | 15 | 2 |
| | Third layer | SiH$_4$/He = 0.5 | SiH$_4$ = 200 | | 0.18 | 15 | 15 |

TABLE 14E

| Layer constitution | | Gases employed | Flow rate (SCCM) | Flow rate ratio | Discharging power (W/cm$^2$) | Layer formation rate (Å/sec) | Layer thickness (μ) |
|---|---|---|---|---|---|---|---|
| Layer (I) | First layer | SiH$_4$/He = 0.05<br>GeH$_4$/He = 0.05<br>NH$_3$ | SiH$_4$ + GeH$_4$ = 50 | GeH$_4$/SiH$_4$ = 3/10~0<br>NH$_3$/SiH$_4$ = 1/10~5/100 | 0.18 | 5 | 1 |
| | Second layer | SiH$_4$/He = 0.05<br>NH$_3$ | SiH$_4$ = 200 | NH$_3$/SiH$_4$ = 5/100~0 | 0.18 | 15 | 1 |
| | Third layer | SiH$_4$/He = 0.5 | SiH$_4$ = 200 | | 0.18 | 15 | 18 |

TABLE 15E

| Conditions | Gases employed | Flow rate (SCCM) | Flow rate ratio or area ratio | Discharging power (W/cm$^2$) | Layer thickness ($\mu$) |
|---|---|---|---|---|---|
| 11-1E | Ar (NO/Ar) | 200 (1/1) | Si wafer: SiO$_2$ = 1.:30 | 0.3 | 0.5 |
| 11-2E | Ar (NO/Ar) | 200 (1/1) | Si wafer: SiO$_2$ = 1:60 | 0.3 | 0.3 |
| 11-3E | Ar (NO/Ar) | 200 (1/1) | Si wafer: SiO$_2$ = 6:4 | 0.3 | 1.0 |
| 11-4E | SiH$_4$/He = 1 NO | SiH$_4$ = 15 | SiH$_4$:NO = 5:1 | 0.18 | 0.3 |
| 11-5E | SiH$_4$/He = 0.5 NO | SiH$_4$ = 100 | SiH$_4$:NO = 1:1 | 0.18 | 1.5 |
| 11-6E | SiH$_4$/He = 0.5 SiF$_4$/He = 0.5 NO | SiH$_4$ + SiF$_4$ = 150 | SiH$_4$:SiF$_4$:NO = 1:1:1 | 0.18 | 0.5 |
| 11-7E | SiH$_4$/He = 0.5 SiF$_4$/He = 0.5 NO | SiH$_4$ + SiF$_4$ = 15 | SiH$_4$:SiF$_4$:NO = 2:1:4 | 0.18 | 0.3 |
| 11-8E | SiH$_4$/He = 0.5 SiF$_4$/He = 0.5 NO | SiH$_4$ + SiF$_4$ = 150 | SiH$_4$:SiF$_4$:NO = 1:1:3 | 0.18 | 1.5 |

TABLE 16E

| Layer (II) forming conditions | Sample No./Evaluation | | |
|---|---|---|---|
| 11-1E | 11-401E ◯ ◯ | 11-701E ◯ ◯ | 11-801E ◯ ◯ |
| 11-2E | 11-402E ◯ ◯ | 11-702E ◯ ◯ | 11-802E ◯ ◯ |
| 11-3D | 11-403E ◯ ◯ | 11-703E ◯ ◯ | 11-803E ◯ |
| 11-4E | 11-404E ⊙ ⊙ | 11-704E ⊙ ⊙ | 11-804E ⊙ ⊙ |
| 11-5E | 11-405E ⊙ ⊙ | 11-705E ⊙ ⊙ | 11-805E ⊙ ⊙ |
| 11-6E | 11-406E ⊙ ⊙ | 11-706E ⊙ ⊙ | 11-806E ⊙ ⊙ |
| 11-7E | 11-407E ◯ ◯ | 11-707E ◯ ◯ | 11-807E ◯ ◯ |
| 11-8E | 11-408E ◯ ◯ | 11-708E ◯ ◯ | 11-808E ◯ ◯ |

Sample No.
Overall image quality evaluation   Durability evaluation
Evaluation standard:
⊙ Excellent
◯ Good

TABLE 17E

| Sample No. | 1201E | 1202E | 1203E | 1204E | 1205E | 1206E | 1207E |
|---|---|---|---|---|---|---|---|
| Si:SiO$_2$ (Target area ratio) (NO/Ar) | 9:1 (0/1) | 6.5:3.5 (1/1) | 4:10 (1/1) | 2:20 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | △ | ⊙ | ⊙ | ◯ | ◯ | △ | x |

⊙: Very good
◯: Good
△: Sufficiently practically usable
x: Image defect formed

TABLE 18E

| Sample No. | 1301E | 1302E | 1303E | 1304E | 1305E | 1306E | 1307E |
|---|---|---|---|---|---|---|---|
| SiH$_4$:NO (Flow rate area) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | △ | ◯ | ⊙ | ⊙ | ◯ | △ | x |

⊙: Very good
◯: Good
△: Practically satisfactory
x: Image defect formed

TABLE 19E

| Sample No. | 1401E | 1402E | 1403E | 1404E | 1405E | 1406E | 1407E |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality | △ | ◯ | ⊙ | ⊙ | ◯ | x | △ |

TABLE 19E-continued

| Sample No. | 1401E | 1402E | 1403E | 1404E | 1405E | 1406E | 1407E |
|---|---|---|---|---|---|---|---|
| evaluation | | | | | | | |

⊚: Very good
○: Good
Δ: Practically satisfactory
x: Image defect formed

TABLE 20E

| Sample No. | Thickness of layer (II) ($\mu$) | Results |
|---|---|---|
| 1601E | 0.001 | Image defect liable to occur |
| 1602E | 0.02 | No image defect during 20,000 repetitions |
| 1603E | 0.05 | Stable for 50,000 repetitions |
| 1604E | 1 | Stable for 200,000 repetitions |

TABLE 1F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 4/10 \sim 0$<br>$B_2H_6/(GeH_4 + SiH_4) = 3 \times 10^{-3}$<br>$NH_3/(GeH_4 + SiH_4) = 3/100$ | 0.18 | 5 | 1 |
| | Second layer | $SiH_4/He = 0.5$ | $SiH_4 = 200$ | | 0.18 | 15 | 19 |
| Layer (II) | | $SiH_4/He = 0.5$<br>$NO$ | $SiH_4 = 100$ | $SiH_4/NO = 1$ | 0.18 | 10 | 0.5 |

TABLE 2F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 1/10 \sim 0$<br>$B_2H_6/(GeH_4 + SiF_4) = 1 \times 10^{-3}$<br>$NH_3/(GeH_4 + SiH_4) = 1/100$ | 0.18 | 5 | 2 |
| | Second layer | $SiH_4/He = 0.5$ | $SiH_4 = 200$ | | 0.18 | 15 | 15 |

TABLE 3F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 4/10 \sim 2/1000$<br>$B_2H_6/(GeH_4 + SiH_4) = 1 \times 10^{-3}$<br>$NH_3/(GeH_4 + SiH_4) = 1/100$ | 0.18 | 5 | 2 |
| | Second layer | $SiH_4/He = 0.5$ | $SiH_4 = 200$ | | 0.18 | 15 | 15 |

TABLE 4F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | $SiH_4/He = 0.05$<br>$GeH_4/He = 0.05$<br>$B_2H_6/He = 10^{-3}$<br>$NH_3$ | $SiH_4 + GeH_4 = 50$ | $GeH_4/SiH_4 = 15/100 \sim 0$<br>$B_2H_6/(GeH_4 + SiH_4) = 3 \times 10^{-3}$<br>$NH_3/(GeH_4 + SiH_4) = 2/100$ | 0.18 | 5 | 1 |
| | Second layer | $SiH_4/He = 0.5$ | $SiH_4 = 200$ | | 0.18 | 15 | 15 |

TABLE 5F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/1~5/100<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| | Second layer | SiH$_4$/He = 0.5 | SiH$_4$ = 200 | | 0.18 | 15 | 15 |

TABLE 4F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 2/10~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| | Second layer | SiH$_4$/He = 0.5 | SiH$_4$ = 200 | | 0.18 | 15 | 15 |

TABLE 7F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05<br>GeH$_4$/He = 0.05<br>B$_2$H$_6$/He = 10$^{-3}$<br>NH$_3$ | SiH$_4$ + GeH$_4$ = 50 | GeH$_4$/SiH$_4$ = 1/10~0<br>B$_2$H$_6$/(GeH$_4$ + SiH$_4$) = 3 × 10$^{-3}$<br>NH$_3$/(GeH$_4$ + SiH$_4$) = 2/100 | 0.18 | 5 | 1 |
| | Second layer | SiH$_4$/He = 0.5 | SiH$_4$ = 200 | | 0.18 | 15 | 15 |

TABLE 8F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | Si$_2$H$_6$/He = 0.05<br>GeH$_4$/He = 0.05<br>B$_2$H$_6$/He = 10$^{-3}$<br>NH$_3$ | Si$_2$H$_6$ + GeH$_4$ = 50 | GeH$_4$/Si$_2$H$_6$ = 4/10~0<br>B$_2$H$_6$/(GeH$_4$ + Si$_2$H$_6$) = 3 × 10$^{-3}$<br>NH$_3$/(GeH$_4$ + Si$_2$H$_6$) = 2/100 | 0.18 | 5 | 1 |
| | Second layer | Si$_2$H$_6$/He = 0.5 | Si$_2$H$_6$ = 200 | | 0.18 | 15 | 19 |

TABLE 9F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05<br>GeH$_4$/He = 0.05<br>B$_2$H$_6$/He = 10$^{-3}$<br>NH$_3$ | SiF$_4$ + GeH$_4$ = 50 | GeH$_4$/SiF$_4$ = 4/10~0<br>B$_2$H$_6$(GeH$_4$ + SiF$_4$) = 3 × 10$^{-3}$<br>NH$_3$/(GeH$_4$ + SiF$_4$) = 1/100 | 0.18 | 5 | 1 |
| | Second layer | SiF$_4$/He = 0.05 | SiF$_4$ = 200 | | 0.18 | 5 | 19 |

TABLE 10F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiF$_4$/He = 0.05<br>SiF$_4$/He = 0.05<br>GeH$_4$/He = 0.05<br>B$_2$H$_6$/He = 10$^{-3}$ | SiH$_4$ + SiF$_4$ + GeH$_4$ = 50 | GeH$_4$/(SiH$_4$ + SiF$_4$) = 4/10~0<br>B$_2$H$_6$/(GeH$_4$ + SiH$_4$ + SiF$_4$) = 3 × 10$^{-3}$ | 0.18 | 5 | 1 |

TABLE 10F-continued

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| 7 | | NH$_3$ | | NH$_3$/(GeH$_4$ + SiH$_4$ + SiF$_4$) = 1/100 | | | |
| | Second layer | SiH$_4$/He = 0.5 SiF$_4$/He = 0.5 | SiH$_4$ + SiF$_4$ = 200 | | 0.18 | 5 | 19 |

TABLE 11F

| Layer constitution | | Gases employed | Flow rate (SCCM) | Flow rate ratio | Discharging power (W/cm$^2$) | Layer formation rate (Å/sec) | Layer thickness ($\mu$) |
|---|---|---|---|---|---|---|---|
| Layer (I) | First layer | SiH$_4$/He = 0.05 GeH$_4$/He = 0.05 B$_2$H$_6$/He = 10$^{-3}$ NH$_3$ | SiH$_4$ + GeH$_4$ = 50 | GeH$_4$/SiH$_4$ = 4/10~0 B$_2$H$_6$/(GeH$_4$ + SiH$_4$) = 3 × 10$^{-3}$ NH$_3$/(GeH$_4$ + SiH$_4$) = 3/100 | 0.18 | 5 | 1 |
| | Second layer | SiH$_4$/He = 0.5 B$_2$H$_6$He = 10$^{-3}$ | SiH$_4$ = 200 | B$_2$H$_6$/SiH$_4$ = 3 × 10$^{-3}$ | 0.18 | 15 | 19 |
| Layer (II) | | SiH$_4$/He = 0.5 NO | SiH$_4$ = 100 | SiH$_4$/NO = 1 | 0.18 | 10 | 0.5 |

TABLE 12F

| Sample No. | 1201F | 1202F | 1203F | 1204F | 1205F | 1206F | 1207F | 1208F |
|---|---|---|---|---|---|---|---|---|
| B$_2$H$_6$/(SiH$_4$ + GeH$_4$) or B$_2$H$_6$/SiH$_4$ Flow rate ratio | 1 × 10$^{-2}$ | 5 × 10$^{-3}$ | 2 × 10$^{-3}$ | 1 × 10$^{-3}$ | 8 × 10$^{-4}$ | 5 × 10$^{-4}$ | 3 × 10$^{-4}$ | 1 × 10$^{-4}$ |
| B content (atomic ppm) | 1 × 10$^4$ | 6 × 10$^3$ | 25 × 10$^3$ | 1 × 10$^3$ | 800 | 500 | 300 | 100 |
| Evaluation | ○ | ⊚ | ⊚ | ⊚ | ⊚ | ○ | ○ | ○ |

⊚: Excellent
○: Good

TABLE 13F

| Layer constitution | Gases employed | Flow rate (SCCM) | Flow rate ratio | Discharging power (w/cm$^2$) | Layer formation rate (Å/sec) |
|---|---|---|---|---|---|
| Second layer | SiH$_4$/He = 0.5 B$_2$H$_6$/He = 10$^{-3}$ | SiH$_4$ = 200 | B$_2$H$_6$/SiH$_4$ = 8 × 10$^{-5}$ | 0.18 | 15 |

TABLE 13AF

| Sample No. | 1301F | 1302F | 1303F | 1304F | 1305F | 1306F | 1307F | 1308F | 1309F | 1310F |
|---|---|---|---|---|---|---|---|---|---|---|
| First layer | The same as that in Example 88 | The same as that in Example 89 | The same as that in Example 90 | The same as that in Example 91 | The same as that in Example 92 | The same as that in Example 93 | The same as that in Example 94 | The same as that in Example 95 | The same as that in Example 96 | The same as that in Example 97 |
| Thickness of second layer ($\mu$) | 10 | 10 | 20 | 15 | 20 | 15 | 10 | 10 | 10 | 10 |
| Evaluation | ○ | ○ | ⊚ | ⊚ | ⊚ | ⊚ | ○ | ○ | ○ | ○ |

⊚: Excellent
○: Good

TABLE 14F

| Layer constitution | Gases employed | Flow rate (SCCM) | Flow rate ratio | Discharging power (W/cm$^2$) | Layer formation rate (Å/sec) |
|---|---|---|---|---|---|
| Second layer | SiH$_4$/He = 0.5 PH$_3$/He = 10$^{-3}$ | SiH$_4$ = 200 | PH$_3$/SiH$_4$ = 1 × 10$^{-5}$ | 0.18 | 15 |

TABLE 14AF

| Sample No. | 1401F | 1402F | 1403F | 1404F | 1405F | 1406F | 1407F | 1408F | 1409F | 1410F |
|---|---|---|---|---|---|---|---|---|---|---|
| First | The | The | The | The | The | The | The | The | The | The |

TABLE 14AF-continued

| Sample No. | 1401F | 1402F | 1403F | 1404F | 1405F | 1406F | 1407F | 1408F | 1409F | 1410F |
|---|---|---|---|---|---|---|---|---|---|---|
| layer | same as that in Example 88 | same as that in Example 89 | same as that in Example 90 | same as that in Example 91 | same as that in Example 92 | same as that in Example 93 | same as that in Example 94 | same as that in Example 95 | same as that in Example 96 | same as that in Example 97 |
| Thickness of second layer ($\mu$) | 10 | 10 | 20 | 15 | 20 | 15 | 10 | 10 | 10 | 10 |
| Evaluation | ○ | ○ | ⊙ | ⊙ | ⊙ | ⊙ | ○ | ○ | ○ | ○ |

⊙: Excellent
○: Good

TABLE 15F

| Conditions | Gases employed | Flow rate (SCCM) | Flow rate ratio or area ratio | Discharging power (W/cm) | Layer thickness ($\mu$) |
|---|---|---|---|---|---|
| 11-1F | Ar (NO/Ar) | 200 (1/1) | Si wafer:$SiO_2$ = 1:30 | 0.3 | 0.5 |
| 11-2F | Ar (NO/Ar) | 200 (1/1) | Si wafer:$SiO_2$ = 1:60 | 0.3 | 0.3 |
| 11-3F | Ar (NO/Ar) | 200 (1/1) | Si wafer:$SiO_2$ = 6:4 | 0.3 | 1.0 |
| 11-4F | $SiH_4/He$ = 1 NO | $SiH_4$ = 15 | $SiH_4$:NO = 5:1 | 0.18 | 0.3 |
| 11-5F | $SiH_4/He$ = 0.5 NO | $SiH_4$ = 100 | $SiH_4$:NO = 1:1 | 0.18 | 1.5 |
| 11-6F | $SiH_4/He$ = 0.5 $SiF_4/He$ = 0.5 NO | $SiH_4$ + $SiF_4$ = 150 | $SiH_4$:$SiF_4$:NO = 1:1:1 | 0.18 | 0.5 |
| 11-7F | $SiH_4/He$ = 0.5 $SiF_4/He$ = 0.5 NO | $SiH_4$ + $SiF_4$ = 15 | $SiH_4$:$SiF_4$:NO = 2:1:4 | 0.18 | 0.3 |
| 11-8F | $SiH_4/He$ = 0.5 $SiF_4/He$ = 0.5 NO | $SiH_4$ + $SiF_4$ = 150 | $SiH_4$:$SiF_4$:NO 1:1:3 | 0.18 | 1.5 |

TABLE 16F

| Layer (II) forming conditions | Sample No./Evaluation | | |
|---|---|---|---|
| 11-1F | 11-401F ○ ○ | 11-701F ○ ○ | 11-801F ○ ○ |
| 11-2F | 11-402F ○ ○ | 11-702F ○ ○ | 11-802F ○ ○ |
| 11-3F | 11-403F ○ ○ | 11-703F ○ ○ | 11-803F ○ ○ |
| 11-4F | 11-404F ⊙ ⊙ | 11-704F ⊙ ⊙ | 11-804F ⊙ ⊙ |
| 11-5F | 11-405F ⊙ ⊙ | 11-705F ⊙ ⊙ | 11-805F ⊙ ⊙ |
| 11-6F | 11-406F ⊙ ⊙ | 11-706F ⊙ ⊙ | 11-806F ⊙ ⊙ |
| 11-7F | 11-407F ○ ○ | 11-707F ○ ○ | 11-807F ○ ○ |
| 11-8F | 11-408F ○ ○ | 11-708F ○ ○ | 11-808F ○ ○ |

Sample No.
Overall image quality evaluation | Durability evaluation
Evaluation standard:
⊙: Excellent
○: Good

TABLE 17F

| Sample No. | 1201F | 1202F | 1203F | 1204F | 1205F | 1206F | 1207F |
|---|---|---|---|---|---|---|---|
| Si:$SiO_2$ (Target area ratio) (NO/Ar) | 9:1 (0/1) | 6.5:3.5 (1/1) | 4:10 (1/1) | 2:20 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | △ | ⊙ | ⊙ | ○ | ○ | △ | x |

⊙: Very good
○: Good
△: Sufficiently practically usable
x: Image defect formed

TABLE 18F

| Sample No. | 1301F | 1302F | 1303F | 1304F | 1305F | 1306F | 1307F |
|---|---|---|---|---|---|---|---|
| $SiH_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |

TABLE 18F-continued

| Sample No. | 1301F | 1302F | 1303F | 1304F | 1305F | 1306F | 1307F |
|---|---|---|---|---|---|---|---|
| Image quality evaluation | Δ | ○ | ⊙ | ⊙ | ○ | Δ | x |

⊙: Very good
○ : Good
Δ: Practically satisfactory
x: Image defect formed

TABLE 19F

| Sample No. | 1401F | 1402F | 1403F | 1404F | 1405F | 1406F | 1407F |
|---|---|---|---|---|---|---|---|
| $SiH_4:SiF_4:NO$ (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ○ | ⊙ | ⊙ | ○ | x | Δ |

⊙: Very good
○ : Good
Δ: Practically satisfactory
x: Image defect formed

TABLE 20F

| Sample No. | Thickness of layer (II) (μ) | Results |
|---|---|---|
| 1601F | 0.001 | Image defect liable to occur |
| 1602F | 0.02 | No image defect during 20,000 repetitions |
| 1603F | 0.05 | Stable for 50,000 repetitions |
| 1604F | 1 | Stable for 200,000 repetitions |

What we claim is:

1. A photoconductive member which comprises a support for a photoconductive member and a light receiving layer overlying the support comprising a first layer region (G) comprising an amorphous material containing silicon atoms and germanium atoms and at least one of hydrogen atoms and halogen atoms and a second layer region (S) exhibiting photoconductivity comprising an amorphous material containing silicon atoms and at least one of hydrogen atoms and halogen atoms, the first layer region (G) and the second layer region (S) being provided in this order from the support side, and the distribution of germanium atoms in the first layer region (G) being not uniform in the layer thickness direction, and nitrogen atoms being contained in the light receiving layer.

2. A photoconductive member according to claim 2, wherein hydrogen atoms are contained in at least one of the first layer region and the second layer region.

3. A photoconductive member according to claim 1, wherein halogen atoms are contained in at least one of the first layer region and the second layer region.

4. A photoconductive member according to claim 2, wherein halogen atoms are contained in at least one of the first layer region and the second layer region.

5. A photoconductive member according to claim 1, wherein germanium atoms are distributed in the first layer region more enriched on the side of the said support.

6. A photocounductive member according to claim 1, wherein the distribution state of germanium atoms in the said first layer region (G) is such that a distribution concentration C in a layer thickness direction reduces continuously toward the said second layer region (S) from the side of the said support.

7. A photoconductive member according to claim 1, wherein, in the said first layer region (G), a distribution concentration C of germanium atoms in a layer thickness direction has a maximum value Cmax in the layer region within 5μ from the end portion on a support side of the first layer region.

8. A photoconductive member according to claim 1, wherein the content of germanium atoms in the said first layer region (G) is $1-9.5\times10^5$ atomic ppm based on the sum of silicon atoms and germanium atoms in the layer region (G).

9. A photoconductive member according to claim 1, wherein the layer thickness $T_B$ of the said first layer region (G) is 30Å–50μ.

10. A photoconductive member according to claim 1, wherein the layer thickness T of the second layer region (S) is 0.5–90μ.

11. A photoconductive member according to claim 1, wherein the relationship between a layer thickness $T_B$ of the first layer region (G) and a layer thickness T of the second layer region (S) is shown by $T_B/T\leq1$.

12. A photoconductive member according to claim 1, wherein when the content of germanium atoms contained in the said first layer region (G) is $1\times10^5$ atomic ppm or more based on the sum of silicon atoms and germanium atoms in the first layer region (G), a layer thickness $T_B$ of the first layer region (G) is 30μ or below.

13. A photoconductive member according to claim 1, wherein the content of nitrogen atoms is 0.001–50 atomic % in a layer region (N) containing the atoms.

14. A photoconductive member according to claim 1, wherein when a ratio of a layer thickness $T_0$ of a layer region (N) containing nitrogen atoms to a layer thickness $T_t$ of a light receiving layer is 2/5 or more, the content of nitrogen atoms contained in the layer region (N) is 30 atomic % or below.

15. A photoconductive member according to claim 1, nitrogen atoms are contained locally on a support side of a light receiving layer.

16. A photoconductive member according to claim 1, wherein the first layer region (G) has a layer region (PN) containing a substance (C) for controlling conductivity.

17. A photoconductive member according to claim 16, the substance (C) is contained locally in the layer region of the end portion on a support side of the first layer region (G).

18. A photoconductive member according to claim 16, wherein the substance (C) is a p-type impurity capable of imparting a p-type conductivity.

19. A photoconductive member according to claim 18, wherein the p-type impurity is the atom belonging to the group III of the periodic table.

20. A photoconductive member according to claim 19, wherein the atom belonging to the group III of the periodic table is selected from B, Al, Ga, In and Tl.

21. A photoconductive member according to claim 16, wherein the substance (C) is a n-type impurity capable of imparting a n-type conductivity.

22. A photoconductive member according to claim 21, wherein the n-type impurity is the atom belonging to the group V of the periodic table.

23. A photoconductive member according to claim 22, wherein the atom belonging to the group V of the periodic table is selected from P, As, Sb, and Bi.

24. A photoconductive member according to claim 16, wherein the content of the substance (C) is $0.01-5\times10^4$ atomic ppm in the layer region (PN) containing the substance (C).

25. A photoconductive member according to claim 1, wherein the second layer region (S) has a layer region (PN) containing a substance (C) for controlling conductivity.

26. A photoconductive member according to claim 25, wherein the content of the substance (C) in the layer region (PN) is 0.001-1000 atomic ppm.

27. A photoconductive member according to claim 1, wherein the light receiving layer has a layer region (PN) containing a substance (C) for controlling conductivity.

28. A photoconductive member according to claim 27, wherein the content of the substance (C) in the layer region (PN) is 0.001-1000 atomic ppm.

29. A photoconductive member according to claim 1, wherein the light receiving layer has a depletion layer.

30. A photoconductive member according to claim 1, wherein 0.01-40 atomic % of hydrogen atoms is contained in the first layer region (G).

31. A photoconductive member according to claim 1, wherein 0.01-40 atomic % of halogen atoms is contained in the first layer region (G).

32. A photoconductive member according to claim 1, wherein 0.01-40 atomic % of the sum of hydrogen atoms and halogen atoms is contained in the first layer region (G).

33. A photoconductive member according to claim 1, wherein 1-40 atomic % of hydrogen atoms is contained in the second layer region (S).

34. A photoconductive member according to claim 1, wherein 1-40 atomic % of halogen atoms is contained in the second layer region (S).

35. A photoconductive member according to claim 1, wherein 1-40 atomic % of the sum of hydrogen atoms and halogen atoms is contained in the second layer region (S).

36. A photoconductive member which comprises a support for a photoconductive member, a first layer and a second layer, the first layer overlying the support and comprising a first layer region (G) comprising an amorphous material containing silicon atoms and germanium atoms and at least one of hydrogen atoms and halogen atoms and a second layer region (S) exhibiting photoconductivity comprising an amorphous material containing silicon atoms and at least one of hydrogen atoms and halogen atoms, the first layer region (G) and the second layer region (S) being from the support side, the second layer comprising an amorphous material containing silicon atoms, at least one of hydrogen atoms and halogen atoms and at least one of carbon atoms and oxygen atoms, the distribution of germanium in the first layer region (G) being not uniform in the layer thickness direction and nitrogen atoms being contained in the first layer.

37. A photoconductive member according to claim 36, wherein hydrogen atoms are contained in at least one of the first layer region and the second layer region.

38. A photoconductive member according to claim 36, wherein halogen atoms are contained in at least one of the first layer region and the second layer region.

39. A photoconductive member according to claim 37, wherein halogen atoms are contained in at least one of the first layer region and the second layer region.

40. A photoconductive member according to claim 36, wherein germanium atoms are distributed in the first layer region more enriched on the side of the said support 41. A photoconductive member according to claim 36, wherein a distribution state of germanium atoms in the said first layer region (G) is such that a distribution concentration C in a layer thickness direction reduces continuously toward the said second layer region (S) from the side of the said support.

42. A photoconductive member according to claim 36, wherein, in the said first layer region (G), a distribution concentration C of germanium atoms in a layer thickness direction has a maximum value Cmax in the layer region within $5\mu$ from the end portion on a support side of the first layer region.

43. A photoconductive member according to claim 36, wherein the content of germanium atoms in the said first layer region (G) is $1-9.5\times10^5$ atomic ppm based on the sum of silicon atoms and germanium atoms in the layer region (G).

44. A photoconductive member according to claim 36, wherein the layer thickness $T_B$ of the said first layer region (G) is 30Å–50$\mu$.

45. A photoconductive member according to claim 36, wherein the layer thickness T of the second layer region (S) is 0.5–90$\mu$.

46. A photoconductive member according to claim 36, wherein the relationship between a layer thickness $T_B$ of the first layer region (G) and a layer thickness T of the second layer region (S) is shown by $T_B/T \leq 1$.

47. A photoconductive member according to claim 36, wherein when the content of germanium atoms contained in the said first layer region (G) is $1 \times 10^5$ atomic ppm or more, based on the sum of silicon atoms and germanium atoms in the first layer region (G), a layer thickness $T_B$ of the first layer region (G) is $30\mu$ or below.

48. A photoconductive member according to claim 36, wherein the content of nitrogen atoms is 0.001–50 atomic % in a layer region (N) containing the atoms.

49. A photoconductive member according to claim 36 wherein, when a ratio of a layer thickness $T_0$ of a layer region (N) containing nitrogen atoms to a layer thickness $T_t$ of a light receiving layer is 2/5 or more, the content of nitrogen atoms contained in the layer region (N) is 30 atomic % or below.

50. A photoconductive member according to claim 36, nitrogen atoms are contained locally on a support side of a light receiving layer.

51. A photoconductive member according to claim 36, wherein the first layer region (G) has a layer region (PN) containing a substance (C) for controlling conductivity.

52. A photoconductive member according to claim 51, the substance (C) is contained locally in the layer region of the end portion on a support side of the first layer region (G).

53. A photoconductive member according to claim 51, wherein the substance (C) is a p-type impurity capable of imparting a p-type conductivity.

54. A photoconductive member according to claim 53, wherein the p-type impurity is the atom belonging to the group III of the periodic table.

55. A photoconductive member according to claim 54, wherein the atom belonging to the group III of the periodic table is selected from B, Al, Ga, In, and Tl.

56. A photoconductive member according to claim 51, wherein the substantive (C) is a n-type imputiry capable of imparting a n-type conductivity.

57. A photocondutive member according to claim 56, wherein the n-type impurity is the atom belonging to the group V of the periodic table.

58. A photocondutive member according to claim 57, wherein the atom belonging to the group V of the periodic table is selected from P, As, Sb, and Bi.

59. A photoconductive member according to claim 51, wherein the content of the substance (C) is $0.01-5 \times 10^4$ atomic ppm in the layer region (PN) containing the substance (C).

60. A photoconductive member according to claim 36, wherein the second layer region (S) has a layer region (PN) containing a substance (C) for controlling conductivity.

61. A photoconductive member according to claim 60, wherein the content of the substance (C) in the layer region (PN) is 0.001–1000 atomic ppm.

62. A photoconductive member according to claim 36, wherein the light receiving layer has a layer region (PN) containing a substance (C) for controlling conductivity.

63. A photoconductive member according to claim 62, wherein the content of the substance (C) in the layer region (PN) is 0.001–1000 atomic ppm.

64. A photoconductive member according to claim 36, wherein the light receiving layer has a depletion layer.

65. A photoconductive member according to claim 36, wherein 0.01–40 atomic % of hydrogen atoms is contained in the first layer region (G).

66. A photoconductive member according to claim 36, wherein 0.01–40 atomic % of halogen atoms is contained in the first layer region (G).

67. A photoconductive member according to claim 36, wherein 0.01–40 atomic % of the sum of hydrogen atoms and halogen atoms is contained in the first layer region (G).

68. A photoconductive member according to claim 36, wherein 1–40 atomic % of hydrogen atoms is contained in the second layer region (S).

69. A photoconductive member according to claim 36, wherein 1–40 atomic % of halogen atoms is contained in the second layer region (S).

70. A photoconductive member according to claim 36, wherein 1–40 atomic % of the sum of hydrogen atoms and halogen atoms is contained in the second layer region (S).

71. A photoconductive member according to claim 36, wherein hydrogen atoms are contained in the second layer (II).

72. A photoconductive member according to claim 36, wherein halogen atoms are contained in the second layer (II).

73. A photoconductive member according to claim 36, wherein hydrogen atoms and halogen atoms are contained in the second layer (II).

74. A photoconductive member according to claim 36, wherein the layer thickness of the second layer (II) is $0.003-30\mu$.

75. A photoconductive member according to claim 72, wherein halogen atom is selected from F, Cl, Br, and I.

76. A photoconductive member according to claim 73, wherein halogen atom is selected from F, Cl, Br, and I.

77. A photoconductive member according to claim 1, wherein the support is conductive.

78. A photoconductive member according to claim 36, wherein the support is conductive.

79. A photoconductive member according to claim 1, wherein the support is electrically insulating.

80. A photoconductive member according to claim 36, wherein the support is electrically insulating.

81. A photoconductive member according to claim 1, wherein the support is cylindrical.

82. A photoconductive member according to claim 36, wherein the support is cylindrical.

83. An electrophotographic process comprising:
(a) applying a charging treatment to a photoconductive member which comprises a support for a photoconductive member and a light receiving layer overlying the support comprising a first layer region (G) comprising an amorphous material containing silicon atoms and germanium atoms and at least one of hydrogen atoms and halogen atoms and a second layer region (S) exhibiting photoconductivity comprising an amorphous material containing silicon atoms and at least one of hydrogen atoms and halogen atoms, the first layer region (G) and the second layer region (S) being provided in this order from the support side, and the distribution of germanium atoms in the first layer region (G) being not uniform in the layer thickness direction and nitrogen atoms being contained in the light receiving layer; and (b) irradiating the photoconductive member with an electromagnetic wave carrying information, thereby forming an electrostatic image.

84. An electrophotographic process comprising:
(a) applying a charging treatment to a photoconductive member which comprises a support for a photoconductive member, a first layer and a second layer, the first layer overlying the support and comprising a first layer region (G) comprising an amorphous material containing silicon atoms and germanium atoms and at least one of hydrogen atoms and halogen atoms and a second layer region (S) exhibiting photoconductivity comprising an amorphous material containing silicon atoms and at least one of hydrogen atoms and halogen atoms, the first layer region (G) and the second layer region (S) being provided in this order from the support side, the second layer comprising an amorphous material containing silicon atoms, and at least one of hydrogen atoms and halogen atoms and at least one of carbon atoms and oxygen atoms, the distribution of germanium in the first layer region (G) being not uniform in the layer thickness direction and nitrogen atoms being contained in the first layer; and (b) irradiating the photoconductive member with an electromagnetic wave carrying information, thereby forming an electrostatic image.

* * * * *